US006975001B2

(12) United States Patent
Koh et al.

(10) Patent No.: US 6,975,001 B2
(45) Date of Patent: Dec. 13, 2005

(54) SEMICONDUCTOR DEVICE AND METHOD OF FABRICATING THE SAME

(75) Inventors: Risho Koh, Tokyo (JP); Yukishige Saito, Tokyo (JP); Jong-Wook Lee, Tokyo (JP); Hisashi Takemura, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 10/163,984

(22) Filed: Jun. 6, 2002

(65) Prior Publication Data

US 2002/0185687 A1 Dec. 12, 2002

(30) Foreign Application Priority Data

Jun. 6, 2001 (JP) ....................................... 2001-170961

(51) Int. Cl.[7] ................................................ H01L 27/01

(52) U.S. Cl. ....................................... 257/347; 257/348

(58) Field of Search .................................. 257/347–355

(56) References Cited

FOREIGN PATENT DOCUMENTS

| | | |
|---|---|---|
| JP | 4-34980 | 2/1992 |
| JP | 11-135795 | 5/1999 |
| JP | 2000-252471 | 9/2000 |
| JP | 2000-269509 | 9/2000 |
| JP | 2000-332250 | 11/2000 |
| JP | 2001-024202 | 1/2001 |
| WO | WO 03/023865 | 3/2003 |

OTHER PUBLICATIONS

Yo–Hwan Koh, et al "Body–Contacted SOI MOSFET Structure with Fully Bulk CMOS Compatible Layout and Process", *IEEE Electron Device Letters*, vol. 18, No. 31 (Mar. 3, 1997), pp. 102–104.

W. Chen, et al. *Suppression of the SOI Floating–body Effects by Linked–body Device Structure*, 1996 Symposium on VLSI Technology Digest of Technical Papers, (1996), pp. 92–93.

S. Maeda, et al., *Impact of 0.18 μm SOI CMOS Technology using Hybrid Trench Isolation with High Resistivity Substrate on Embedded RF/Analog Applications*, 2000 Symposium on VLSI Technology Digest of Technical Papers, (2000), pp. 154–155.

English Translation of Japanese Publication No.: 11–135795, Publication Date: May 21, 1999.

*Primary Examiner*—Fetsum Abraham

(74) *Attorney, Agent, or Firm*—Choate, Hall & Stewart LLP

(57) ABSTRACT

A semiconductor device includes (a) a semiconductor layer formed on an electrically insulating layer, (b) a gate insulating film formed on the semiconductor layer, (c) a gate electrode formed on the gate insulating film, and (d) a field insulating film formed on the semiconductor layer for defining a region in which a semiconductor device is to be fabricated. The semiconductor layer includes (a1) source and drain regions formed in the semiconductor layer around the gate electrode, the source and drain regions containing first electrically conductive type impurity, (a2) a body contact region formed in the semiconductor layer, the body contact region containing second electrically conductive type impurity, and (a3) a carrier path region formed in the semiconductor layer such that the carrier path region does not make contact with the source and drain regions, but makes contact with the body contact region, the carrier path region containing second electrically conductive type impurity.

33 Claims, 46 Drawing Sheets

FID.6E

SEMICONDUCTOR DEVICE AND METHOD OF FABRICATING THE SAME

BACKGROUND OF THE INVENTION

1. Field of the Invention

The invention relates to a semiconductor device and a method of fabricating the same, and more particularly to a field effect transistor to be fabricated on a silicon-on-insulator (SOI) substrate and a method of fabricating the same.

2. Description of the Related Art

FIG. 1 is a cross-sectional view of a conventional semiconductor device suggested in Japanese Unexamined Patent Publication No. 4-34980 (A).

The illustrated semiconductor device is designed to have so-called SOI structure, namely, a silicon layer 103 formed on an electrically insulating layer 102. Specifically, the illustrated semiconductor device includes a silicon substrate 101, an electrically insulating layer 102 formed on the silicon substrate 101, a silicon layer 103 formed on the electrically insulating layer 102, a gate insulating film 104 formed on the silicon layer 103, a gate electrode 105 formed on the gate insulating film 104, a source region 109 formed in the silicon layer 103 around the gate insulating film 104, a drain region 110 formed in the silicon layer 103 around the gate insulating film 104. The gate insulating film 104, the gate electrode 105, the source region 109, the drain region 110, and a channel region formed below the gate insulating film 104 between the source and drain regions 109 and 110 in the silicon layer 103 define a transistor.

A field oxide film 106 is formed on the silicon layer 103 around the transistor.

An interlayer insulating film 112 is formed covering the field oxide film 106 and the gate electrode 105 therewith. Contact holes 113 are formed throughout the interlayer insulating film 112 so as to reach the source and drain regions 109 and 110. Wiring layers 114 are formed to fill the contact holes 113 therewith.

A well region 111 is formed in the silicon layer 103 below the field oxide film 106. The well region 111 contains impurity having the same electrical conductivity as that of impurity implanted into the channel region 108.

The field oxide film 106 is partially removed to form an opening as a body contact 107. A wiring layer 115 is formed in the body contact 107 to electrically connect to the well region 111. Excessive carriers generated in a channel of the transistor are exhausted through the well region 111 and the body contact 107.

FIG. 2 is a cross-sectional view of a conventional semiconductor device suggested in "Body-Contacted SOI MOSFET Structure with Fully Bulk CMOS Compatible Layout and Process", IEEE Electron Device Letters, Vol. 18, No. 3, March 1997, pp. 102–104.

A transistor is defined by a gate insulating film 126, a gate electrode 125, a source region 124, a drain region 123, and an SOI substrate comprised of a silicon substrate 130, an electrically insulating film 121 formed on the silicon substrate 130, and a silicon layer 122 formed on the electrically insulating film 121.

Around the transistor is formed LOCOS (Local Oxidation of Silicon) region 129 by thermally oxidizing the silicon layer 122. A thin silicon layer remains not oxidized below the LOCOS region 129, and defines a carrier path 127. The carrier path 127 makes electrical contact with a body contact region 128. Excessive carriers generated in a channel of the transistor are exhausted through the carrier path 127 and the body contact region 128.

A semiconductor device having a structure similar to the structure of the above-mentioned semiconductor device is disclosed in "Suppression of the SOI Floating-body Effects by Linked-body Device Structure", 1996 Symposium on VLSI Technology Digest of Technical Papers, pp. 92–93.

FIG. 3 is a cross-sectional view of a conventional semiconductor device suggested in "Impact of 0.18 μm SOI CMOS Technology using Hybrid Trench Isolation with High Resistivity Substrate on Embedded RF/Analog Applications", 2000 Symposium on VLSI Technology Digest of Technical Papers, pp. 154–155.

A transistor is defined by a gate insulating film 126, a gate electrode 125, a source region 124, a drain region 123, and an SOI substrate comprised of a silicon substrate 130, an electrically insulating film 121 formed on the silicon substrate 130, and a silicon layer 122 formed on the electrically insulating film 121.

Around the transistor, there are formed trenches 131, 132 by trench isolation process for isolating a device from others. The trench 131 does not reach the electrically insulating film 121, and hence, a portion of the silicon layer 122 remains not removed. Such a portion of the silicon layer 122 defines a carrier path 127. The carrier path 127 makes electrical contact with a body contact region 128. Excessive carriers generated in a channel of the transistor are exhausted through the carrier path 127 and the body contact region 128.

In a fully depleted SOI-MOSFET which is required to include a thin SOI layer having a thickness of 10 nm, for instance, since the well region 111 acting as a carrier path through which excessive carriers are exhausted outside is thin, the carrier path would have an increased resistance. It would be necessary to design the carrier path to have an impurity concentration higher than that of a channel in order to reduce a resistance of the carrier path. However, there is not known a process of implanting impurity into a carrier path at a high concentration in a self-aligning manner to a region where a device is to be fabricated.

Though the above-mentioned Japanese Unexamined Patent Publication No. 4-34980 (A) does not refer to a process of forming the field oxide film 106, it is considered that the field oxide film 106 is formed in accordance with a conventional method which has been used before LOCOS and trench isolation were put to practical use in a field effect transistor fabricated on a bulk substrate.

FIGS. 4A to 4C are cross-sectional views of a substrate, illustrating respective steps of a method of forming a field oxide film on an SOI substrate, which method would be obtained if steps generally used for fabricating a field effect transistor on a bulk substrate were applied to an SOI substrate.

As illustrated in FIG. 4A, impurity is implanted into a silicon layer 103 formed on an electrically insulating film 102 which is formed on a silicon substrate 101, by gas phase diffusion.

Then, as illustrated in FIG. 4B, an electrically insulating layer 106 is formed on the silicon layer 103 by thermal oxidation or chemical vapor deposition (CVD).

Then, as illustrated in FIG. 4C, the electrically insulating layer 106 is patterned by wet etching.

A transistor is fabricated in a region in which the electrically insulating layer 106 was removed. A portion of the silicon layer 103 located below the electrically insulating layer 106 acts as a carrier path.

However, the method having been explained with reference to FIGS. 4A to 4C is accompanied with a problem that it would not be possible to implant impurity having a concentration higher than that of a channel, into the carrier path. Thus, the method is not suitable to a fully depleted SOI-MOSFET which is required to include a carrier path having a high impurity concentration for reducing a parasitic resistance in the carrier path.

Though not disclosed in any documents, such a method as mentioned below may be carried out for accomplishing a carrier path having a high impurity concentration.

First, as illustrated in FIG. 5A, impurity is implanted into carrier path formed in the silicon layer 103, through a mask 116 comprised of a photoresist film or a silicon dioxide film.

After removal of the mask 116, an electrically insulating film 106 is formed on the silicon layer 103, and then, patterned, as illustrated in FIG. 5B.

This method ensures that a carrier path has an impurity concentration higher than that of a channel.

However, the method is accompanied with a problem that it would not be possible to position both the carrier path and a region in which a transistor is to be fabricated, in a self-aligning manner, resulting in that the electrically insulating film 106 is shifted when formed, as illustrated in FIG. 5C.

In the conventional methods illustrated in FIGS. 2 and 3, when a device isolation region for electrically isolating adjacent devices from each other is patterned, specifically, when a mask for the LOCOS region 129 is formed or the silicon layer 122 is etched to form the trench 131, a region in which a transistor is to be fabricated is generally covered with a resist. It would be possible to implant impurity only into the device isolation region in a self-aligning manner, if ions are using the photoresist as a mask for implantation.

However, the methods illustrated in FIGS. 2 and 3 in which a thickness of an SOI layer in a carrier path is unavoidably smaller than a thickness of an SOI layer in a channel cannot be applied to a fully depleted SOI-MOSFET which is required to have a quite thin SOI layer, because an SOI layer is eliminated in a carrier path, or an SOI layer having a thickness insufficient as a carrier path remains.

Thus, there is a first need to a method which makes it possible to implant impurity having a concentration higher than that of a channel region into a carrier path region in a self-aligning manner to the channel region, and which can be applied to SOI-MOSFET including a thin SOI layer.

The method having been explained with reference to FIG. 1 is applicable to SOI-MOSFET including a thin SOI layer, because a carrier path is not formed thinner than a channel region unlike the methods having been explained with reference to FIGS. 2 and 3.

However, the method having been explained with reference to FIG. 1 is accompanied with a problem that when the field oxide film 106 is patterned into such a pattern as illustrated in FIG. 4C or 5C, the patterned field oxide film does not have a steep end, the patterned field oxide film is narrowed in size relative to a mask, or defects are generated in the silicon layer.

If the field oxide film 106 is wet-etched in the steps illustrated in FIG. 4C or 5C, the patterned field oxide film would not have a steep end, because the field oxide film is isotropically etched. In addition, since the field oxide film 106 is latitudinally etched because of isotropic etching, a region for forming the field oxide film 106 might be narrowed.

If the field oxide film 106 is dry-etched, the patterned field oxide film could have a steep end, and it would be possible to prevent the field oxide film 106 from narrowing. However, since the silicon layer is exposed to plasma in a dry etching step, defects would be generated at a surface of the silicon layer.

Furthermore, a selection ratio of silicon to silicon dioxide in a step for dry-etching a silicon dioxide film is smaller than the same in a step for wet-etching a silicon dioxide film. Hence, a silicon layer might be etched.

Accordingly, dry-etching cannot be applied to SOI-MOSFET required to include a silicon film having a strictly controlled thickness.

Thus, there is a second need to a method which makes it possible to accomplish a steep end in a patterned field oxide film, prevent the patterned field oxide film from narrowing and being shifted in position, prevent generation of defects at a surface of a silicon layer, and prevent a silicon layer from being etched, and which can be applied to SOI-MOSFET having a thin SOI layer.

Referring back to FIG. 1, the field oxide film 106 has an upper end located higher than a surface of the silicon layer. Accordingly, when a material of which the gate electrode 105 is composed is deposited, the deposited layer has raised and recessed portions reflecting a shape of the field oxide film 106. When a gate electrode is formed, if a material from which a gate electrode is to be formed does not have a planarized surface, a resist pattern would be deformed, and hence, a resultant gate electrode would be also deformed.

If a material from which a gate electrode is to be formed does not have a planarized lower surface, when a gate electrode is formed by reactive ion etching, the reactive ion etching to a gate electrode would finish only in a region, and resultingly, an underlying gate insulating film would appear. If the material is kept etched under such condition, the exposed gate insulating film would be etched, and the underlying silicon layer would be further etched. This results that a transistor cannot be fabricated.

Thus, there is a third need to a process for enabling a material from which a gate electrode is to be formed, to have planarized upper and lower surfaces, when the material is patterned into a gate electrode by lithography and reactive ion etching.

In the conventional transistor illustrated in FIG. 1, it would be necessary to design the well region 111 acting as a carrier path region to have a high impurity concentration, in order to reduce a resistance in a carrier path region connecting the channel region and the body contact to each other.

However, if the well region 111 would contain impurity at an excessively high concentration, an electric field generated between the source/drain regions and the well region would have a great intensity, resulting in an increase in a leakage current.

Thus, there is a fourth need to a transistor which is capable of suppressing an intensity of an electric field generated between source/drain regions and a well region, and further reducing a resistance in a carrier path with a leakage current being depressed.

Japanese Unexamined Patent Publication No. 2000-269509 (A) has suggested a semiconductor device including (a) an electrical insulator, (b) a first semiconductor layer which has a first principal plane adjacent to the electrical insulator and a second principal plane located at the opposite side of the first principal plane, and has a first electrical conductivity, (c) an electrically insulating layer formed on the second principal plane, (d) a control electrode extending in a first direction above the electrically insulating layer, and divides the first semiconductor layer into first and second regions about the electrically insulating layer in a second direction perpendicular to the first direction, (e) a second semiconductor layer formed in the first region and having a second electrical conductivity, and (f) third to fifth semiconductor layers formed in the second region across the second principal plane to the first principal plane, having a first, second and first electrical conductivity, respectively, and being exposed in the second principal plane along a side edge of the control electrode.

Japanese Unexamined Patent Publication No. 2000-332250 (A) has suggested a semiconductor device having a field effect transistor, including (a) a substrate, (b) an electrically insulating film formed on the substrate, (c) a first semiconductor layer formed on the electrically insulating film, having a channel of the transistor, and having a first electrical conductivity, (d) a gate insulating film formed on the channel, (e) a gate electrode formed on the gate insulating film, (f) source and drain regions formed in the first semiconductor layer around the gate electrode so as to make electrical contact with the channel, and having a second electrical conductivity, (g) a second semiconductor layer extending from a body which is a region other than source and drain regions in the first semiconductor layer, and having a second electrical conductivity, and (h) an electrode formed in the second semiconductor layer, containing impurity having a first electrical conductivity at a concentration greater than that of the first semiconductor layer, and making electrical contact with the source or drain region.

Japanese Unexamined Patent Publication No. 2000-252471 (A) has suggested a semiconductor device including a semiconductor substrate, an electrically insulating film formed on the semiconductor substrate, a semiconductor layer formed on the electrically insulating film, a gate insulating film formed on the semiconductor layer, and a gate electrode formed on the gate insulating film. The semiconductor layer includes a channel region below the gate electrode. The channel region contains impurity at a low concentration. The semiconductor layer further includes a carrier path region located adjacent to the channel region, and having a surface located lower than a surface of the channel region. The carrier path region makes electrical contact with a body contact.

However, the above-mentioned needs remain unsatisfied even in the above-mentioned Publications.

SUMMARY OF THE INVENTION

It is an object of the present invention to provide a semiconductor device and a method of fabricating the same both of which satisfy the above-mentioned needs.

In one aspect of the present invention, there is provided a semiconductor device including (a) a semiconductor layer formed on an electrically insulating layer, (b) a gate insulating film formed on the semiconductor layer, (c) a gate electrode formed on the gate insulating film, and (d) a field insulating film formed on the semiconductor layer for defining a region in which a semiconductor device is to be fabricated, the semiconductor layer including (a1) source and drain regions formed in the semiconductor layer around the gate electrode, the source and drain regions containing first electrically conductive type impurity, (a2) a body contact region formed in the semiconductor layer, the body contact region containing second electrically conductive type impurity, and (a3) a carrier path region formed in the semiconductor layer such that the carrier path region does not make contact with the source and drain regions, but makes contact with the body contact region, the carrier path region containing second electrically conductive type impurity.

It is preferable that the semiconductor layer has a first region in which the source and drain regions are formed, a second region in which the carrier path region is formed, and a third region in which the body contact region is formed, the semiconductor layer has a thickness in the range of 5 nm to 15 nm both inclusive in the first to third regions, and a difference between a maximum thickness among the first to third regions and a minimum thickness among the first to third regions is equal to or smaller than 10 nm.

It is preferable that the semiconductor layer has a first region in which the source and drain regions are formed, a second region in which the carrier path region is formed, and a third region in which the body contact region is formed, the semiconductor layer has a thickness equal to or greater than 70% of a maximum thickness of the semiconductor layer in the first to third regions, and a difference between a maximum thickness among the first to third regions and a minimum thickness among the first to third regions is equal to or smaller than 10 nm.

It is preferable that the difference is equal to or smaller than 3 nm.

It is preferable that the semiconductor layer has a first region in which the source and drain regions are formed, a second region in which the carrier path region is formed, and a third region in which the body contact region is formed, and a difference in height between a gate electrode to be formed in the first region and a gate electrode to be formed in the second region is equal to or smaller than 40 nm.

It is more preferable that the difference is equal to or smaller than 10 nm.

It is preferable that the gate electrode is comprised of a first portion which is in the level with the field insulating film in a predetermined allowable error range, and a second portion formed on the first portion such that the second portion extends towards and above the second region.

It is preferable that the first and second portions of the gate electrode are formed in different steps from each other.

It is preferable that the first and second portions of the gate electrode are composed of different materials from each other.

It is preferable that the semiconductor further includes an electrically insulating sidewall facing the field insulating film.

It is preferable that the semiconductor layer has a region below the sidewall which region is smaller in impurity concentration than the rest.

It is preferable that the semiconductor device further includes a sidewall formed at a side of the field insulating film, the sidewall being composed of $Si_3N_4$.

It is preferable that the field insulating film has a lower portion and a side portion both of which are composed of $Si_3N_4$.

It is preferable that the gate insulating film is composed at least partially of a material having a higher dielectric constant than that of the field insulating film.

It is preferable that the gate insulating film has a dielectric constant higher than that of the field insulating film.

It is preferable that a single transistor and a single body contact region are formed in a regional unit defined by the electrically insulating layer, the transistor being comprised of the semiconductor layer, the gate insulating film, the gate electrode, and the field insulating film.

It is preferable that a plurality of transistors and a single body contact region are formed in a regional unit defined by the electrically insulating layer, each of the transistors being comprised of the semiconductor layer, the gate insulating film, the gate electrode, and the field insulating film.

It is preferable that a single transistor and a plurality of body contact regions are formed in a regional unit defined by the electrically insulating layer, the transistor being comprised of the semiconductor layer, the gate insulating film, the gate electrode, and the field insulating film.

In another aspect of the present invention, there is provided a method of fabricating a semiconductor device, including the steps of (a) forming a mask on a semiconductor layer formed on an electrically insulating layer such that the mask covers therewith a first region in which a transistor is to be formed, and a second region in which a body contact is to be formed, (b) forming an electrically insulating film entirely over the resultant resulted from the step (a), (c) planarizing the electrically insulating film, (d) removing the mask having appeared in the step (c), (e) forming a transistor and the body contact region on or in the semiconductor layer, the transistor being comprised of a gate insulating film formed on the semiconductor layer, a gate electrode formed on the gate insulating film, and source and drain regions formed in the semiconductor layer and having a first electrical conductivity, the body contact region containing impurity having a second electrical conductivity.

It is preferable that the electrically insulating material is planarized in the step (c) by chemical mechanical polishing (CMP).

It is preferable that the mask has a multi-layered structure having a top layer composed of $Si_3N_4$.

It is preferable that the mask has a three-layered structure having a top layer composed of $Si_3N_4$, an intermediate layer composed of polysilicon, and a bottom layer composed of $SiO_2$.

It is preferable that the method further includes the step of (f) implanting impurity having a second electrical conductivity into the semiconductor layer in a region not covered with the mask.

It is preferable that the mask has a multi-layered structure, and wherein the mask is removed in the step (d) such that at least a part of layers other than a top layer in the multi-layered structure is not removed in the region not covered with the mask, and further including the step of (g) removing a layer or layers other than layers composed of electrically insulating material, among layers remain in the region not covered with the mask, the step (g) being carried out later than the step (f).

It is preferable that the method further includes the steps of (h) thermally oxidizing the semiconductor layer at a surface thereof, (i) forming a polysilicon layer and a $Si_3N_4$ layer on the semiconductor layer in this order, (j) removing the $Si_3N_4$ layer in regions other than the first and second regions to thereby form a mask comprised of the $Si_3N_4$ layer in the first and second regions (k) implanting impurity having a second electrical conductivity into the semiconductor layer in a region not covered with the mask, (l) removing the polysilicon layer in the region not covered with the mask, (m) covering a resultant resulted from the step (l), with a silicon dioxide ($SiO_2$) film, (o) planarizing the silicon dioxide film, and (p) removing the mask, the polysilicon layer and a thermally oxidized layer all of which have appeared in the step (o).

It is preferable that the mask has a three-layered structure having a top layer having a resistance to chemical mechanical polishing, an intermediate layer composed of electrically conductive material or material which would have electrical conductivity by introducing impurity thereinto, and a bottom layer comprised of an electrically insulating layer which defines the gate insulating film, the method including the steps of (q) removing at least the top layer and the intermediate layer entirely in the first region and partially in the second region, a remaining part of the intermediate layer acting as the gate electrode of the transistor, the step (q) being to be carried out later than the step (c), and (r) forming the source and drain regions in the semiconductor layer around the gate electrode.

It is preferable that the method further includes the step of implanting impurity having a second electrical conductivity into the semiconductor layer in a region not covered with the mask.

It is preferable that the method further includes the step of (s) removing the top layer of the mask, the step (s) being to be carried out subsequently to the step (c), (t) depositing electrically conductive material of which an electrical conductor to be formed on the gate electrode is composed, (u) patterning the material into the electrical conductor, and (v) removing at least the top layer and the intermediate layer partially in the first region, the steps (u) and (v) being to be concurrently carried out.

It is preferable that the top layer of the mask is composed of $Si_3N_4$.

It is preferable that the intermediate layer is composed of polysilicon, and the top layer is composed of metal.

It is preferable that the intermediate layer has a multi-layered structure comprised of layers each composed of electrically conductive material or material which would be electrically conductive, if impurity is implanted thereinto.

It is preferable that the upper layer of the gate electrode has a multi-layered structure comprised of layers each composed of electrically conductive material or material which would be electrically conductive, if impurity is implanted thereinto.

It is preferable that the method further includes the step of forming a sidewall adjacent to the body contact region, the sidewall being composed of silicon dioxide.

It is preferable that the mask has a multi-layered structure, and further including the step of (e) removing all layers of the multi-layered structure or layers other than a bottom layer of the multi-layered structure partially in the first region and entirely in the second region, to thereby form a dummy gate electrode, the step (v) being to be carried out subsequently to the step (c), (f) implanting impurity having a first electrical conductivity into the semiconductor layer around the gate electrode to thereby form the source and drain regions, (g) covering a resultant resulted from the step (w) with a second electrically insulating film, (h) planarizing the second electrically insulating film to thereby expose the mask, (i) removing the mask for forming a slit, and (j) forming the gate electrode in the slit.

It is preferable that the method further includes the steps of etching back both a layer formed on the mask and the electrically insulating film after planarizing the electrically insulating film, and forming a layer having a resistance to chemical mechanical polishing.

It is preferable that the method further includes the step of forming a layer on the mask, the layer being composed of $Si_3N_4$.

It is preferable that the layer is formed to cover a sidewall of the mask therewith.

It is preferable that the method further includes the steps of (e) forming a sidewall around the mask, (f) removing a portion of the sidewall which portion covers the body contact region therewith, and (g) implanting impurity having a second electrical conductivity into a region not covered with the mask.

It is preferable that the method further includes the steps of (e) forming a sidewall around the mask, (f) removing at least partially the sidewall in the body contact region, (g) implanting impurity having a second electrical conductivity into a region not covered with the mask, and (h) implanting impurity having a second electrical conductivity into the body contact region.

It is preferable that the method further includes the steps of (e) forming a second mask around the first region, (f) implanting ions to the semiconductor layer, (g) forming a sidewall at a sidewall of the mask, and (h) implanting impurity having a second electrical conductivity into a region not covered with the mask.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 6A to 6L are cross-sectional views of a semiconductor device in accordance with the first embodiment, illustrating respective steps of a method of fabricating the same.

DESCRIPTION OF THE PREFERRED EMBODIMENTS

Preferred embodiments in accordance with the present invention will be explained hereinbelow with reference to drawings.

[First Embodiment]

Figure 11:
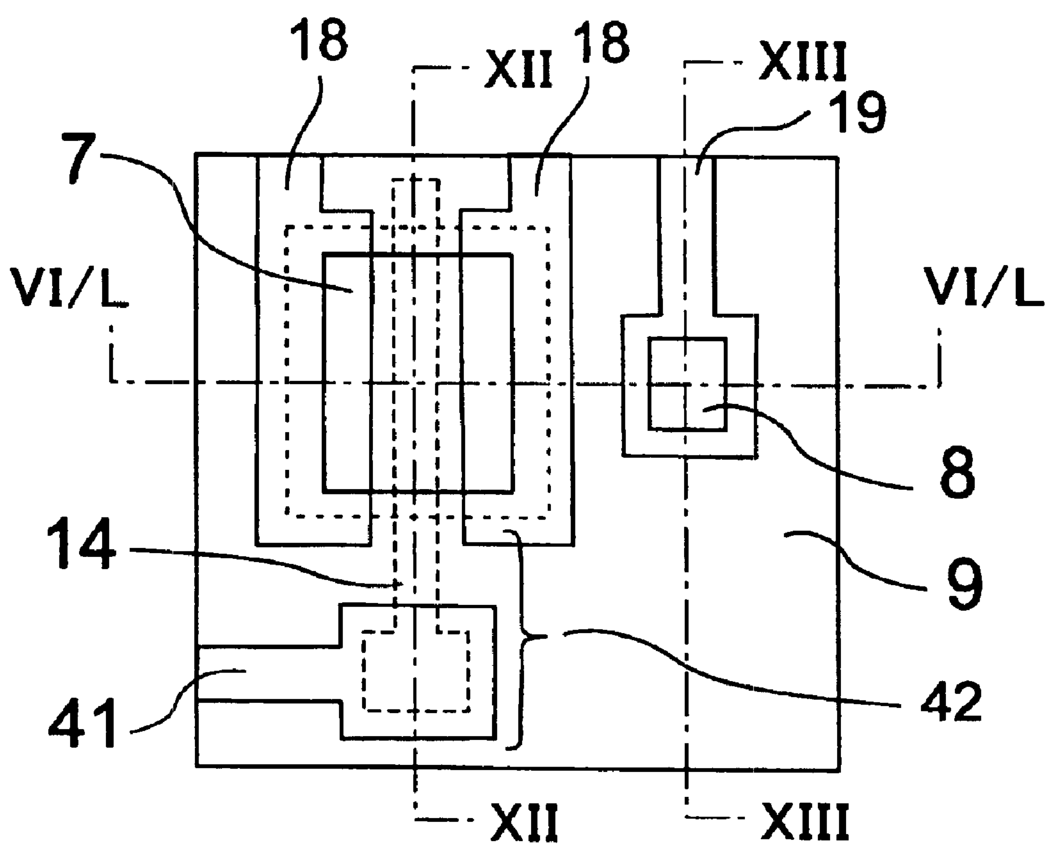
FIG. 11 is a plan view of a semiconductor device in accordance with the first embodiment.

FIGS. 6A to 6L are cross-sectional views of a semiconductor device in accordance with the first embodiment, illustrating respective steps of a method of fabricating the same. FIGS. 6A to 6L are cross-sectional views taken along the line VI—VI in FIG. 11 illustrating a semiconductor device in accordance with the first embodiment as a completed product.

Figure 6A:
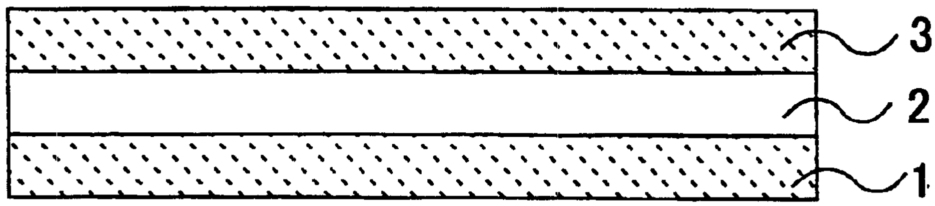

First, as illustrated in FIG. 6A, there is formed a silicon-on-insulator (SOI) substrate including a silicon substrate 1, an electrically insulating film 2 formed on the silicon substrate 1, and a monocrystal silicon layer 3 formed on the electrically insulating film 2.

The electrically insulating film 2 is composed of silicon dioxide ($SiO_2$), and has a thickness of 100 nm. The silicon layer 3 has a thickness in the range of 10 nm to 50 nm both inclusive.

Figure 6B:
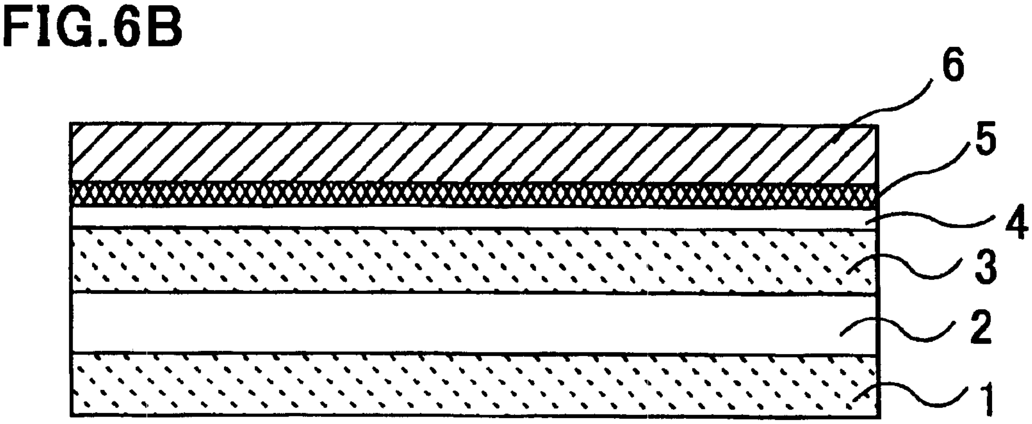

Then, as illustrated in FIG. 6B, the silicon layer 3 is thermally oxidized to thereby form a pad oxide layer 4 at a surface of the silicon layer 3 by the thickness of 10 nm. Subsequently, a pad polysilicon film 5 having a thickness of 20 nm and a $Si_3N_4$ film 6 having a thickness of 150 nm are formed on the pad oxide film 4 in this order by chemical vapor deposition (CVD).

Figure 6C:
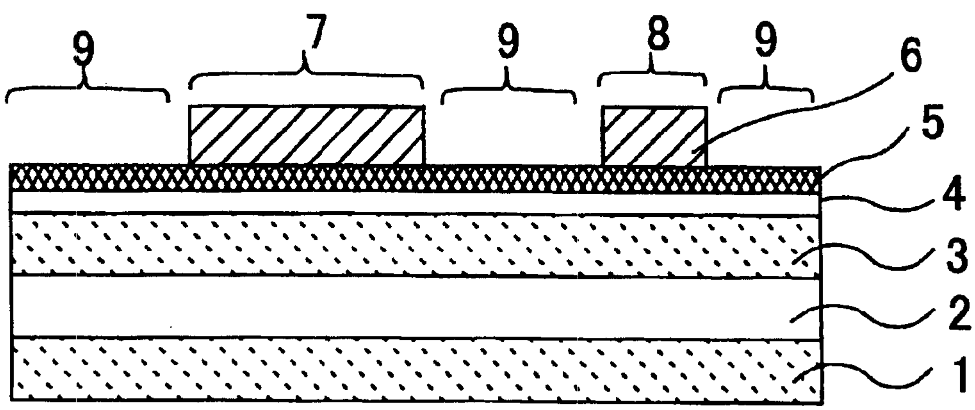

Then, as illustrated in FIG. 6C, the $Si_3N_4$ film 6 is patterned by photolithography and reactive ion etching (RIE) such that the $Si_3N_4$ film 6 remains in both a first region 7 in which a semiconductor device is to be fabricated and a second region 8 in which a body contact is to be formed.

Then, a silicon dioxide film is formed entirely over the patterned $Si_3N_4$ film 6 and the pad polysilicon film 5 by chemical vapor deposition by the thickness of 150 nm.

Figure 6D:
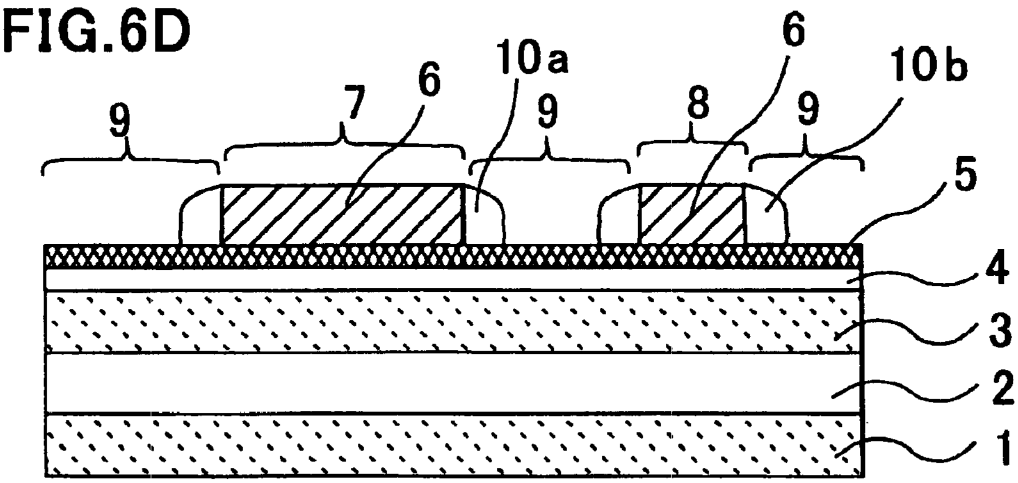
Figure 6D:
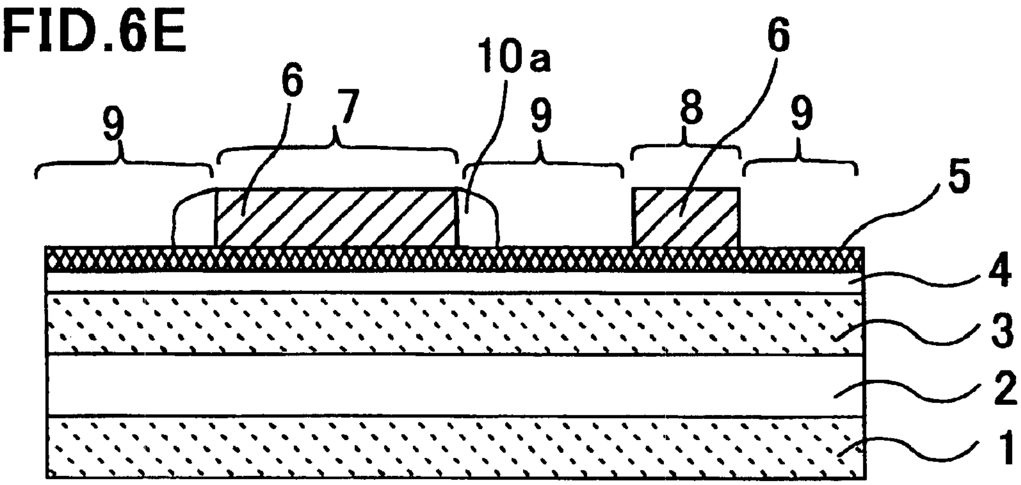

Then, as illustrated in FIG. 6D, the silicon dioxide film is etched back by reactive ion etching to thereby form sidewalls 10*a* and 10*b* around a side of the patterned $Si_3N_4$ film 6.

Figure 7:
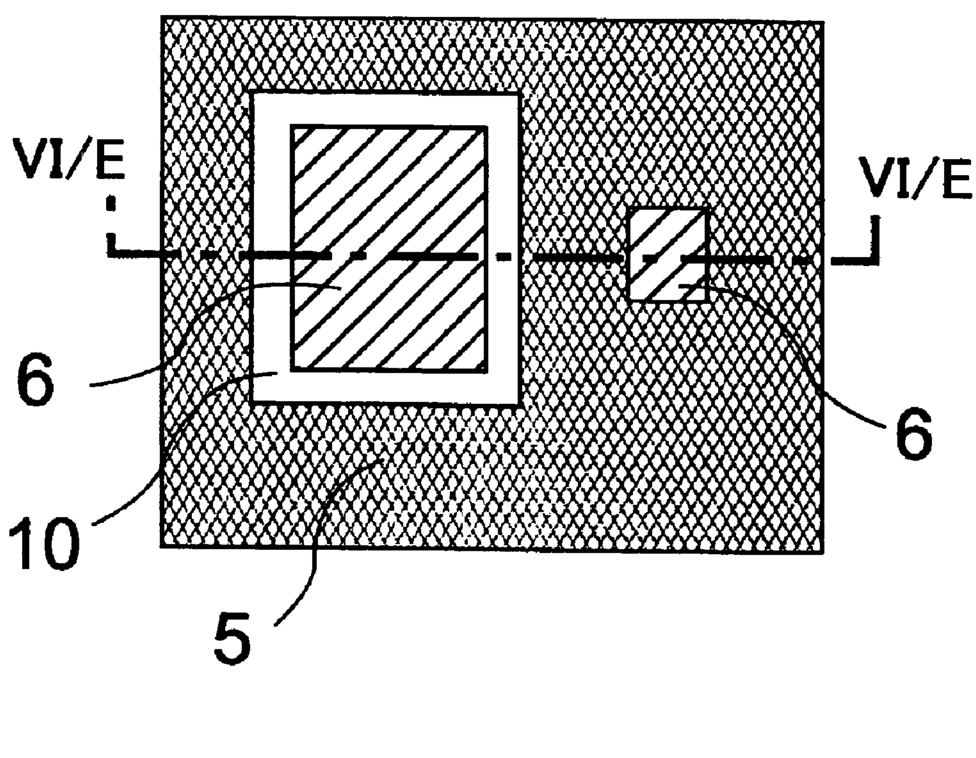
FIG. 7 is a plan view of a semiconductor device in accordance with the first embodiment.

Then, the patterned $Si_3N_4$ film 6 and the sidewall 10*a* both located in the first region 7 are covered with a resist. Then, as illustrated in FIG. 6E, the sidewall 10*b* covering a side of the patterned $Si_3N_4$ film 6 in the second region 8 therewith is removed. FIG. 7 is a plan view of the semiconductor device in accordance with the first embodiment at this stage. In other words, FIG. 6E is a cross-sectional view taken along the line VI/E—VI/E in FIG. 7.

Figure 6F:
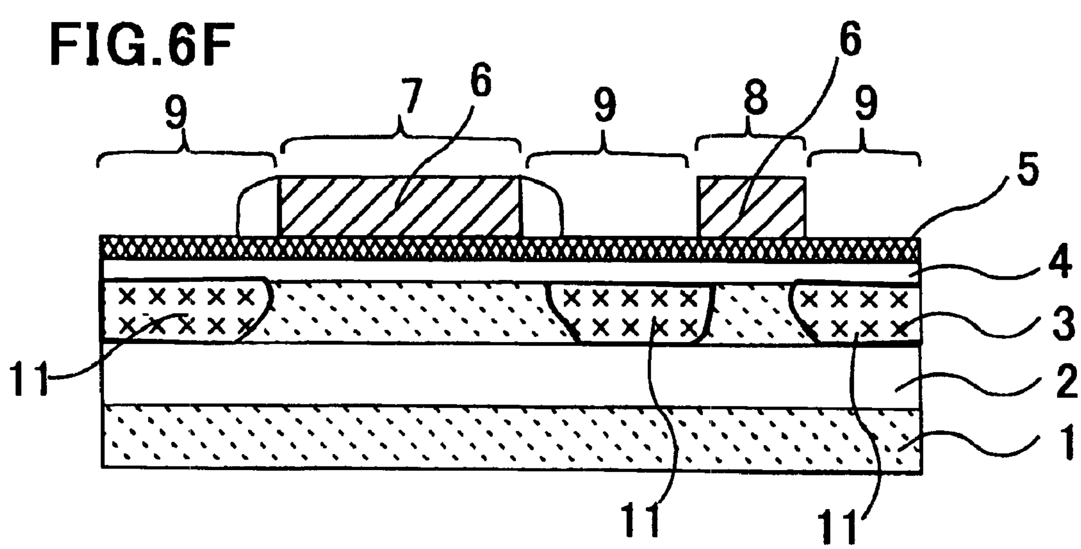

Then, impurity in the form of ions is implanted into the silicon layer 3 through the use of the patterned $Si_3N_4$ film 6 and the sidewall 10*a*. Subsequently, the semiconductor device is thermally annealed in order to activate the impurity at a temperature in the range of 900 to 1050 degrees centigrade for 10 seconds. Impurity ions having a p-type electrical conductivity, such as $B^+$, $BF_2^+$ or In, are implanted around an n-type channel transistor, whereas impurity ions having an n-type electrical conductivity, such as $As^+$, $P^+$ or $Sb^+$, are implanted around a p-type channel transistor. As a result, as illustrated in FIG. 6F, carrier paths 11 containing impurity at a relatively high concentration are formed in the silicon layer 3.

In order to implant different impurities into the silicon layer 3 around a p-type channel transistor and an n-type channel transistor, for instance, when impurity ions are implanted into the silicon layer 3 around a p-type channel transistor, a region around the n-type channel transistor is covered with a resist.

The carrier path 11 contains impurity at a concentration in the range of $1\times10^{18}$ $cm^{-3}$ to $1\times10^{20}$ $cm^{-3}$ at a dose in the range of $1\times10^{13}$ $cm^{-2}$ to $1\times10^{15}$ $cm^{-2}$.

Since the $Si_3N_4$ film 6 covering the first region 7 has the sidewall 10*a* formed therearound, a space is formed between the carrier path 11 and the first region 7 as a buffer zone 40 for the impurity. In the space, the impurity having been implanted into the carrier path 11 has a profile in which a concentration of the impurity is smaller at a greater distance from the carrier path 11, or the impurity having been implanted into the source and drain regions has a profile in which a concentration of the impurity is smaller at a greater distance from the source and drain regions. If the impurity profile had a steep curve, the impurity concentration would be zero in a certain region in the space acting as a buffer zone 40.

After the sidewall 10*a* has been removed by etching through the use of hydrofluoric acid, the pad polysilicon layer 5 is removed by reactive ion etching with the $Si_3N_4$ film 6 being used as a mask.

Figure 6G:
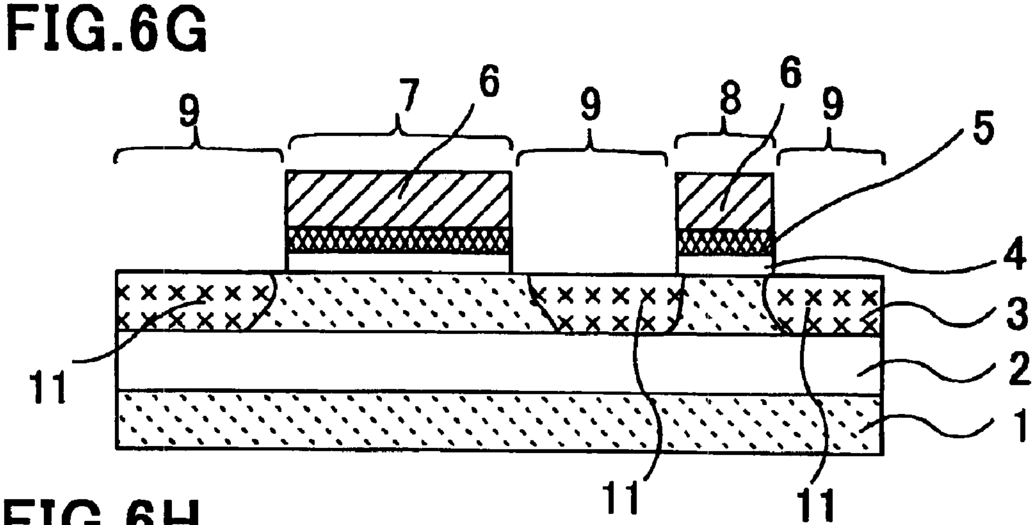
Figure 8:
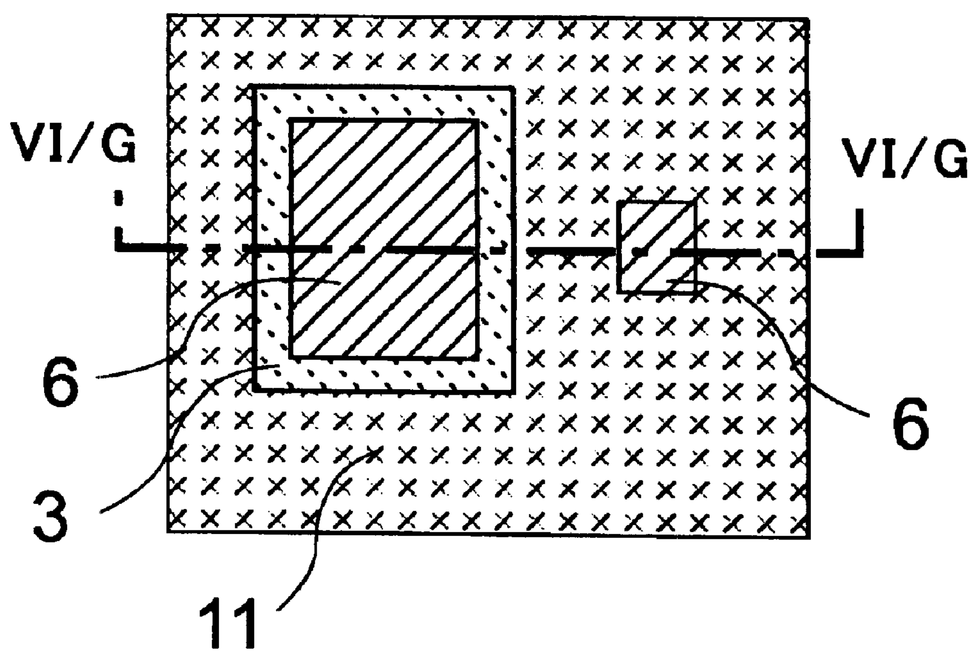
FIG. 8 is a plan view of a semiconductor device in accordance with the first embodiment.

Then, as illustrated in FIG. 6G, the pad oxide layer 4 is removed with the $Si_3N_4$ film 6 being used as a mask. FIG. 8 is a plan view of the semiconductor device in accordance with the first embodiment at this stage. In other words, FIG. 6G is a cross-sectional view taken along the line VI/G—VI/G in FIG. 8.

Figure 6H:
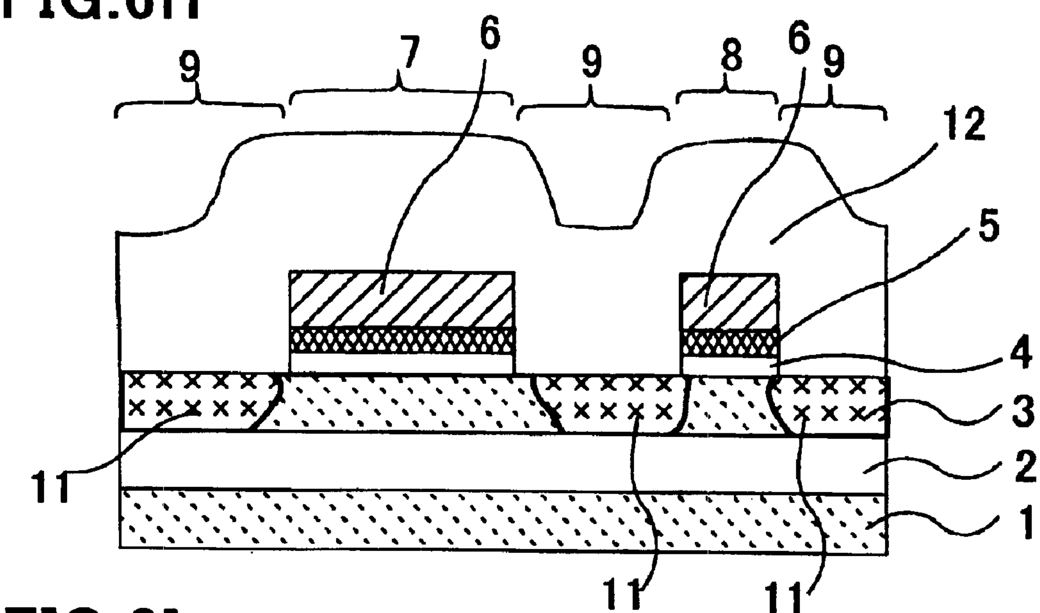
Figure 6I:
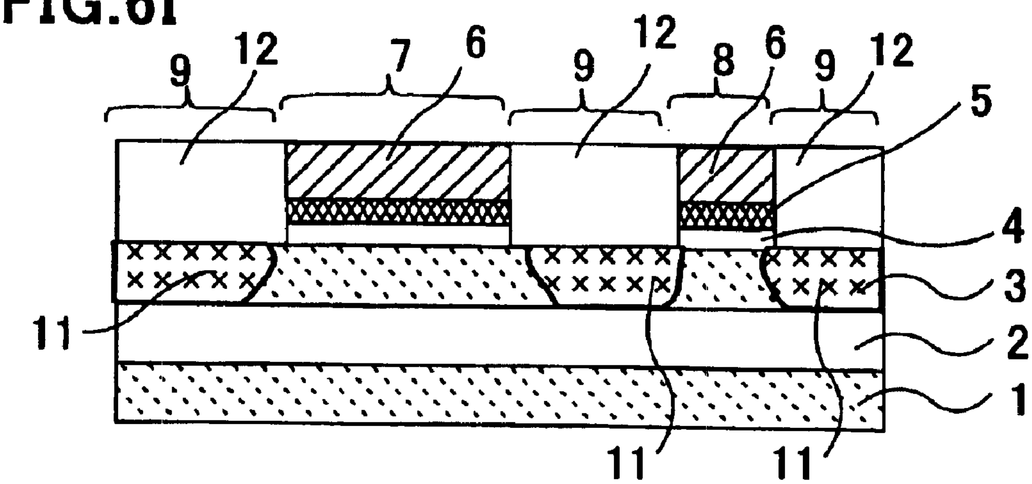

Then, as illustrated in FIG. 6H, a silicon dioxide film 12 is deposited by chemical vapor deposition.

Then, as illustrated in FIG. 61, the silicon dioxide film 12 is planarized by chemical mechanical polishing (CMP) with the $Si_3N_4$ film 6 being used as a stopper.

Then, the $Si_3N_4$ film 6 is removed through the use of heated phosphoric acid in the first and second regions 7 and 8. Then, the pad polysilicon layer 5 is removed by reactive ion etching or wet etching through the use of a mixture solution of hydrofluoric acid and nitric acid. Subsequently, the pad oxide layer 4 is removed by wet etching through the use of hydrofluoric acid.

Then, the silicon layer 3 exposed in the first and second regions 7 and 8 is thermally oxidized at a surface thereof by the thickness of 10 nm to thereby form a sacrifice oxide film at a surface of the silicon layer 3. Then, the sacrifice oxide film is removed by wet etching through the use of hydrofluoric acid.

Then, the silicon layer 3 is thermally oxidized at a surface by the thickness of 2 nm to thereby form a gate oxide film 13.

Then, polysilicon is deposited by chemical vapor deposition by the thickness of 200 nm.

Figure 6J:
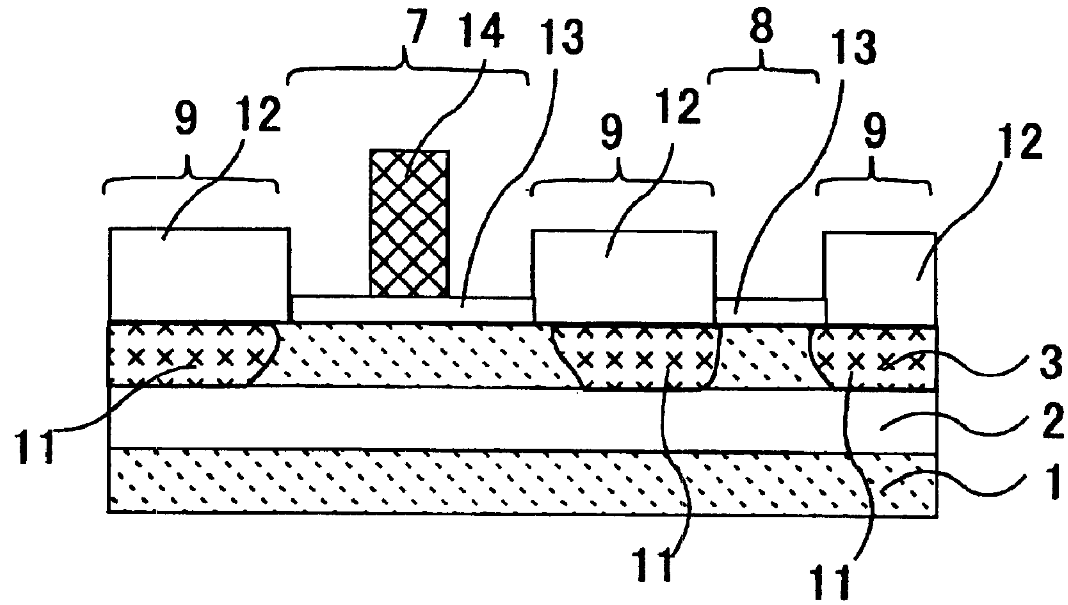

Then, the polysilicon is patterned into a gate electrode 14 by lithography such as photolithography or electron beam irradiation, and etching such as reactive ion etching, as illustrated in FIG. 6J. The polysilicon having been deposited in the second region 8 is removed at the same time of the formation of the gate electrode 14.

Figure 6K:
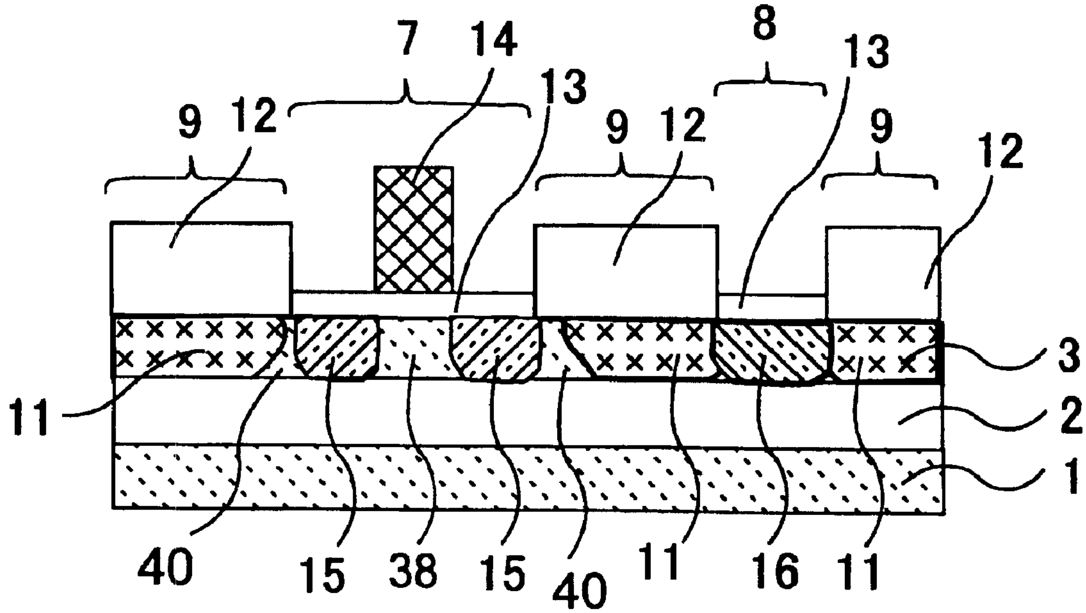

Then, as illustrated in FIG. 6K, ions are implanted into the silicon layer 3 around the gate electrode 14 with the gate electrode 14 being used as a mask, to thereby form source and drain regions 15. N-type impurity is implanted into source and drain regions in an n-type channel transistor at a high concentration, and p-type impurity is implanted into source and drain regions in a p-type channel transistor at a high concentration.

P-type impurity is implanted at a high concentration into the second or body contact region 8 making electrical contact with the n-type channel transistor through the carrier path 11, and n-type impurity is implanted at a high concentration into the second or body contact region 8 making electrical contact with the p-type channel transistor through the carrier path 11. As a result, there is formed a high-concentration body contact region 16.

Figure 9:
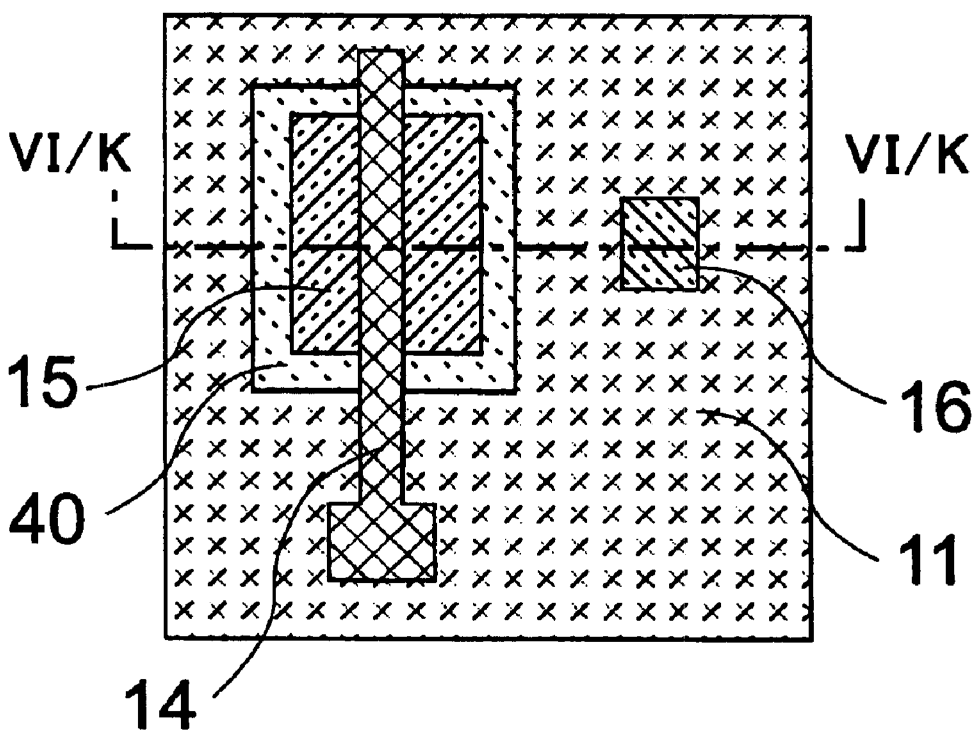
FIG. 9 is a plan view of a semiconductor device in accordance with the first embodiment.
Figure 10:
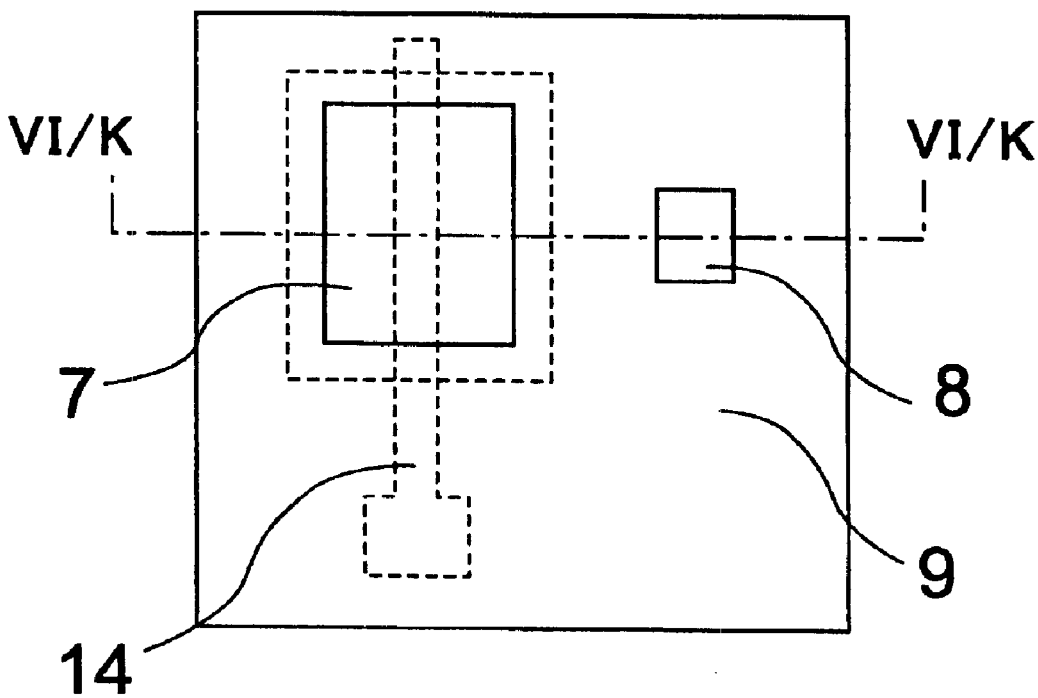
FIG. 10 is a plan view of a semiconductor device in accordance with the first embodiment.

The silicon layer 3 below the gate electrode 14 makes a channel region 38. FIG. 9 is a plan view of the semiconductor device in accordance with the first embodiment at this stage. In other words, FIG. 6K is a cross-sectional view taken along the line VI/K—VI/K in FIGS. 9 and 10. A positional relation among the first region 7, the second region 8, and a device isolating region 9 is illustrated in FIG. 10.

Since the source and drain regions 15 in the n-type channel transistor and the body contact region 8 in the p-type channel transistor have the same electrical conductivity as each other, impurities may be implanted into the silicon layer 3 at a common step. Similarly, since the source and drain regions 15 in the p-type channel transistor and the body contact region 8 in the n-type channel transistor have the same electrical conductivity as each other, impurities may be implanted into the silicon layer 3 at a common step. As an alternative, impurity may be implanted into the silicon layer 3 in different steps for forming the source and drain regions 15 in the n-type channel transistor, the body contact region 8 in the p-type channel transistor, the source and drain regions 15 in the p-type channel transistor and the body contact region 8 in the n-type channel transistor.

Then, a silicon dioxide film is formed entirely over a resultant by chemical vapor deposition by the thickness of 500 nm, and subsequently, planarized by chemical mechanical polishing (CMP) to thereby form an interlayer insulating film 17.

Figure 6L:
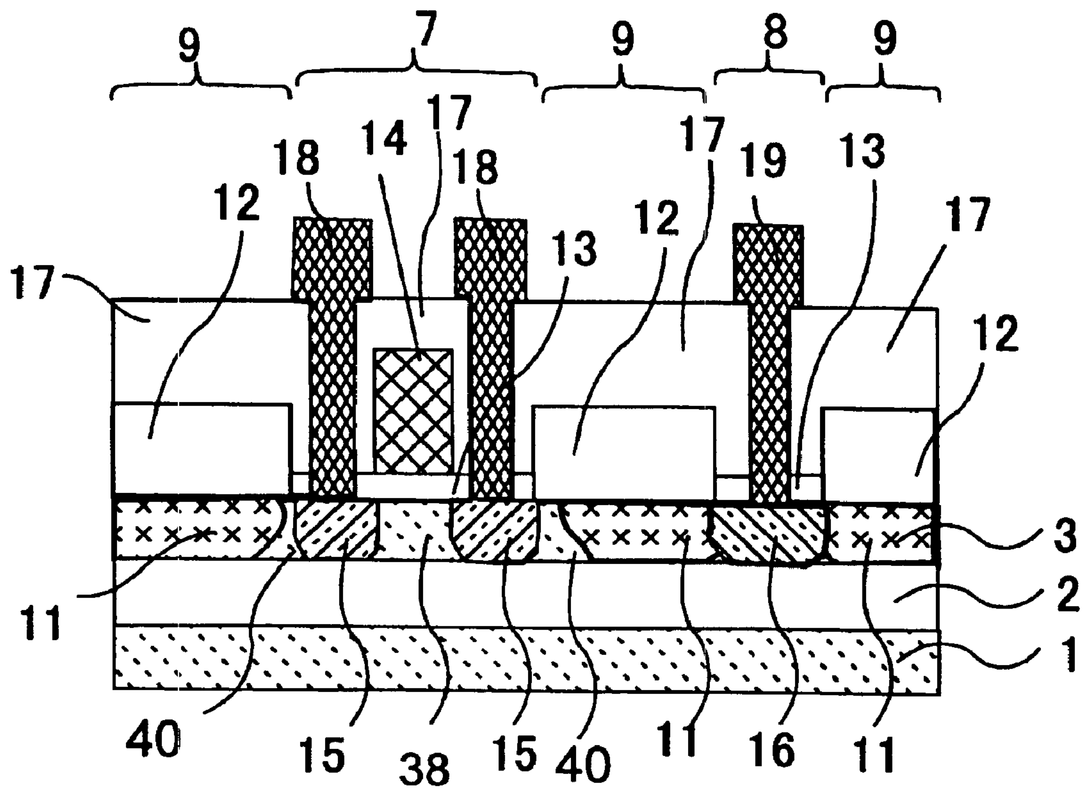
Figure 12:
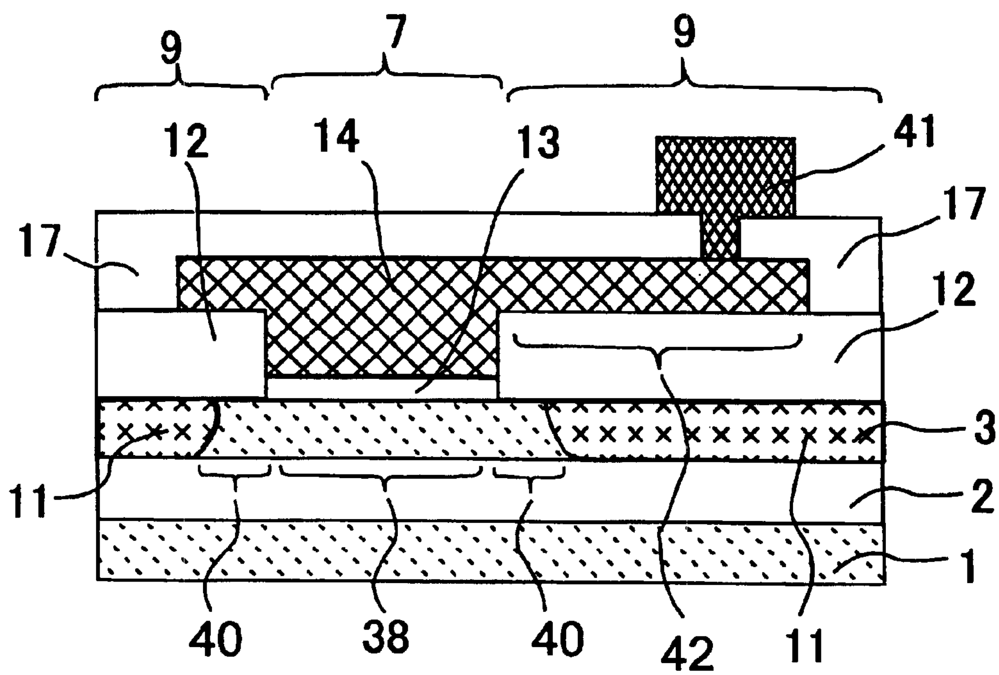
FIG. 12 is a cross-sectional view of a semiconductor device in accordance with the first embodiment.
Figure 13:
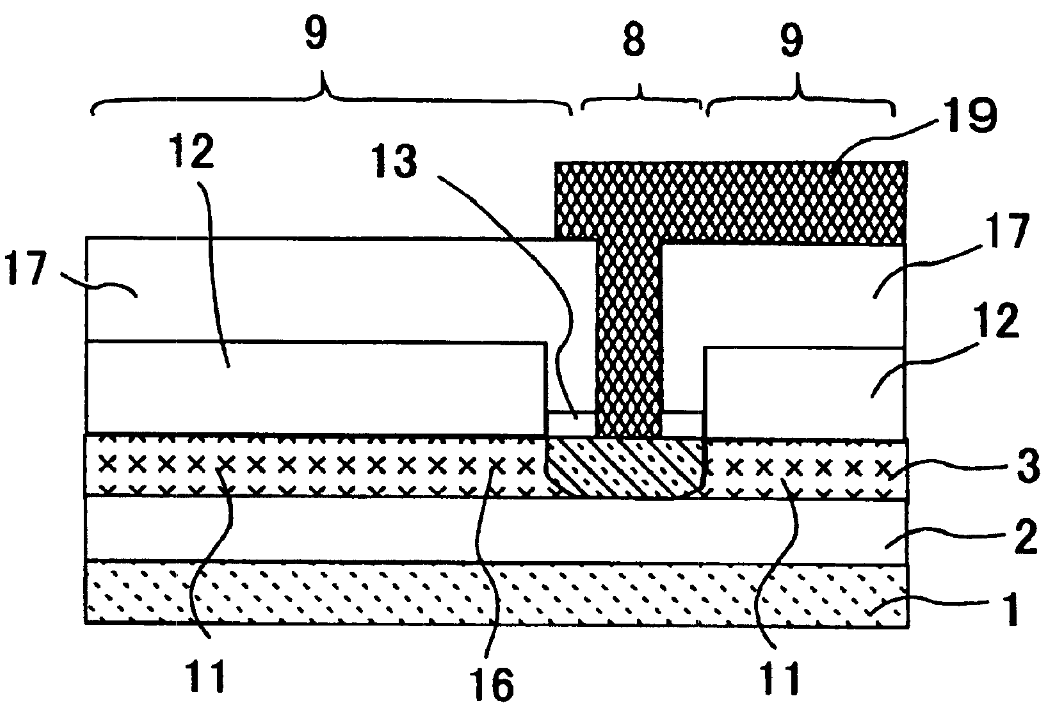
FIG. 13 is a cross-sectional view of a semiconductor device in accordance with the first embodiment.

Then, as illustrated in FIG. 6L, there are formed wirings 18 making electrical contact with the source and drain regions 15, a wiring 41 (see FIG. 12) making electrical contact with the gate electrode 14, and a body contact wiring 19 making electrical contact with the high-concentration body contact region 16. FIG. 11 is a plan view of the semiconductor device in accordance with the first embodiment at this stage. In other words, FIG. 6L is a cross-sectional view taken along the line VI/L—VI/L in FIG. 11. FIG. 12 is a cross-sectional view taken along the line XII—XII in FIG. 11, and FIG. 13 is a cross-sectional view taken along the line XIII—XIII in FIG. 11.

In the first embodiment, the pad polysilicon layer 5 prevents the silicon layer 3 from being exposed, when the $Si_3N_4$ film 6 is etched by reactive ion etching.

If the semiconductor device in accordance with the first embodiment is designed not to include pad polysilicon layer 5, the pad oxide layer 4 is also removed while the $Si_3N_4$ film 6 is being etched by reactive ion etching. As a result, the silicon layer 3 is exposed, and hence, the silicon layer 3 might be also etched by reactive ion etching.

In contrast, in the first embodiment, the $Si_3N_4$ film 6 is selectively etched relative to the pad polysilicon layer 5. Thus, the pad polysilicon layer 5 acts as a stopper when the $Si_3N_4$ film 6 is etched by reactive ion etching.

In the step having been explained with reference to FIG. 6G, the pad oxide film 4 acts as a stopper when the pad polysilicon layer 5 is etched. By removing the pad oxide film 4 by wet etching, it would be possible to protect the silicon layer 3 from being damaged by reactive ion etching.

Even if the pad oxide film 4 is removed by reactive ion etching in place of wet etching, it would be possible to reduce damage to the silicon layer 3, because the pad oxide film 4 is thin.

Herein, the damage to the silicon layer 3 caused by reactive ion etching includes that the silicon layer is etched to some degree during reactive ion etching, that contaminants such as carbon is attached to or enters the silicon layer 3 during reactive ion etching, and that defects are introduced to a surface of crystalline structure in the silicon layer 3 or into crystalline structure of the silicon layer 3.

The polysilicon layer 5 may be omitted, if the $Si_3N_4$ film 6 and the silicon dioxide film 4 could be patterned without the silicon layer 3 being damaged by reactive ion etching. When the polysilicon layer 5 is omitted, a cross-section of the semiconductor device, corresponding to a cross-section illustrated in FIG. 6D, would be one illustrated in FIG. 14. The silicon dioxide film 4 might be residual without being etched.

Figure 14:
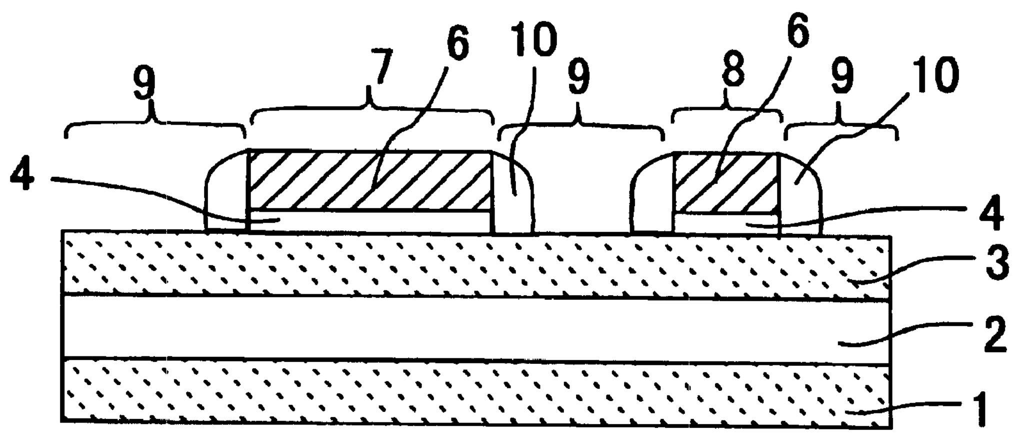
FIG. 14 is a cross-sectional view of a semiconductor device in accordance with the first embodiment.

The steps having been explained with reference to FIGS. 6E to 6L are carried out subsequently to the step having been explained with reference to FIG. 14. Thereafter, in order to accomplish the structure illustrated in FIG. 6E, the sidewall 10*b* in the body contact region 8 is removed by wet etching. When the sidewall 10*b* is wet-etched, an etchant enters the pad oxide film 3 through opposite sides thereof, and resultingly, the pad oxide film 4 would be etched to some degree at opposite sides thereof. This exerts no influence on the semiconductor device in accordance with the first embodiment.

It is not necessary to remove the sidewall 10*b* in the body contact region 8, if it would be necessary to avoid the pad oxide film 4 from being etched. However, when the sidewall 10*b* is not removed, the carrier path 11 and the high-concentration body contact region 16 do not make electrical contact with each other. In order to have the carrier path 11 and the high-concentration body contact region 16 made electrical contact with each other, it is necessary to widen the body contact region 8 by reactive ion etching or wet etching such that the body contact region 8 makes electrical contact with the carrier path 11, in any step to be carried out prior to the step of forming the high-concentration body contact region 16, similarly to the later mentioned second embodiment. As an alternative, similarly to the later mentioned third embodiment, impurity is implanted into the silicon layer 3 around the body contact region 8 through the use of a mask in order to form the carrier path, before the deposition of silicon dioxide from which the sidewalls 10*a* and 10*b* are formed.

If the sidewall 10*b* in the body contact region 8 is not to be removed, the sidewall 10*a* in the first region 7 would be residual after completion of the semiconductor device. This exerts no influence on the semiconductor device in accordance with the first embodiment.

Figure 15:
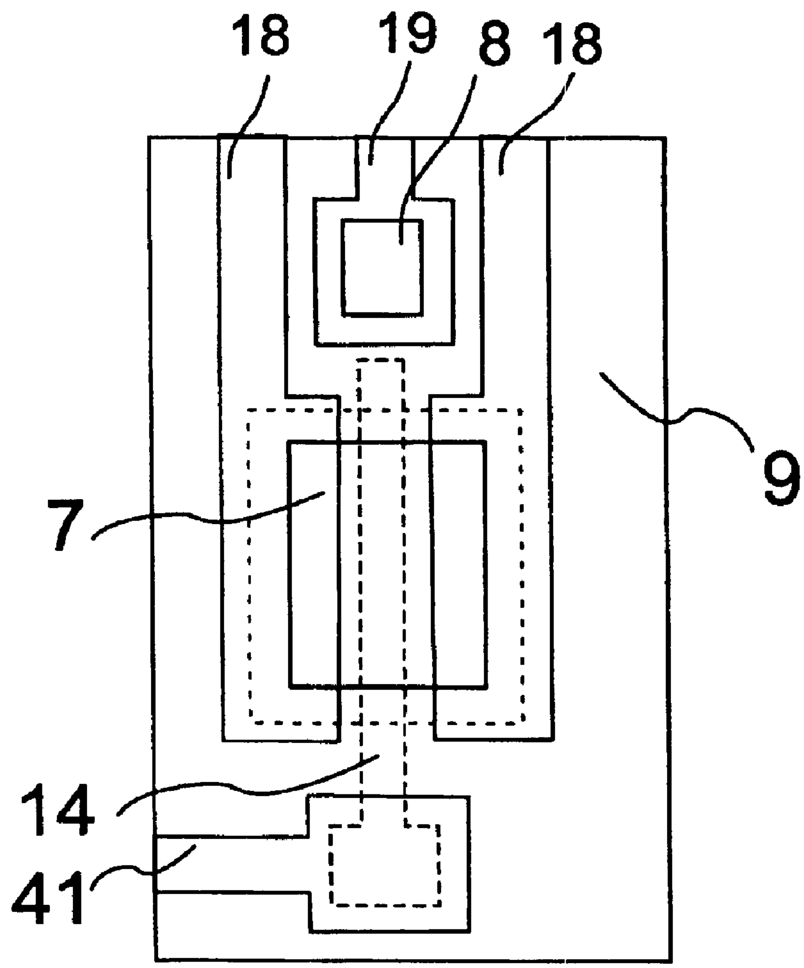
FIG. 15 is a plan view of a semiconductor device in accordance with the first embodiment.

In the drawings with reference to which the semiconductor device in accordance with the first embodiment has been explained above, the gate electrode 14, the source and drain regions 15 and the high-concentration body contact region 16 are illustrated as existing in a common cross-section. However, it should be noted that the high-concentration body contact region 16 and the body contact region 8 may be located anywhere in the device isolating region, if they make electrical contact with the channel region 38 comprised of a semiconductor layer located below the gate electrode 14, through the carrier path 11. For instance, as illustrated in FIG. 15, the high-concentration body contact region 16 and the body contact region 8 may be formed on an extension of the gate electrode 14. As an alternative, the high-concentration body contact region 16 and the body contact region 8 may be formed at a location which is not on an extension of the gate electrode 14 and where the gate electrode 14, the source and drain regions 15 and the high-concentration body contact region 16 are not located in a common cross-section.

After deposition of an electrically conductive material 21 such as polysilicon of which the gate electrode 14 is to be formed, the electrically conductive material 21 may be planarized by chemical vapor deposition. Since the material 21 would have a flat surface by being planarized, a resultant gate electrode could be readily processed.

Figure 16:
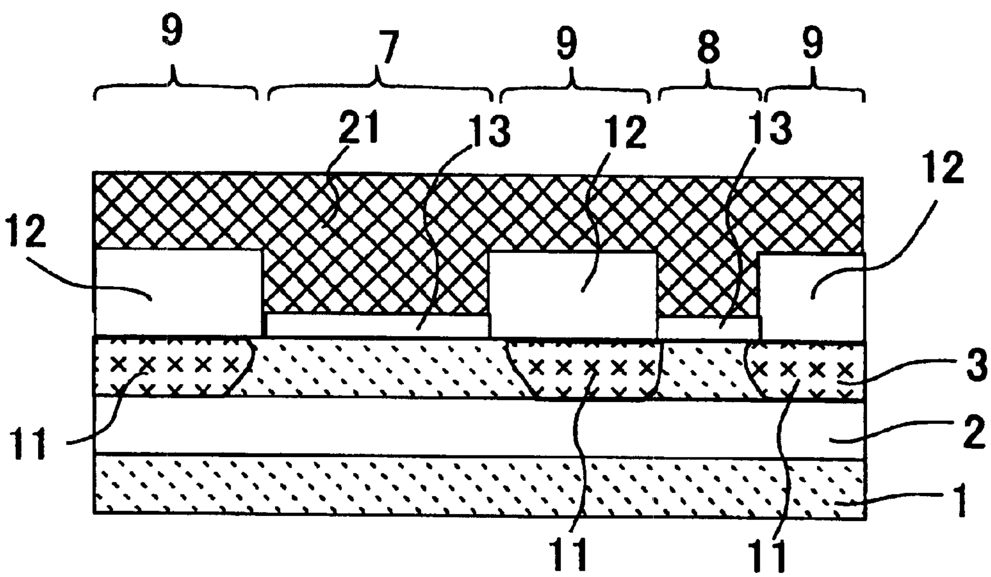
FIG. 16 is a cross-sectional view of a semiconductor device in accordance with the first embodiment.
Figure 17:
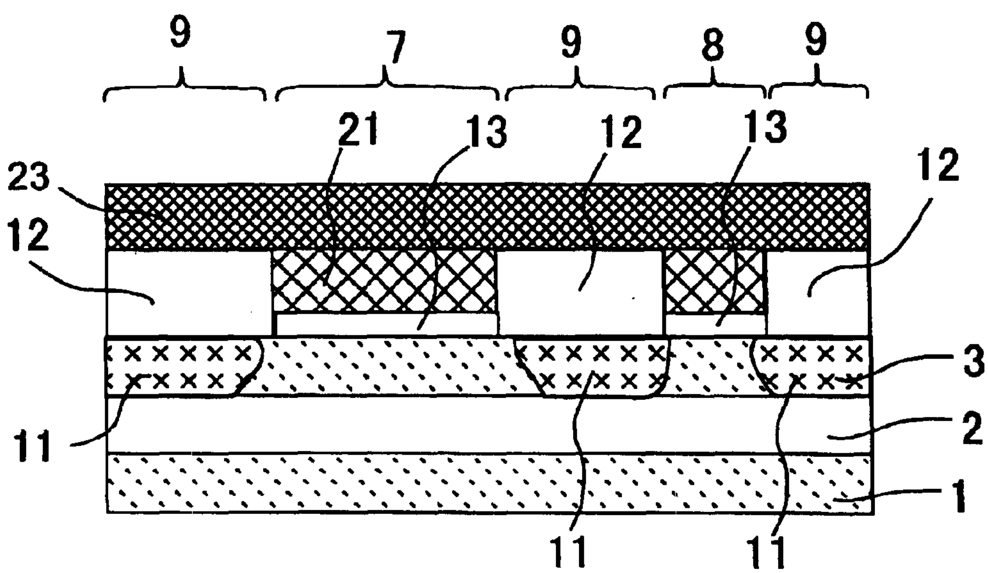
FIG. 17 is a cross-sectional view of a semiconductor device in accordance with the first embodiment.

When an electrically conductive material 21 of which the gate electrode 14 is to be formed is planarized, it would be necessary to remain the material 21 on the device isolating region in order to form an extension 42 (see FIG. 11) through which the gate electrode 14 is lead outside the first region 7. Hence, after the material 21 has been planarized to such a degree that at least a portion of the material 21 remains on the device isolating region, as illustrated in FIG. 16, the material 21 is patterned into the gate electrode 14 as illustrated in FIG. 6J. As an alternative, after the material 21 has been planarized by chemical mechanical polishing such that the polysilicon 21 are all removed in the device isolating region, an electrically conductive material 23 is deposited prior to patterning the material 21 into the gate electrode 14, as illustrated in FIG. 17, then, the materials 21 and 23 are patterned into the gate electrode 14.

The electrically conductive materials 21 and 23 may be identical with each other or different from each other. When the electrically conductive material 23 is used as well as the electrically conductive material 21, the resultant gate electrode 14 would have a two-layered structure including two layers each composed of the electrically conductive materials 21 and 23.

The material 23 may be deposited, after the electrically conductive material 21 has been planarized to such a degree that the material 21 in the device isolating region is not all removed.

[Second Embodiment]

FIGS. 18A to 18J are cross-sectional views of a semiconductor device in accordance with the second embodiment, illustrating respective steps of a method of fabricating the same. FIGS. 18A to 18J are cross-sectional views taken along the line XVIII—XVIII in FIGS. 19 and 20. The lines XVIII—XVIII and XXIV—XXIV in FIGS. 19 and 20 correspond to the lines VI—VI and XII—XII in FIG. 11, and the line XXV—XXV in FIG. 19 and the line XXVI—XXVI in FIG. 20 correspond to the line XIII—XIII in FIG. 11. Unless otherwise designated, species of impurity, a concentration of impurity, a dimension and a film thickness in the second embodiment are all the same as those in the first embodiment.

First, similarly to the first embodiment and as having been illustrated in FIG. 6A, there is formed a silicon-on-insulator (SOI) substrate including a silicon substrate 1, an electrically insulating film 2 formed on the silicon substrate 1, and a monocrystal silicon layer 3 formed on the electrically insulating film 2.

Then, the silicon layer 3 is thermally oxidized at a surface thereof by the thickness of 10 nm to thereby form a sacrifice oxide film at a surface of the silicon layer 3. Then, the sacrifice oxide film is removed by wet etching through the use of hydrofluoric acid.

Then, the silicon layer 3 is thermally oxidized at a surface by the thickness of 2 nm to thereby form a gate oxide film 20.

Then, a polysilicon layer 21 and a $Si_3N_4$ layer 22 are formed on the gate oxide film 20 by chemical vapor deposition. The polysilicon layer 21 has a thickness of 200 nm, and the $Si_3N_4$ layer 22 has a thickness of 100 nm.

Figure 18A:
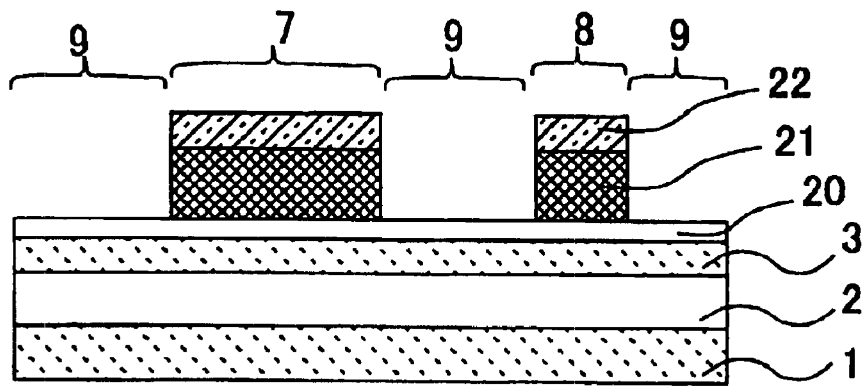
FIGS. 18A to 18J are cross-sectional views of a semiconductor device in accordance with the second embodiment, illustrating respective steps of a method of fabricating the same.

Then, as illustrated in FIG. 18A, the polysilicon layer 21 and the $Si_3N_4$ layer 22 are removed in a carrier path region 9 defined as a region other than the first region 7 and the second or body contact region 8.

Then, a silicon dioxide film is formed entirely over the patterned $Si_3N_4$ film 22 and the gate oxide film 20 by chemical vapor deposition by the thickness of 150 nm.

Figure 18B:
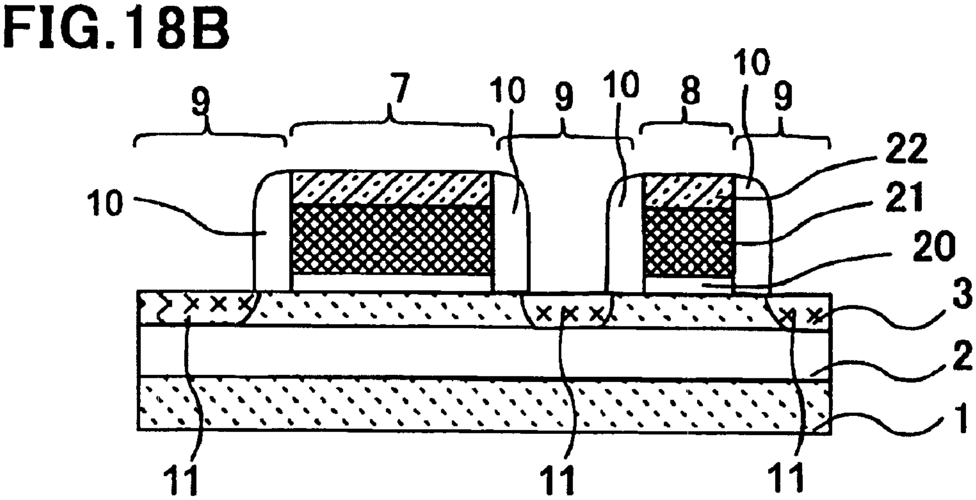
Figure 18C:
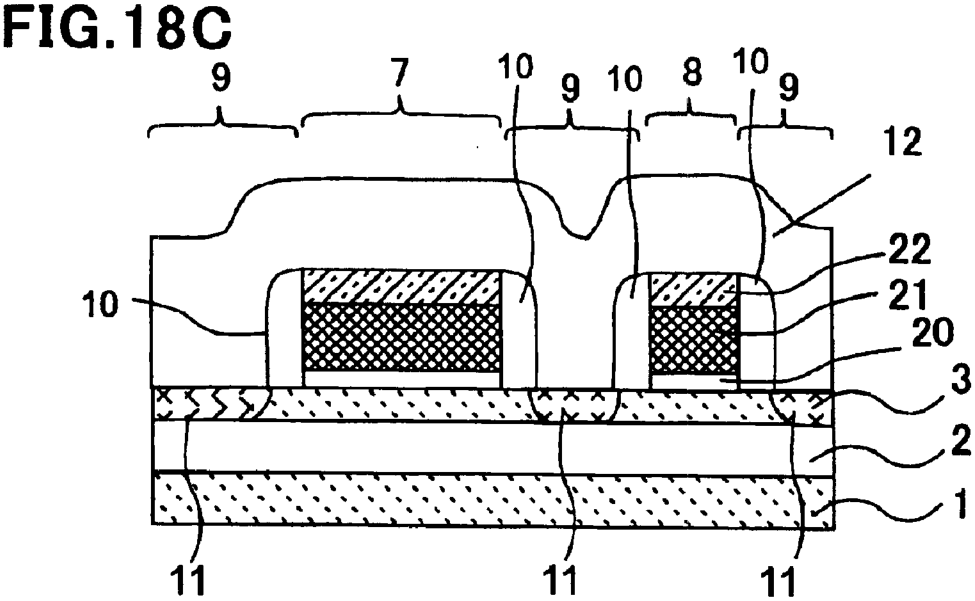

Then, as illustrated in FIG. 18B, the silicon dioxide film is etched back by reactive ion etching to thereby form sidewalls 10*a* and 10*b* around a side of the patterned $Si_3N_4$ film 22.

Then, impurity is implanted into the silicon layer 3 with the polysilicon layer 21, the $Si_3N_4$ film 22 and the sidewalls 10*a* and 10*b* being used as a mask. Subsequently, the semiconductor device is thermally annealed in order to activate the impurity. As a result, there is formed a carrier path region 11 in the silicon layer 3.

Figure 21A:
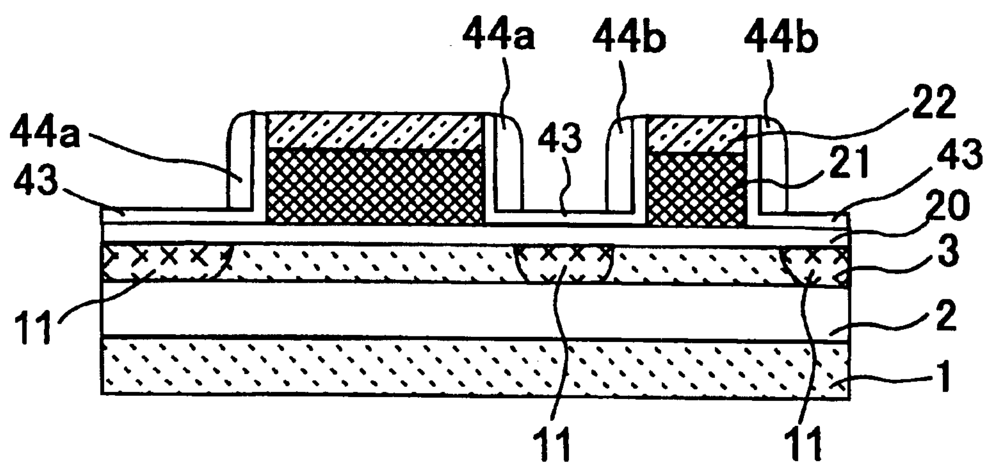
FIGS. 21A to 21D are cross-sectional views of a semiconductor device in accordance with the second and third embodiments.
Figure 21B:
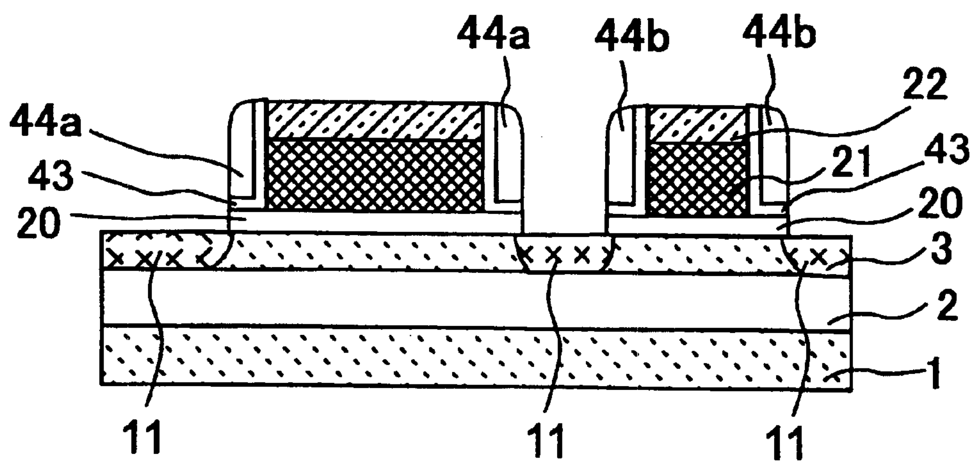
Figure 21C:
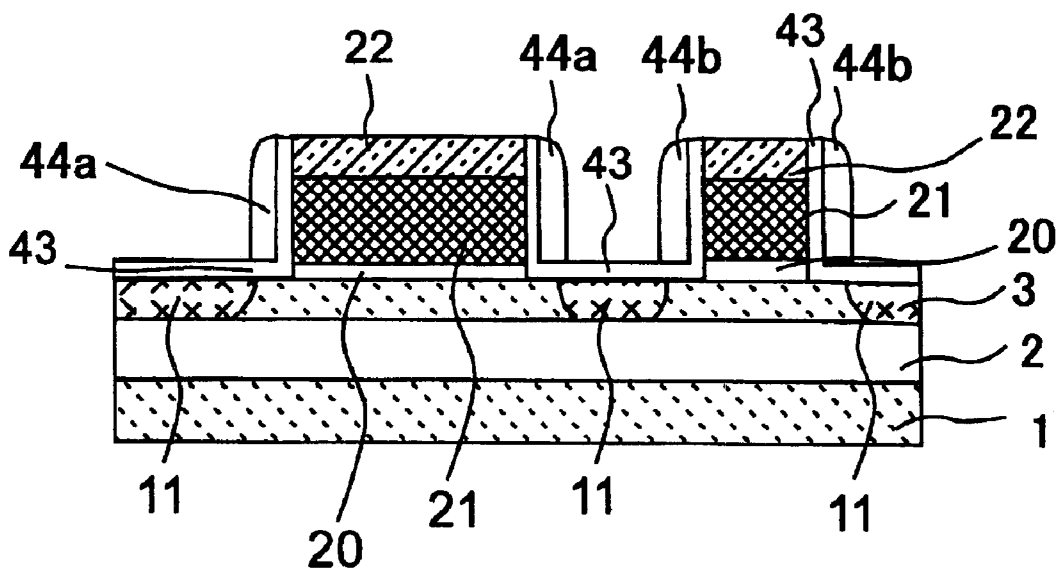
Figure 21D:
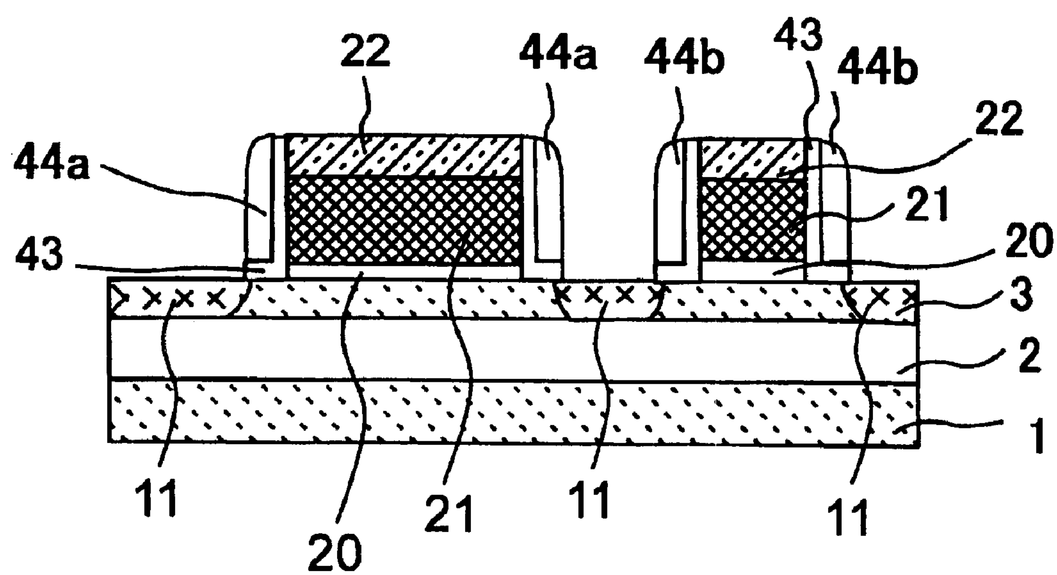

Each of the sidewalls 10*a* and 10*b* may be designed to have a multi-layered structure. For instance, as illustrated in FIGS. 21A, 21B, 21C and 21D, each of the sidewalls 10*a* and 10*b* may be designed to have a two-layered structure including a $Si_3N_4$ film 43 and a silicon dioxide film 44. In FIGS. 21A and 21B, the $Si_3N_4$ film 43 is formed on the gate oxide film 20. In FIGS. 21C and 21D, the gate oxide film 20 is removed, and then, the $Si_3N_4$ film 43 is formed on the silicon film 3. The $Si_3N_4$ film 43 acts as a stopper to etching, when the silicon dioxide film 44 is etched back for forming the sidewalls 10*a* and 10*b*.

In FIGS. 21B and 21D, the silicon layer 3 is exposed in the device isolating region except the sidewalls 10*a* and 10*b*. In FIG. 21B, only the $Si_3N_4$ film 43 may be removed without removal of the gate oxide film 20 in the device isolating region except the sidewalls 10*a* and 10*b*.

In FIGS. 21B and 21D, since it is unnecessary to implant ions into the silicon layer 3 through the $Si_3N_4$ film 43 for forming the carrier path 11, nitrogen atoms existing in the $Si_3N_4$ film 43 would never enter the silicon layer 3 during ion implantation.

In FIGS. 21B and 21D, since the silicon layer 3 is exposed in the device isolating region, ions can be implanted into the silicon layer 3 by gas-phase diffusion, solid-phase diffusion or plasma doping as well as ion implantation.

In FIGS. 21A, 21C and 21D, since the gate oxide film 20 is not exposed, the gate oxide film 20 would not be etched, even if the sidewalls 10*b* are wet-etched for removal. Hence, if the sidewalls 10*a* and 10*b* are designed to have the two-layered structure illustrated in FIGS. 21A, 21C or 21D, it would be possible to electrically connect the carrier path 11 and the body contact region 8 to each other, similarly to the first embodiment, by removing a sidewall 44*b* located adjacent to the body contact region 8 without removing a sidewall 44*a* located adjacent to the first region 7. If the $Si_3N_4$ film 43 is sufficiently thin, impurity contained in the carrier path 11 and impurity contained in the body contact region 8 make latitudinal contact with each other. For instance, the $Si_3N_4$ film 43 has a thickness of 10 nm.

Figure 18D:
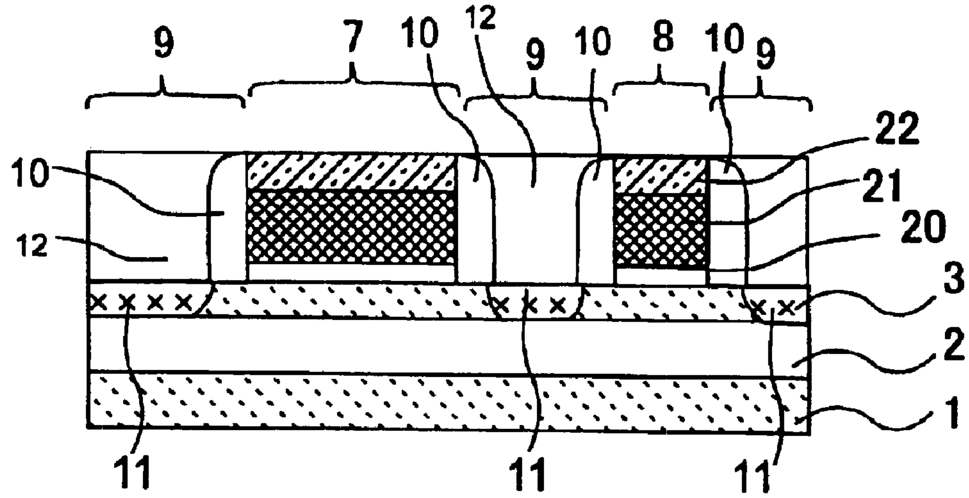
Figure 18E:
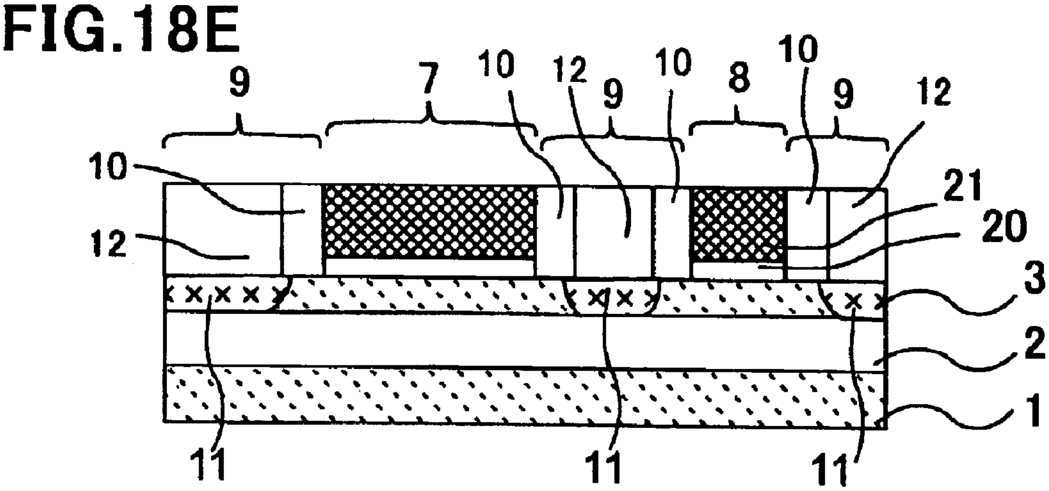
Figure 18F:
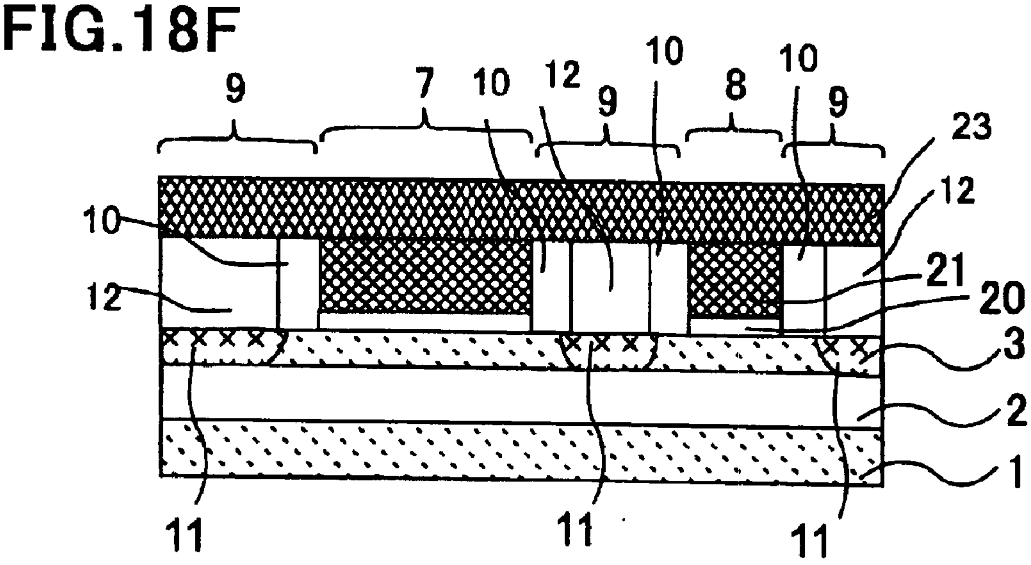
Figure 18G:
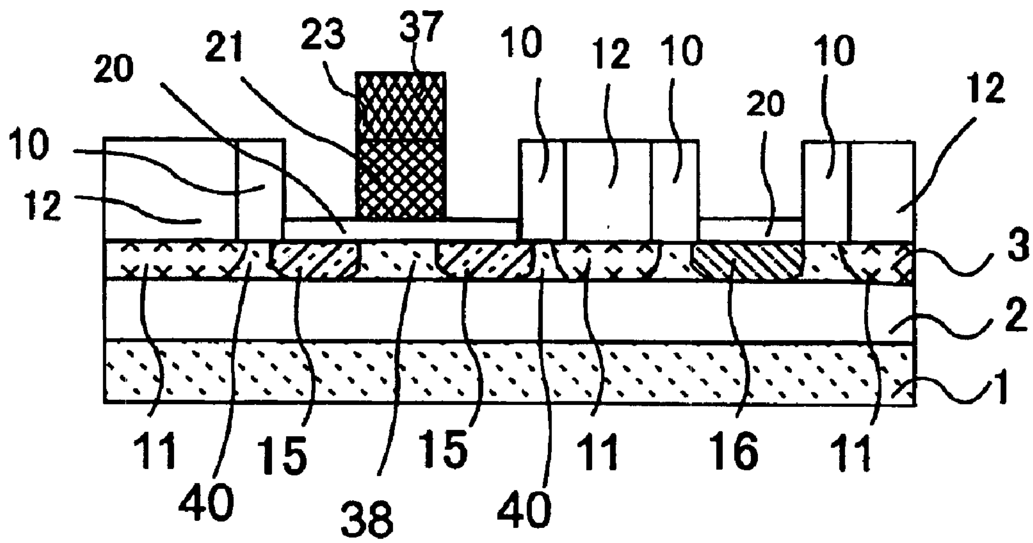
Figure 18H:
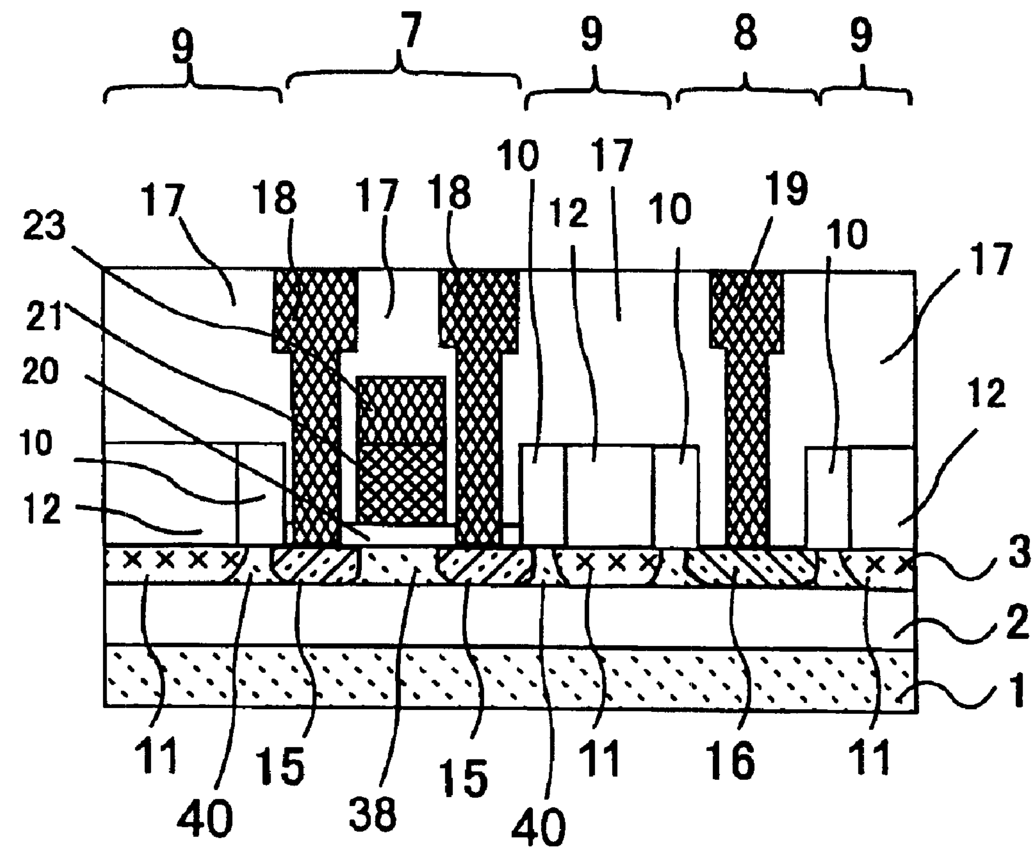
Figure 22:
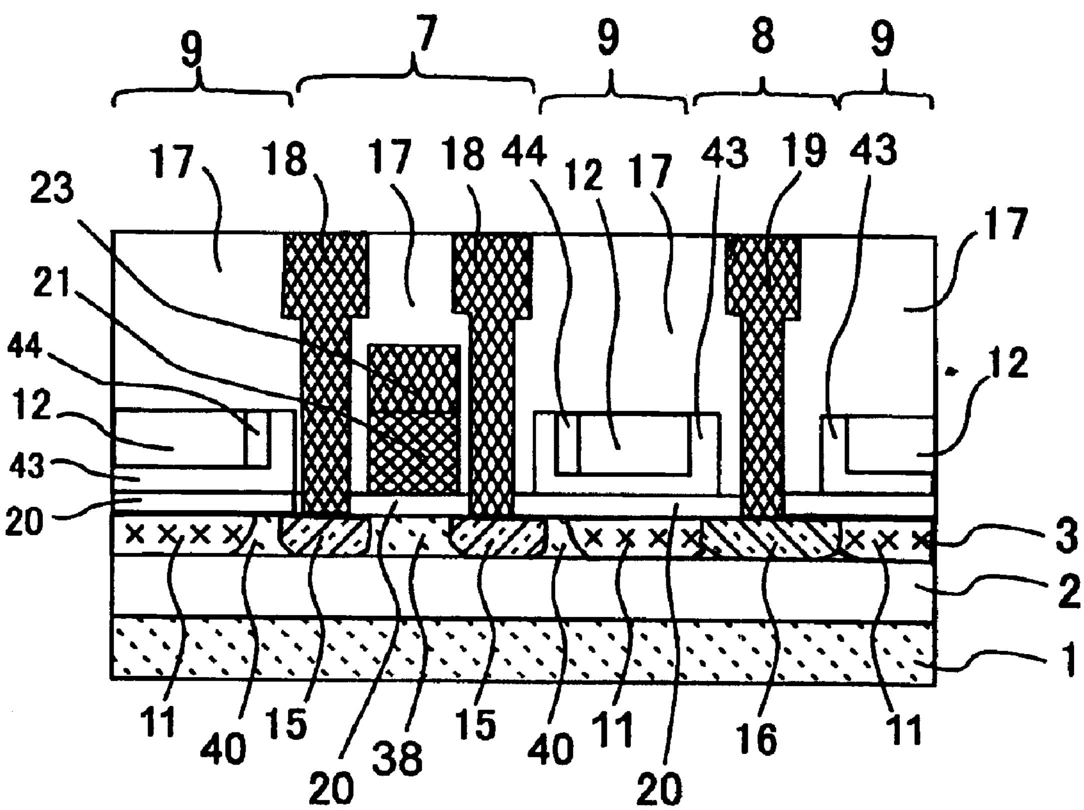
FIG. 22 is a cross-sectional view of a semiconductor device in accordance with the second and third embodiments.

By carrying out the same steps as having been in the first embodiment, the carrier path 11 and the body contact region 8 make contact with each other at the stage corresponding to the stage illustrated in FIGS. 18G and 18H, as illustrated in FIG. 22. The sidewalls 10 illustrated in FIGS. 18G and 18H have a shape reflecting a shape of the multi-layered structure illustrated in FIGS. 21A to 21D. However, this exerts no influence on the semiconductor device in accordance with the second embodiment.

FIG. 22 is a cross-sectional view of a semiconductor device including the sidewall illustrated in FIG. 21A.

Figure 23:
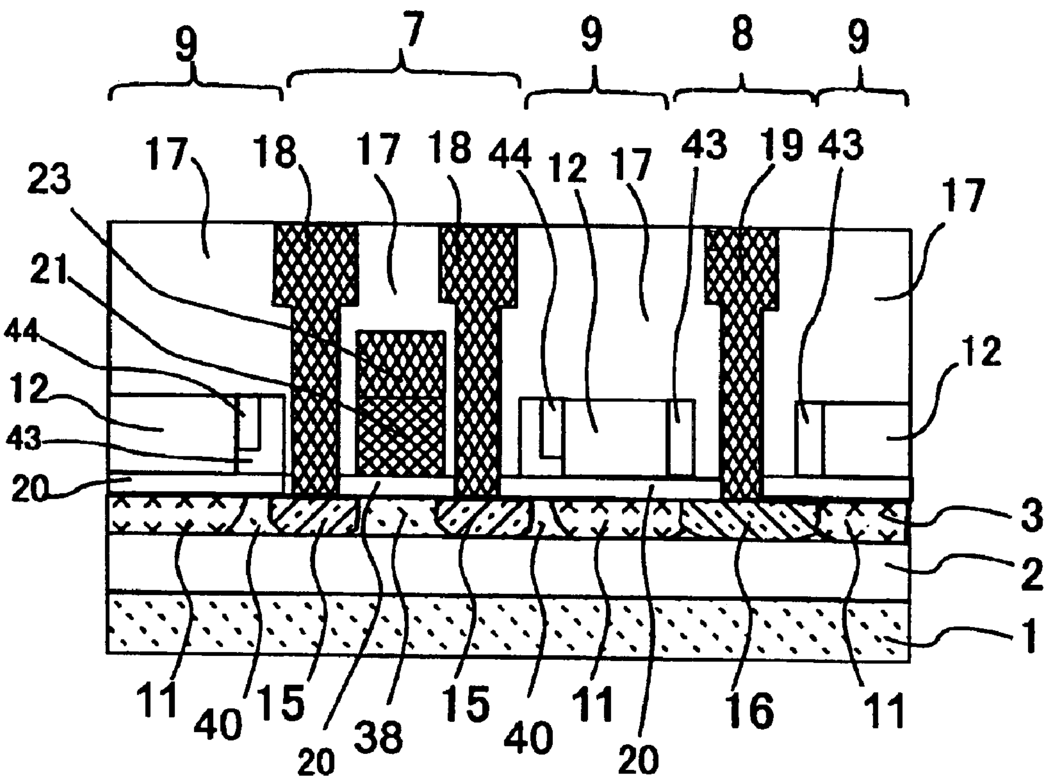
FIG. 23 is a cross-sectional view of a semiconductor device in accordance with the second and third embodiments.

The $Si_3N_4$ film 43 may be removed by etching such as reactive ion etching, after one of the sidewalls 44*a* and 44*b* is removed in FIGS. 21A, 21C and 21D. FIG. 23 illustrates a semiconductor device including the sidewall illustrated in FIG. 21A.

Referring back to FIG. 18C, a silicon dioxide film 12 is formed to entirely cover the resultant therewith.

Then, as illustrated in FIG. 18D, the silicon dioxide film 12 is planarized by chemical mechanical polishing with the $Si_3N_4$ film 22 being used as a stopper.

Then, as illustrated in FIG. 18E, the $Si_3N_4$ film 22 is removed by reactive ion etching. Upper portions of the silicon dioxide film 12 and the sidewalls 10 are also removed by the reactive ion etching, as illustrated in FIG. 18E.

Then, as illustrated in FIG. 18F, tungsten (W) is deposited entirely over a resultant by the thickness of 100 nm to thereby form an electrical conductor 23.

Then, as illustrated in FIG. 18G, the electrical conductor 23 and the polysilicon 21 are patterned into a gate electrode 37 by photolithography and reactive ion etching.

Then, ion is implanted into the silicon layer 3 around the gate electrode 37 with the gate electrode 37 being used as a mask in the first region 7, to thereby form source and drain regions 15 in the silicon layer 3. N-type impurity is implanted into the source and drain regions in an n-type channel transistor at a high concentration, and p-type impurity is implanted into the source and drain regions in a p-type channel transistor at a high concentration.

P-type impurity is implanted at a high concentration into the second or body contact region 8 making electrical contact with the n-type channel transistor through the carrier path 11, and n-type impurity is implanted at a high concentration into the second or body contact region 8 making electrical contact with the p-type channel transistor through the carrier path 11. As a result, there is formed a high-concentration body contact region 16.

Figure 19:
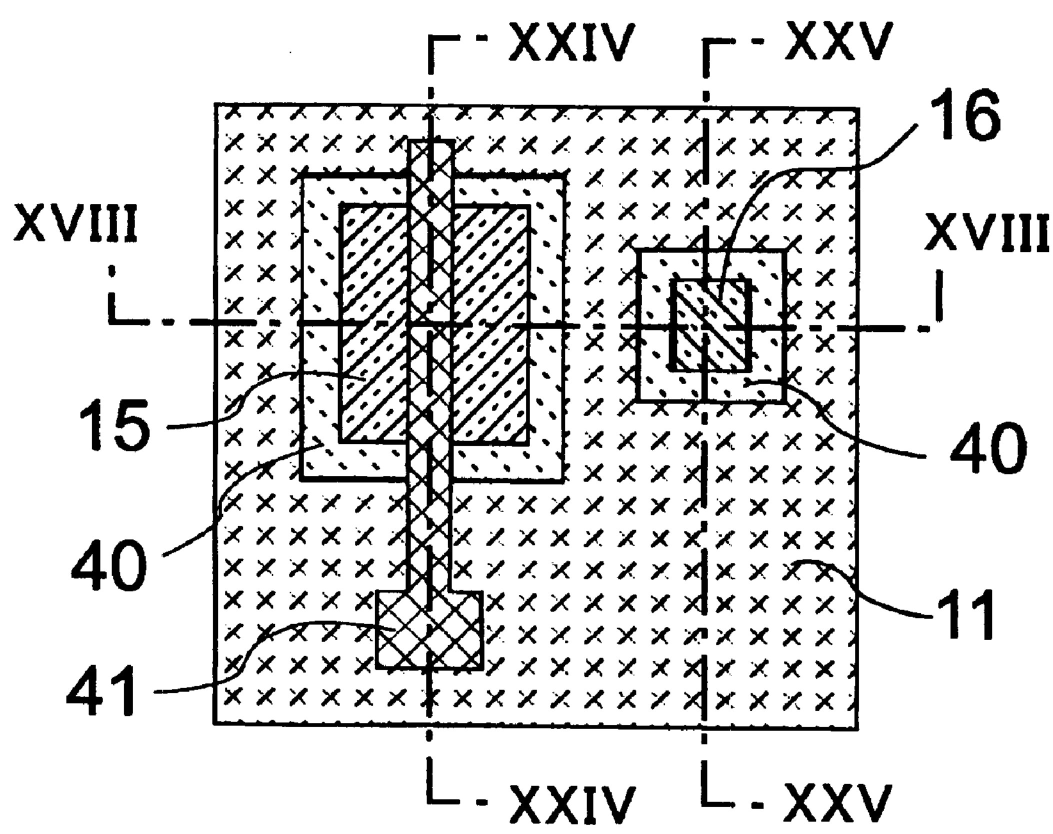
FIG. 19 is a plan view of a semiconductor device in accordance with the second and third embodiments.

The silicon layer 3 below the gate electrode 14 makes a channel region 38. FIG. 19 is a plan view of the semiconductor device in accordance with the second embodiment at this stage.

Then, as illustrated in FIG. 18H, a silicon dioxide film is formed entirely over a resultant by chemical vapor deposition by the thickness of 500 nm. Then, the silicon dioxide film is planarized by chemical mechanical polishing to thereby form an interlayer insulating film 17. Thereafter, as illustrated in FIG. 18H, there are formed wirings 18 making electrical contact with the source and drain regions 15, and a body contact wiring 19 making electrical contact with the high-concentration body contact region 16. Though not illustrated, a gate electrode wiring is electrically connected to an extension of the gate electrode, similarly to the first embodiment. Herein, FIG. 18H is a cross-sectional view taken along the line XVIII—XVIII in FIG. 19.

Figure 18I:
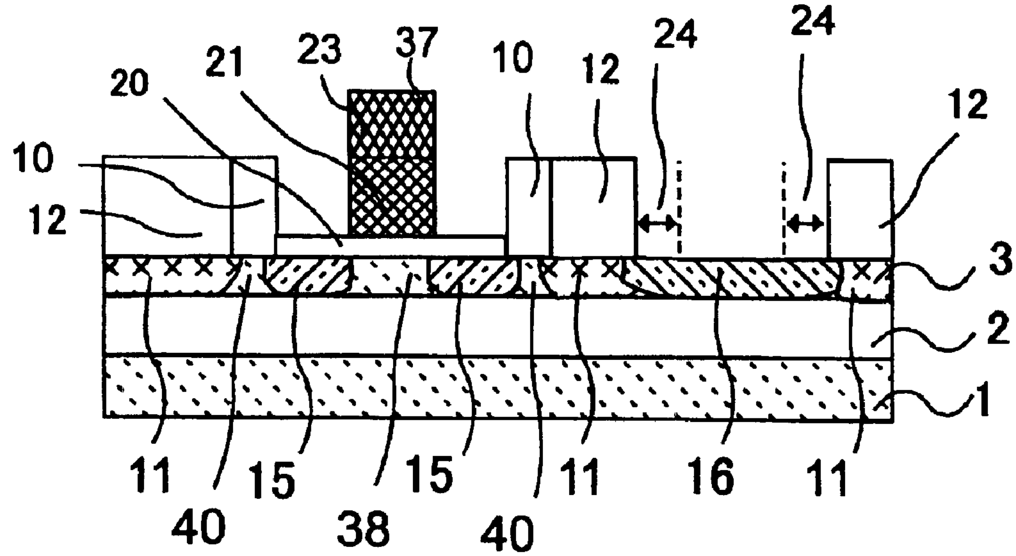

In FIG. 18G, the sidewall 10 located around the high-concentration body contact region 16 and/or a part of the oxide film 12 may be removed by photolithography and etching prior to the formation of the high-concentration body contact region 16, to thereby form an enlarged opening 24, as illustrated in FIG. 18I. By forming the high-concentration body contact region 16 after the formation of the enlarged opening 24, the high-concentration body contact region 16 would be widened relative to the same in FIG. 18G, ensuring that the high-concentration body contact region 16 makes electrical contact with the carrier path 11. If the high-concentration body contact region 16 makes electrical contact with the carrier path 11, a resistance in a path through which carriers move to the body contact region 8 would be preferably reduced.

Figure 18J:
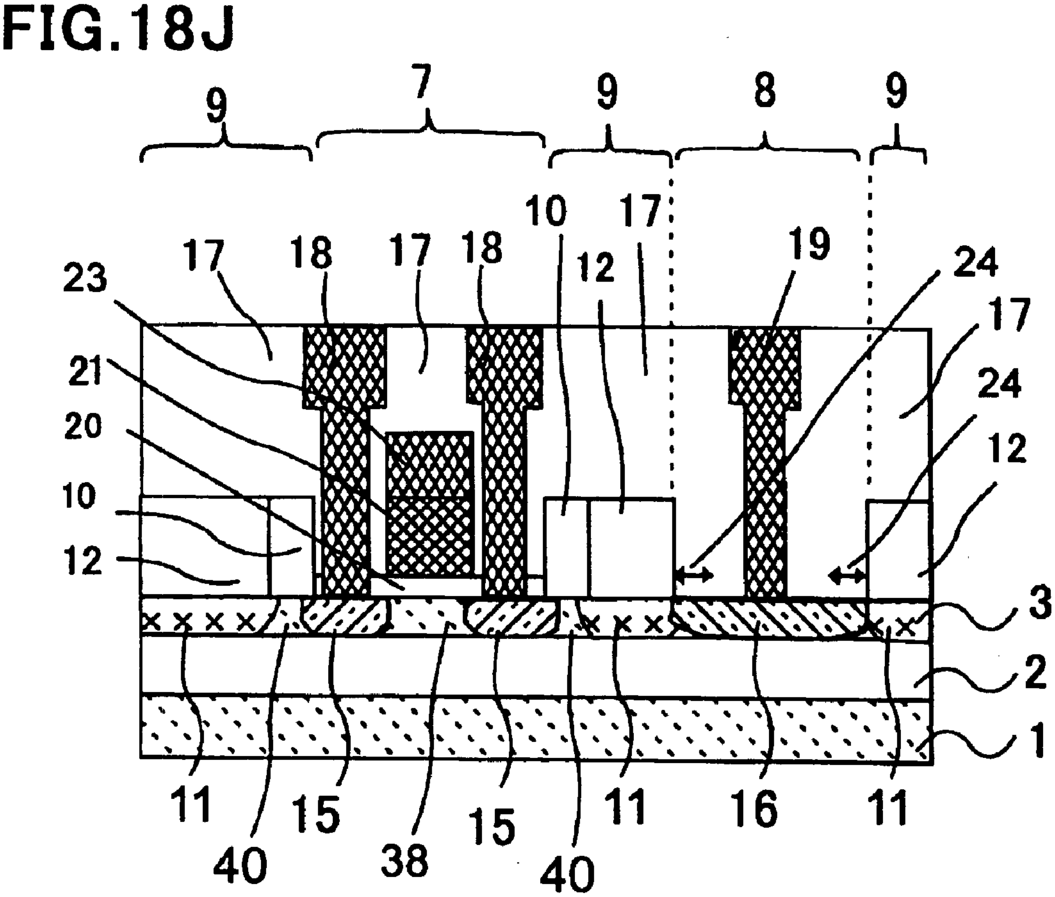

Then, wirings are formed, as illustrated in FIG. 18J, similarly to FIG. 18H.

Figure 20:
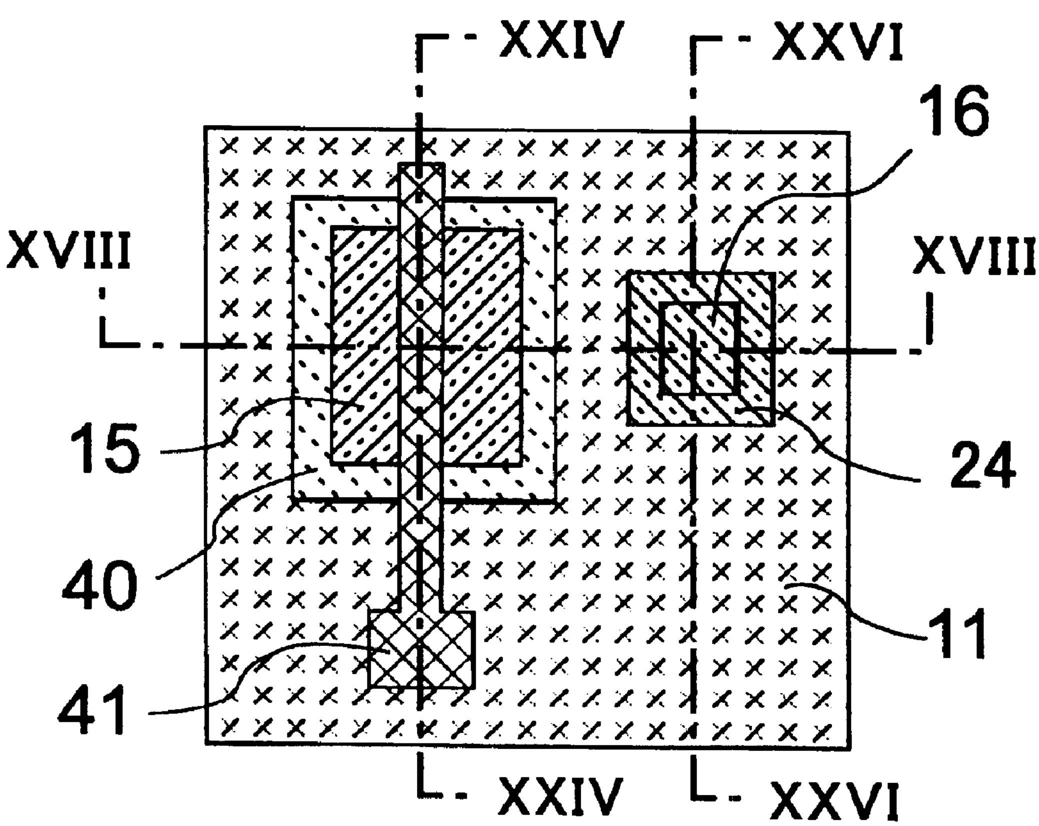
FIG. 20 is a plan view of a semiconductor device in accordance with the second and third embodiments.
Figure 24:
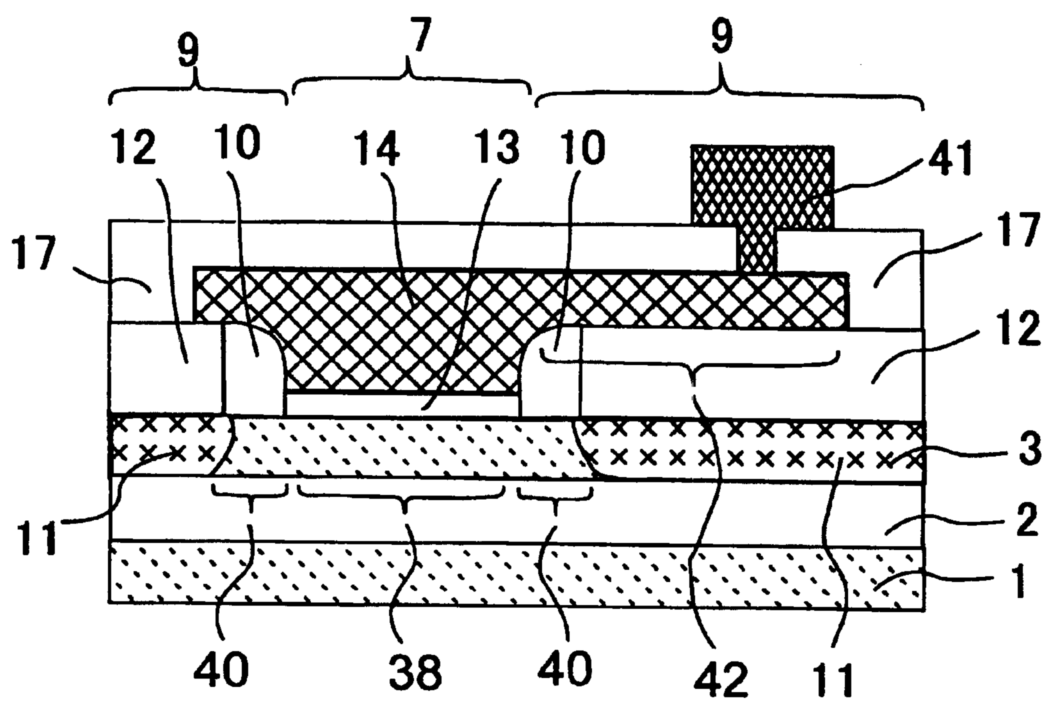
FIG. 24 is a cross-sectional view of a semiconductor device in accordance with the second and third embodiments.
Figure 25:
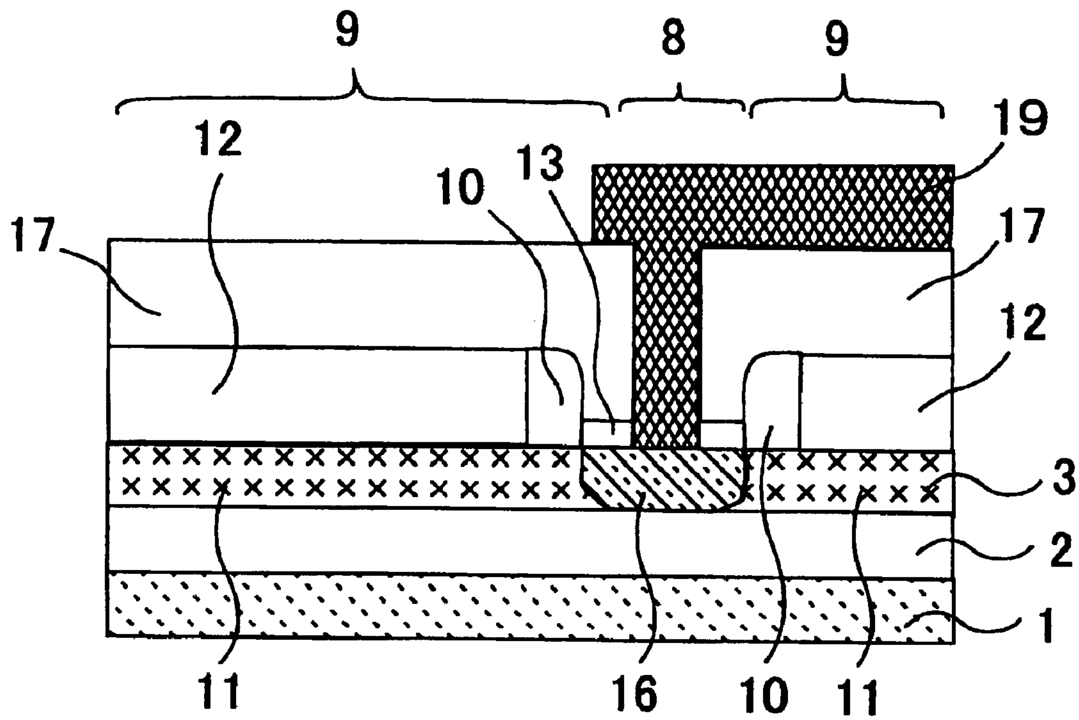
FIG. 25 is a cross-sectional view of a semiconductor device in accordance with the second and third embodiments.
Figure 26:
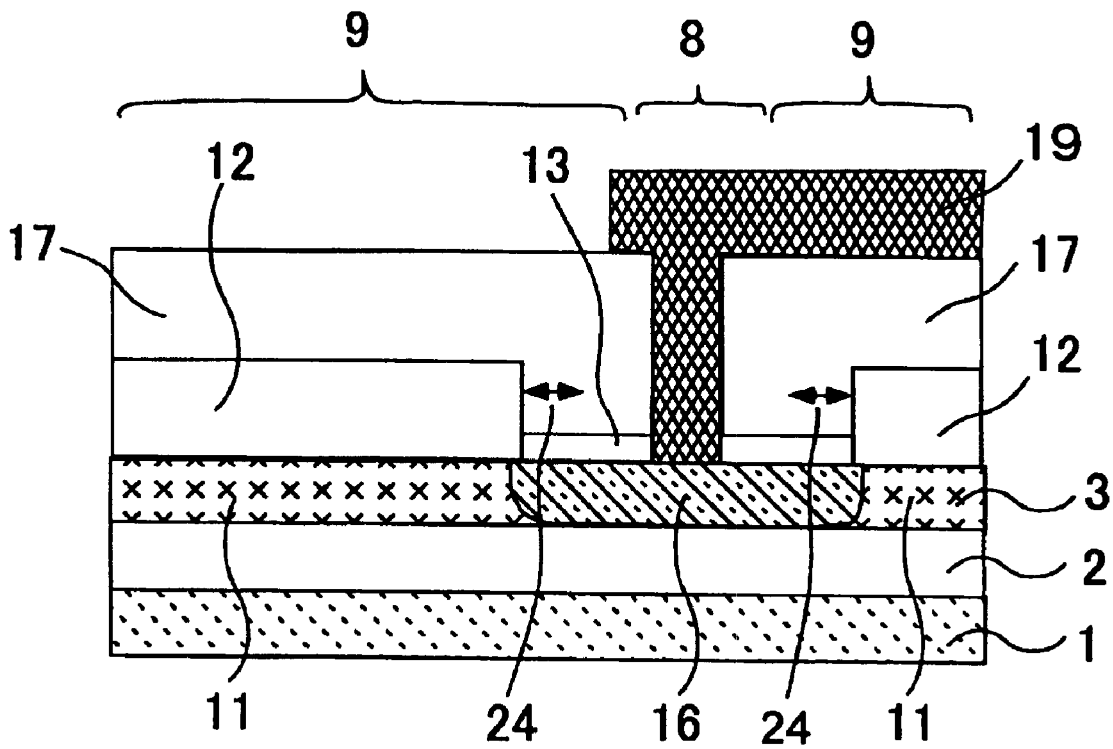
FIG. 26 is a cross-sectional view of a semiconductor device in accordance with the second and third embodiments.

FIG. 24 is a cross-sectional view taken along the line XXIV—XXIV in FIG. 19 and the line XXIV—XXIV in FIG. 20. FIG. 25 is a cross-sectional view taken along the line XXV—XXV in FIG. 19, and FIG. 26 is a cross-sectional view taken along the line XXVI—XXVI in FIG. 20.

The mask for carrying out chemical mechanical polishing is not to be limited to a structure of the above-mentioned one. For instance, the mask may be designed to have a three-layered structure including a top layer composed of a material having a resistance to chemical mechanical polishing, an intermediate layer composed of electrically conductive material or material which would have electrical conductivity by introducing impurity thereinto, and a bottom layer comprised of an electrically insulating layer which defines the gate insulating film. The intermediate layer has to be a material of which the gate electrode can be composed.

The above-mentioned electrical conductor to be formed above the gate electrode may be composed of any material, if it has electrical conductivity. For instance, the electrical conductor may be composed of polycrystalline semiconductor such as polysilicon, silicon-germanium or mixed crystal, silicide such as tungsten silicide, molybdenum silicide, cobalt silicide, nickel silicide or titanium silicide, metal such as tungsten silicide or molybdenum silicide, or metal compound such as TiN or TaN.

The intermediate layer in the mask may be designed to have a multi-layered structure including layers each composed of electrically conductive material or material which would have electrical conductivity by introducing impurity thereinto. Similarly, the electrical conductor may be designed to have a multi-layered structure including layers each composed of electrically conductive material or material which would have electrical conductivity by introducing impurity thereinto.

[Third Embodiment]

FIGS. 27A to 27J are cross-sectional views of a semiconductor device in accordance with the third embodiment, illustrating respective steps of a method of fabricating the same. FIGS. 27A to 27J are cross-sectional views taken along the line XVIII—XVIII in FIGS. 19 and 20. Unless otherwise designated, species of impurity, a concentration of impurity, a dimension and a film thickness in the second embodiment are all the same as those in the first embodiment.

First, similarly to the first embodiment and as having been illustrated in FIG. 6A, there is formed a silicon-on-insulator (SOI) substrate including a silicon substrate 1, an electrically insulating film 2 formed on the silicon substrate 1, and a monocrystal silicon layer 3 formed on the electrically insulating film 2.

The electrically insulating film 2 is composed of silicon dioxide ($SiO_2$), and has a thickness of 100 nm. The silicon layer 3 has a thickness in the range of 10 nm to 50 nm both inclusive.

Then, the silicon layer 3 is thermally oxidized at a surface thereof to thereby form a sacrifice oxide film at a surface of the silicon layer 3. The thus formed sacrifice oxide film has a thickness of 10 nm. Then, the sacrifice oxide film is removed by wet etching through the use of hydrofluoric acid.

Then, a dummy gate insulating film 25 having a thickness of 2 nm is formed on the silicon layer 3 by thermal oxidation.

Then, a polysilicon layer having a thickness of 200 nm is formed on the dummy gate insulating film 25.

Then, the dummy gate insulating film 25 and the polysilicon layer are removed in a carrier path region 9 defined as a region other than the first and second regions 7 and 8. As a result, as illustrated in FIG. 27A, a multi-layered structure comprised of the dummy gate insulating film 25 and a dummy gate electrode 26 is formed in the first and second regions 7 and 8.

Figure 27A:
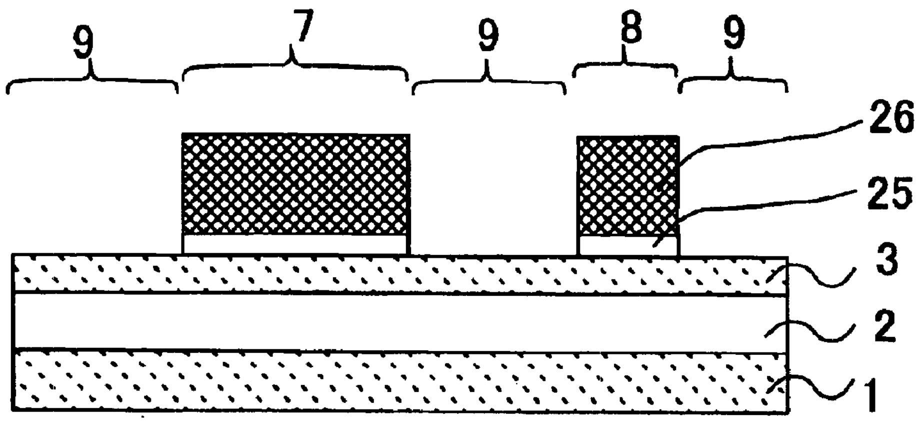
FIGS. 27A to 27J are cross-sectional views of a semiconductor device in accordance with the third embodiment, illustrating respective steps of a method of fabricating the same.
Figure 27B:
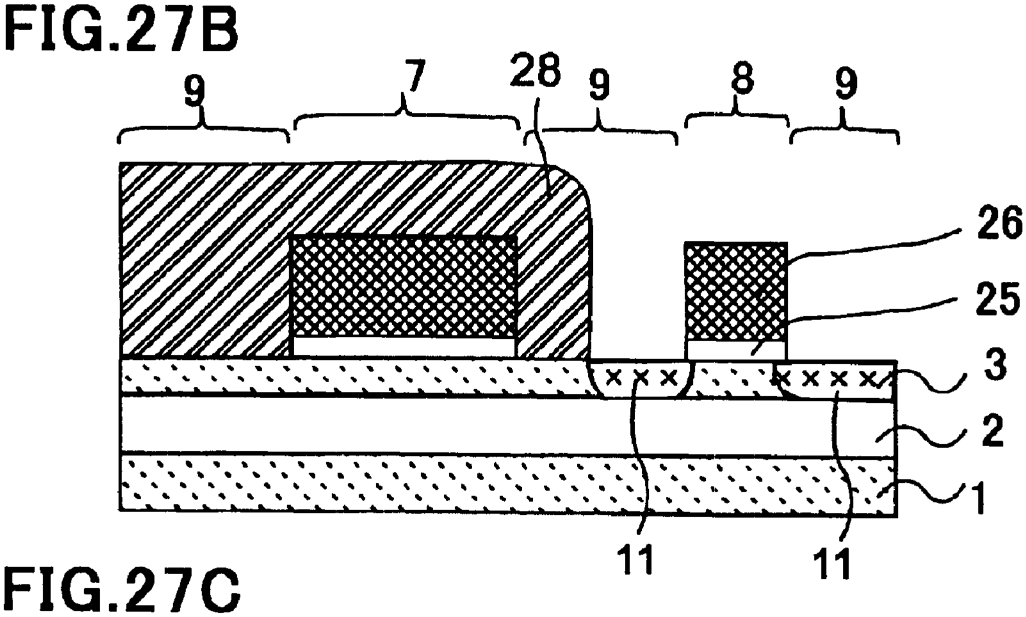
Figure 27C:
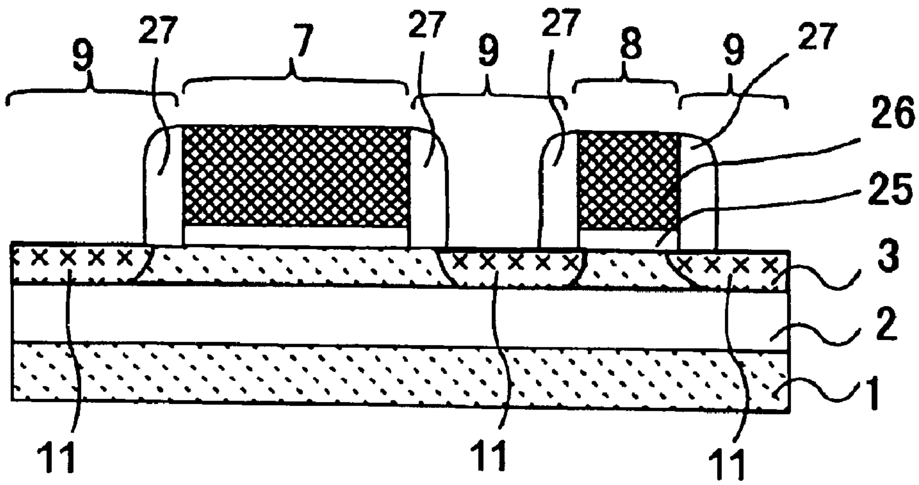

In FIG. 27A, it is not always necessary to etch the dummy gate insulating film 25, in which case, the dummy gate insulating film 25 acts as a stopper to etching of a benzo-cyclo butene (BCB) film, when the benzo-cyclo butene (BCB) film is etched back for forming an organic sidewall 27 in FIG. 27C. However, the dummy gate insulating film 25 remains unetched below a $Si_3N_4$ film (see FIG. 27D). If the dummy gate insulating film 25 remains unetched, the dummy gate insulating film 25 formed below the $Si_3N_4$ film might be etched latitudinally and in a width-wise direction at a boundary between the first region 7 and the device isolating region in a step of removing the dummy gate insulating film 25 formed below the dummy gate electrode 26, by wet etching in order to have such a structure as illustrated in FIG. 27I. If it is necessary to avoid the dummy gate insulating film 25 from being latitudinally etched, it is preferable to entirely remove the dummy gate insulating film 25.

Then, as illustrated in FIG. 27B, there is formed a resist pattern 28 with which the first region 7 and a region therearound are covered, but the body contact region 9 and a region therearound are not covered. Then, impurity having a relatively high concentration is implanted a region around the body contact region 9 to thereby form the carrier path 11. For instance, the impurity has a concentration in the range of $1\times10^{18}$ $cm^{-3}$ to $1\times10^{20}$ $cm^{-3}$.

When a CMOS transistor is to be fabricated, a mask pattern used for ion implantation is prepared for steps of forming source and drain regions in an n-type channel transistor, forming source and drain regions in a p-type channel transistor, forming a body contact in an n-type channel transistor, and forming a body contact in a p-type channel transistor. Then, a resist pattern making a desired region exposed is formed on a wafer by means of the mask, and subsequently, impurity is implanted into the desired region.

In the fabrication of a CMOS transistor, source and drain regions in an n-type channel transistor and a body contact region in a p-type channel transistor have the same electrical conductivity as each other, and accordingly, it would be possible to concurrently implant impurity into both of the source and drain regions and the body contact region. In this case, there is formed a resist pattern making both of the source and drain regions and the body contact region exposed, through the use of a mask pattern in which a region other than the source and drain regions and the body contact region is exposed.

Similarly, since source and drain regions in a p-type channel transistor and a body contact region in an n-type channel transistor have the same electrical conductivity as each other, it would be possible to concurrently implant impurity into both of the source and drain regions and the body contact region.

Referring back to FIG. 27C, benzo-cyclo butene (BCB) is deposited by chemical vapor deposition by the thickness of 150 nm. Then, benzo-cyclo butene is etched back by reactive ion etching to thereby from a sidewall composed of a BCB film 27, around the dummy gate electrode 26.

Then, impurity having a relatively high concentration is implanted into the silicon layer 3 with both of the dummy gate electrode 26 and the BCB film 27 being used as a mask, to thereby form a carrier path 11 in the silicon layer 3 around the first and second regions 7 and 8. As a result, as illustrated in FIG. 27C, the carrier path 11 does not make electrical contact with the first region 7, but makes electrical contact with the body contact region 8.

A sidewall comprised of an organic film such as a BCB film can be readily removed by dry process such as oxygen plasma.

Figure 27D:
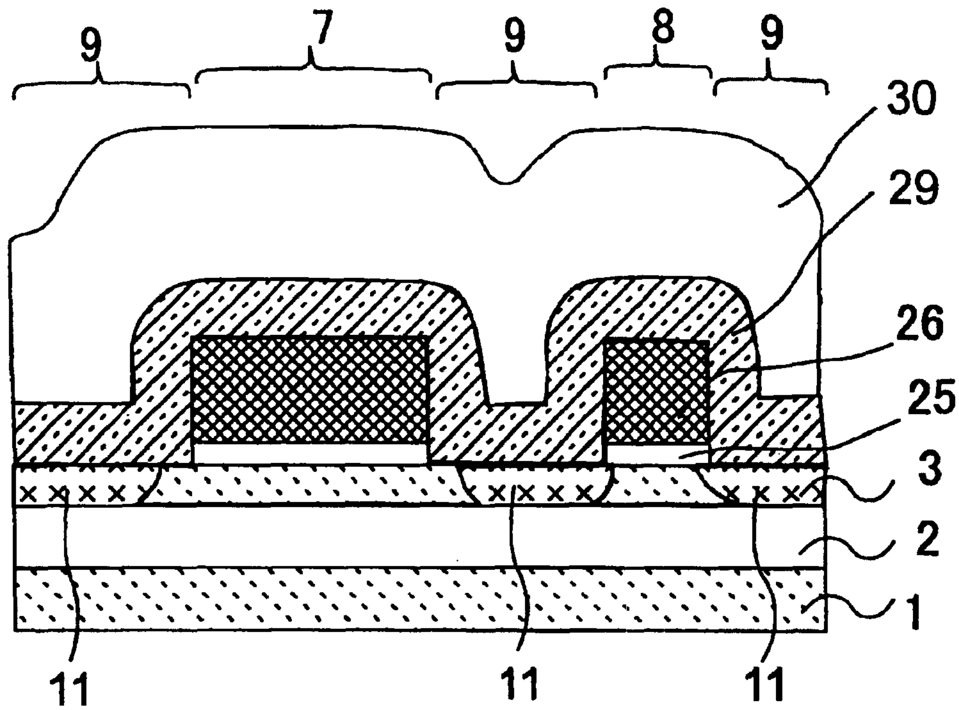

After removal of the BCB film, a $Si_3N_4$ film 29 is formed entirely over a resultant by chemical vapor deposition, and then, a silicon dioxide film 30 is formed on the $Si_3N_4$ film 29 by chemical vapor deposition, as illustrated in FIG. 27D. For instance, the $Si_3N_4$ film 29 has a thickness of 100 nm.

Figure 27E:
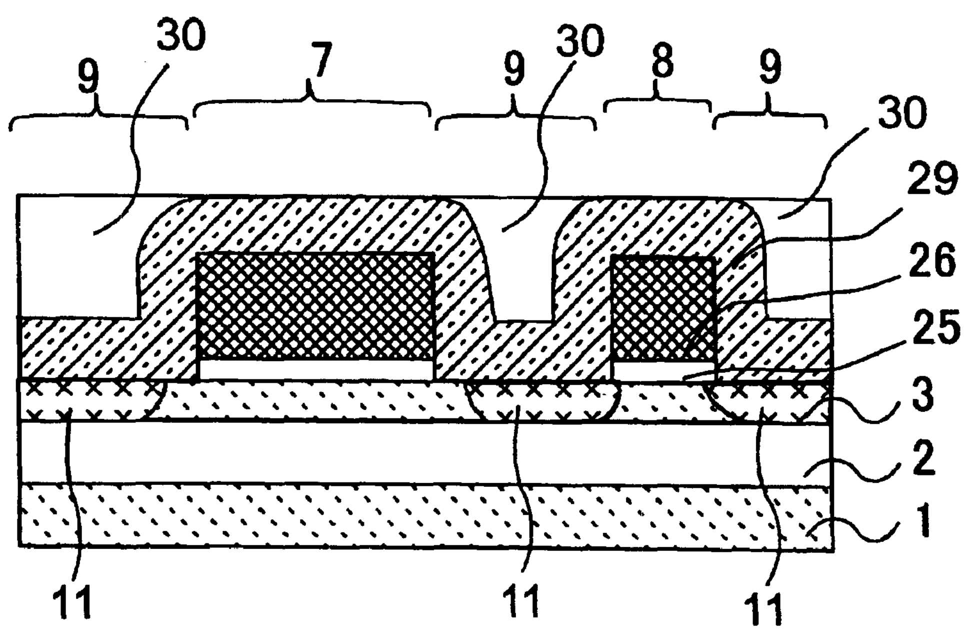

Then, as illustrated in FIG. 27E, the silicon dioxide film 30 is planarized by chemical mechanical polishing with the $Si_3N_4$ film 29 being used as a stopper.

Then, the $Si_3N_4$ film 29 existing on the dummy gate electrode 26 is removed by reactive ion etching. An upper portion of the silicon dioxide film 30 is also removed together with the $Si_3N_4$ film 29.

Figure 27F:
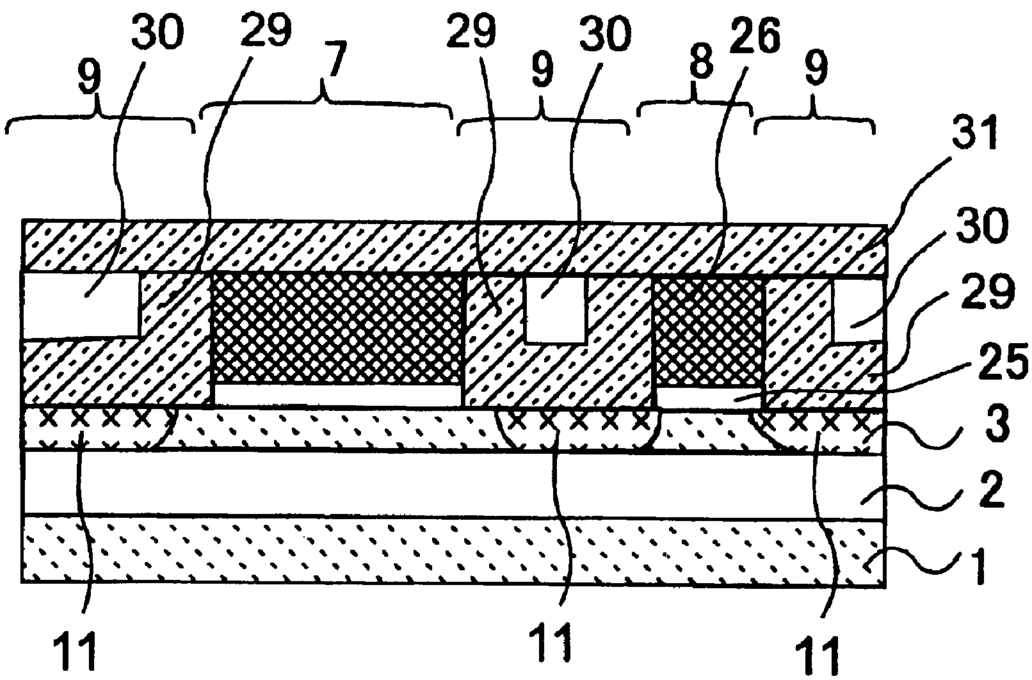

Then, a second $Si_3N_4$ film 31 is formed entirely over a resultant, as illustrated in FIG. 27F.

Then, the second $Si_3N_4$ film 31 is patterned by photolithography and reactive ion etching.

Then, the dummy gate electrode 26 is patterned with the second $Si_3N_4$ film 31 in the first region 7 being used as a mask.

Figure 27G:
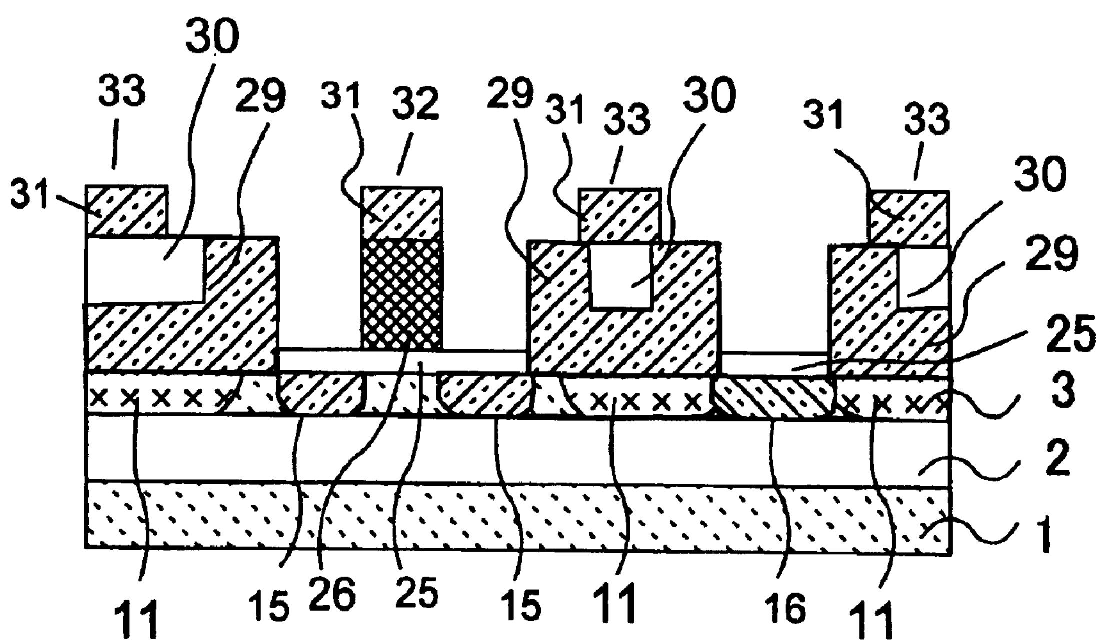

As a result, as illustrated in FIG. 27G, a dummy gate 32 having a multi-layered structure including the dummy gate electrode 26 and the second $Si_3N_4$ film 31 is formed in the first region 7, and a dummy 33 comprised of the second $Si_3N_4$ film 31 is formed in the carrier path region.

Then, a second silicon dioxide film 34 is formed entirely over a resultant by the thickness of 500 nm.

Figure 27H:
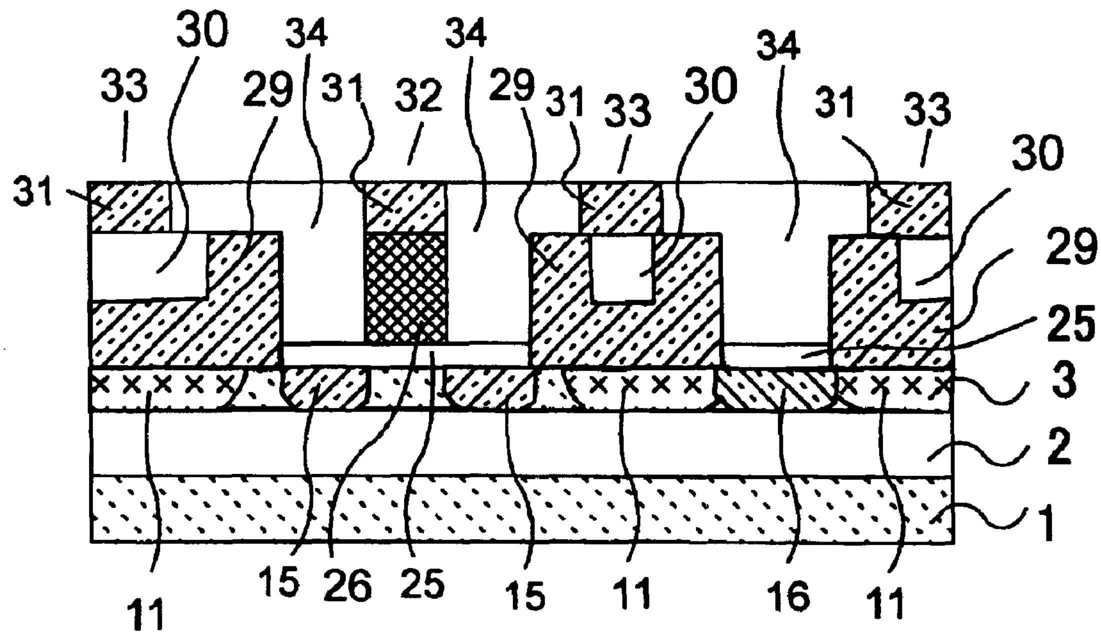
Figure 27I:
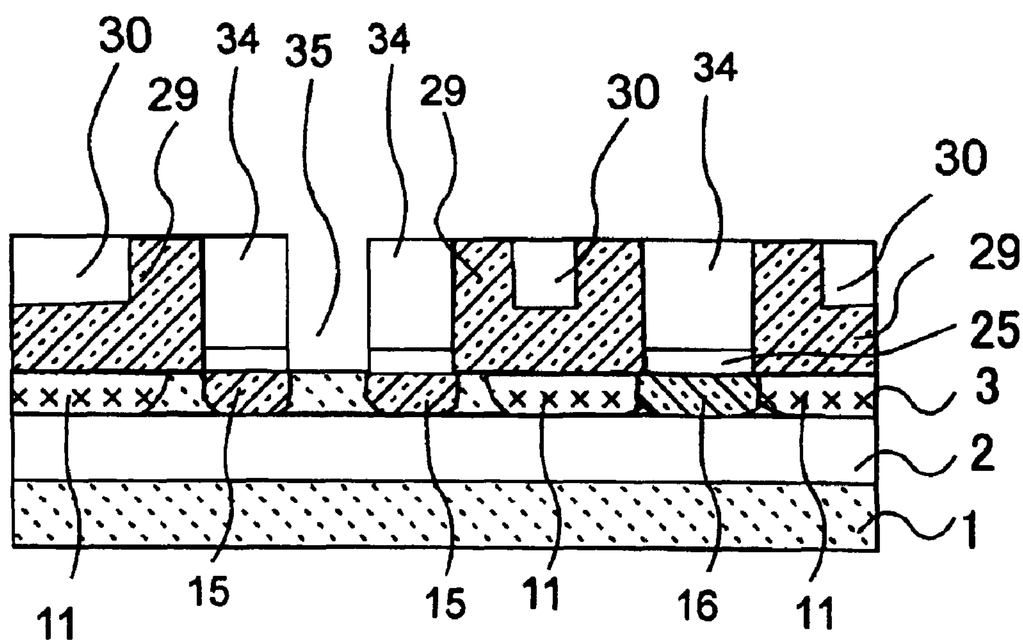

Then, as illustrated in FIG. 27H, the second silicon dioxide film 34 is planarized by chemical mechanical polishing with the second $Si_3N_4$ film 31 being used as a stopper.

Then, an upper portion of the second silicon dioxide film 34 and the second $Si_3N_4$ film 31 are removed by reactive ion etching.

Then, as illustrated in FIG. 27I, the dummy gate electrode 26 is removed by reactive ion etching or through the use of a mixture solution of hydrofluoric acid and nitric acid for forming a slit 35.

Then, the silicon layer 3 is thermally oxidized within the slit 35 to thereby form a sacrifice oxide film. The sacrifice oxide film is removed by wet etching.

Then, the silicon layer 3 is thermally oxidized to thereby form an insulating film 36. Then, tungsten is deposited by the thickness of 300 nm such that the slit 35 is filled wit the tungsten. Then, the tungsten is patterned into a gate electrode 37. An extension of the gate electrode 37 is formed by patterning tungsten having been deposited on the silicon dioxide film 34.

Then, a third silicon dioxide film 39 is formed entirely over a resultant by chemical vapor deposition by the thickness of 500 nm. Then, the third silicon dioxide film 39 is planarized by chemical mechanical polishing to thereby form an interlayer insulating film.

Figure 27J:
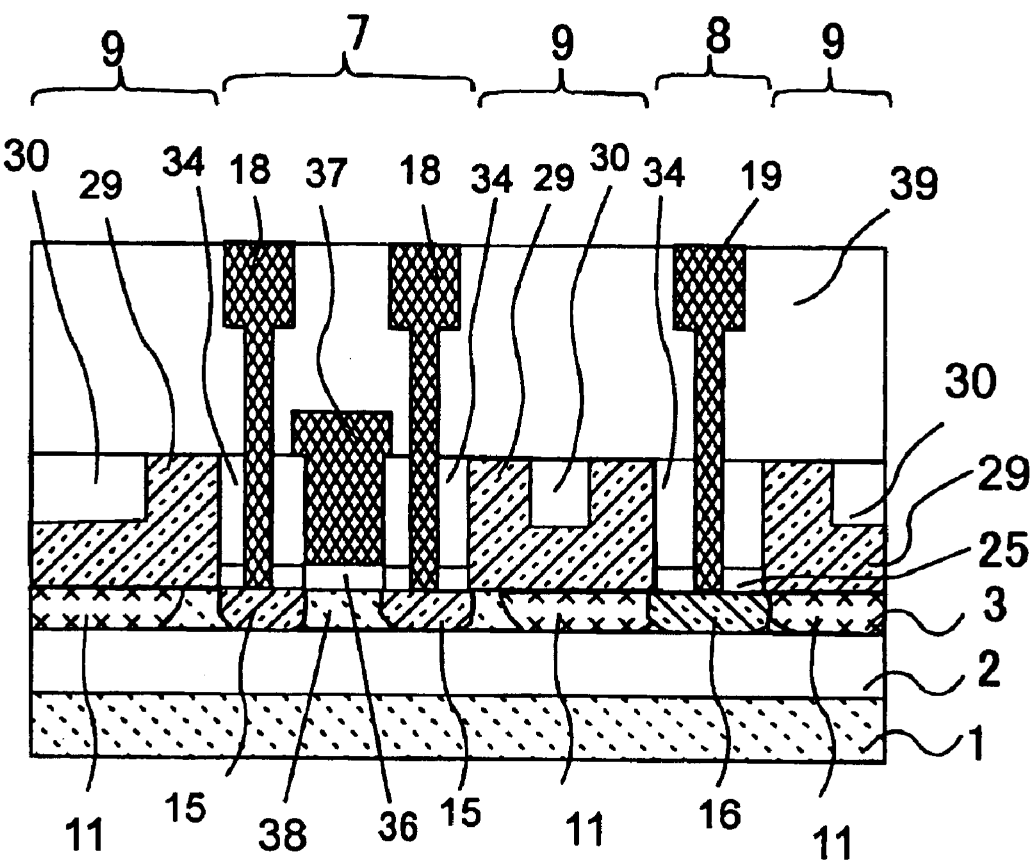

Then, as illustrated in FIG. 27J, there are formed wirings 18 making electrical contact with the source and drain regions 15, and a body contact wiring 19 making electrical contact with the high-concentration body contact region 16.

Figure 28:
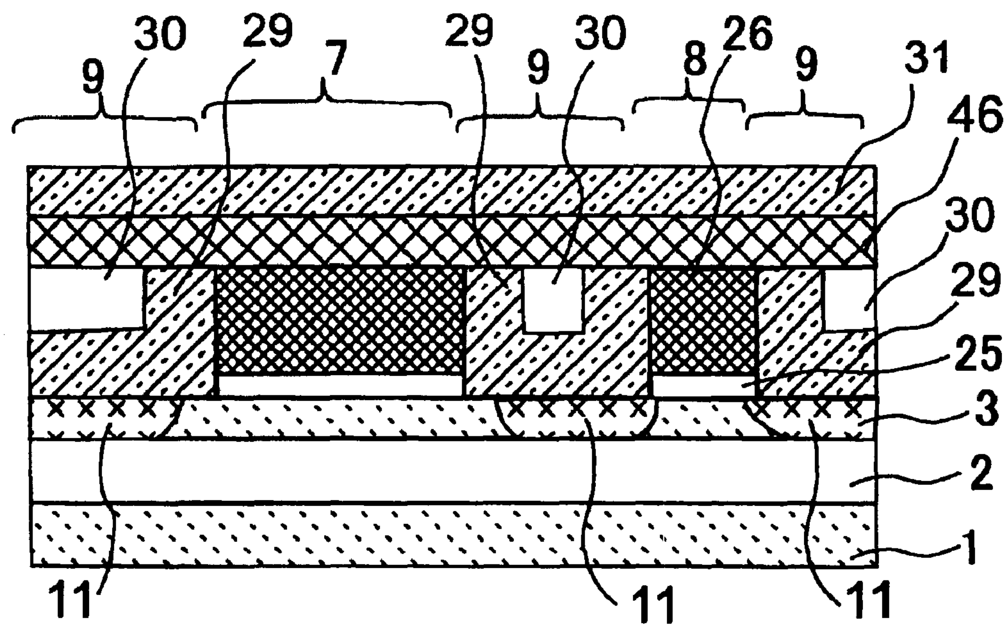
FIG. 28 is a cross-sectional view of a semiconductor device in accordance with the third embodiment.

In the step having been explained with reference to FIG. 27F, as illustrated in FIG. 28, after forming a second dummy gate layer 46 below the second $Si_3N_4$ film 31, the second dummy gate layer 46 and the second $Si_3N_4$ film 31 may be concurrently patterned through the use of a resist mask having a pattern for forming an extension of the dummy gate electrode. Herein, the second dummy gate layer 46 may be composed of polysilicon. By removing the dummy gate electrode 26 and the second dummy gate layer 46, a slit is formed on the silicon dioxide film 30 at a location where an extension of a gate electrode is to be formed. By filling the slit with electrically conductive material, a gate electrode in the first region and an extension of a gate electrode in the device isolating legion are concurrently formed. This step makes it unnecessary to pattern a gate electrode after filling a slit with electrically conductive material.

A sidewall 45 comprised of a $Si_3N_4$ film may be formed around the dummy gate electrode 26, for instance, by depositing $Si_3N_4$, and etching back $Si_3N_4$ by reactive ion etching. Since the $Si_3N_4$ sidewall 45 protects the slit 35 at opposite edges thereof, it would be possible to prevent an oxide film formed around the slit 35 from being etched, when wet etching is carried out in the slit 35 in order to remove a sacrifice oxide film, for instance.

In the second and third embodiments, a difference between a height of a gate electrode in the first region and a height of a gate electrode above the carrier path is preferably small, and more preferably, almost equal to each other, in order to stably carry out a lithography step and a gate etching step. It is preferable that the difference is equal to or smaller than 40 nm, because the difference exerts only a small influence on lithography and gate etching steps. It is more preferable that the difference is equal to or smaller than 10 nm, because the difference exerts almost no influence on lithography and gate etching steps. A thickness of gate electrodes and conditions for carrying out chemical mechanical polishing are determined so that the difference is preferably equal to or smaller than 40 nm, and more preferably, equal to or smaller than 10 nm.

[Fourth Embodiment]

In the above-mentioned first to third embodiments, the gate electrode is formed by (a) depositing a material of which a gate electrode is composed, after forming a device isolating region, (b) depositing a material of which a gate electrode is composed, before forming a device isolating region, or (c) depositing a material of which a dummy gate is composed, before forming a device isolating region, and then, patterning the dummy gate into a gate electrode.

In the above-mentioned first to third embodiments, the carrier path is offset with the channel region without being offset with the body contact region by (d) removing one of the sidewalls 10*a* and 10*b* before forming a device isolating region, (e) forming sidewalls around both the first region and the body contact region, and removing the sidewall formed around the body contact after the formation of a device isolating region, or (f) covering a region around the first region with a mask before forming sidewalls around both the first region and the body contact region.

In the fourth embodiment, one of the above-mentioned steps (a), (b) and (c) may be carried out in combination with one of the above-mentioned steps (d), (e) and (f).

[Fifth Embodiment]

Figure 29:
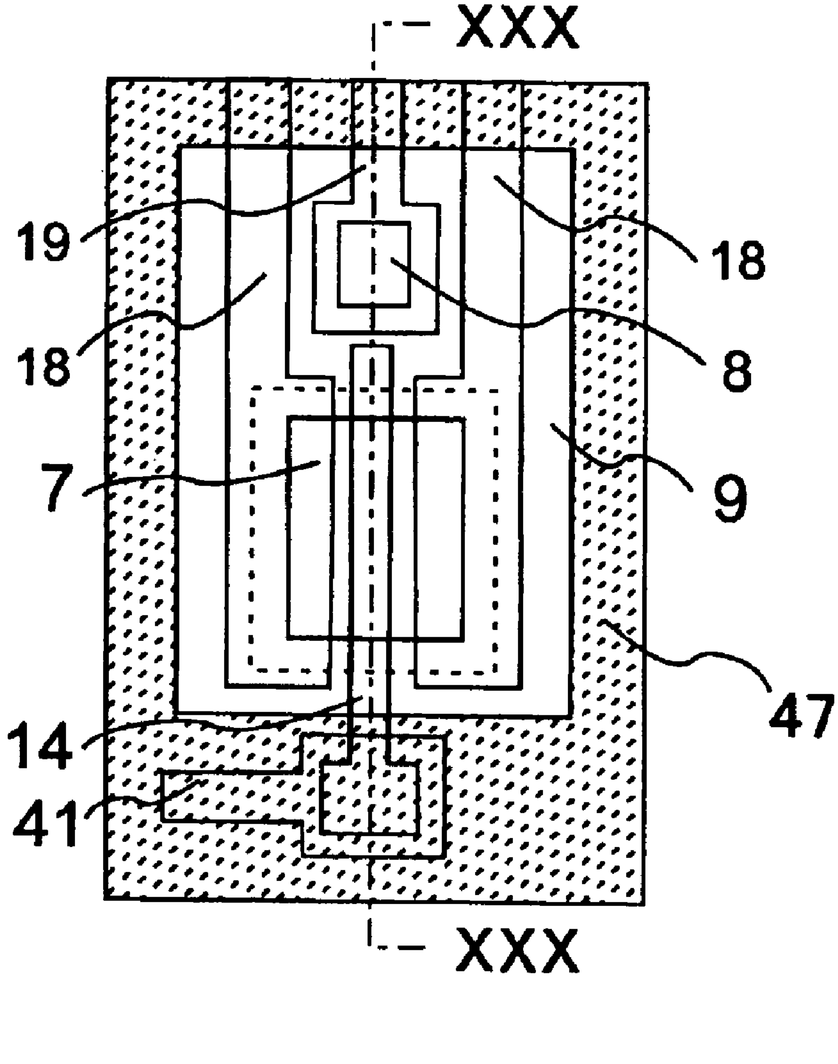
FIG. 29 is a plan view of a semiconductor device in accordance with the fifth embodiment.
Figure 30:
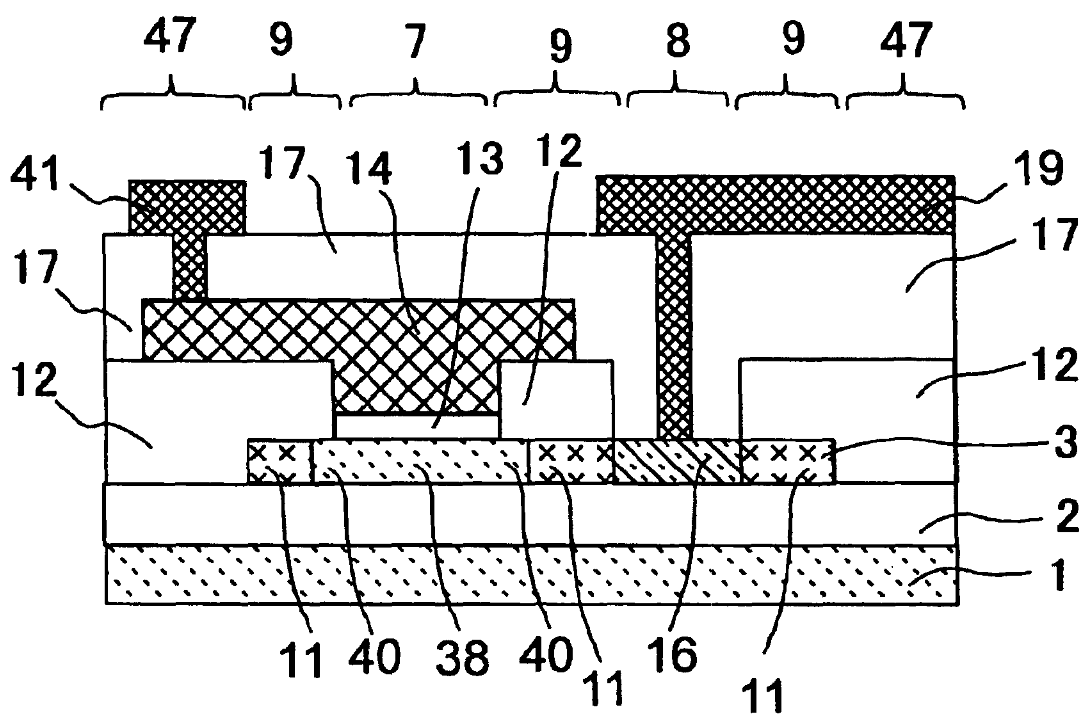
FIG. 30 is a cross-sectional view of a semiconductor device in accordance with the fifth embodiment.

In a semiconductor device in accordance with the fifth embodiment, a channel region is electrically connected to at least one body contact through a carrier path. Unit structures each including a structure where a channel region is electrically connected to at least one body contact through a carrier path may be electrically separated from one another by an electrical insulator by means of trench isolation or LOCOS isolation. In other words, the unit structures may be electrically separated from one another by a region where a semiconductor layer is removed, such as a region 47 in FIG. 29 or 30. FIG. 30 is a cross-sectional view taken along the line XXX—XXX in FIG. 29.

In FIG. 30, a sidewall residual when a wiring is formed, such as the sidewall 10*a* in FIG. 18I, and an oxide film for forming a device isolating region, such as the oxide film 12, are illustrated as a part of the oxide film 12.

Though the gate electrode 14 and the wiring 41 makes contact with each other in the region 47, the gate electrode 14 and the wiring 41 makes contact with each other partially or wholly in the carrier path region 9. It should be noted that it is preferable that the gate electrode 14 and the wiring 41 makes contact with each other in the region 47 in view of a parasitic capacity between the gate electrode 14 and the silicon substrate 1.

Figure 31:
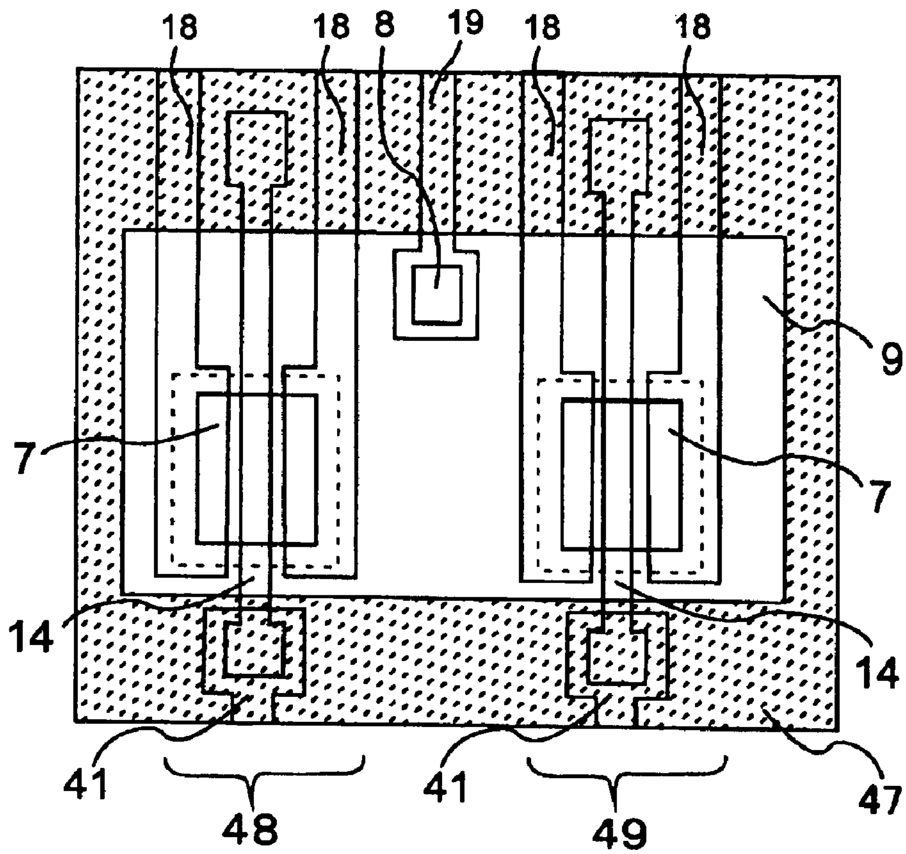
FIG. 31 is a plan view of a semiconductor device in accordance with the fifth embodiment.

Each of the above-mentioned unit structures electrically separated from one another by an electrical insulator may be comprised of a plurality of transistors and a single body contact, as illustrated in FIG. 31.

Figure 32:
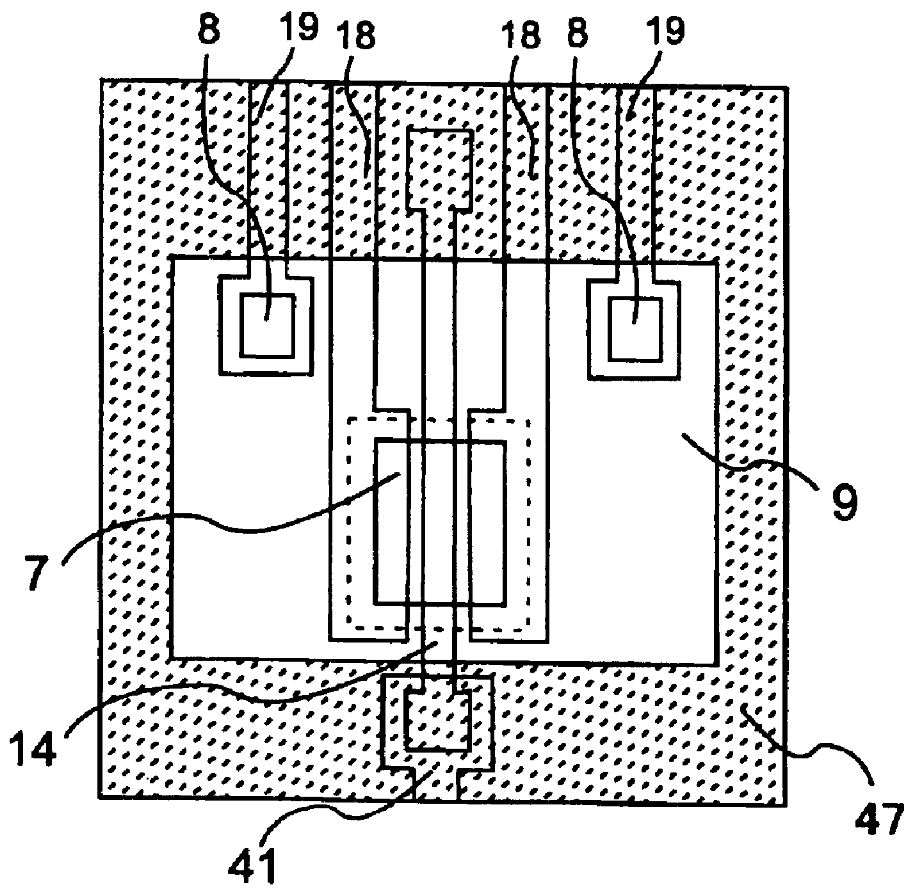
FIG. 32 is a plan view of a semiconductor device in accordance with the fifth embodiment.
Figure 33:
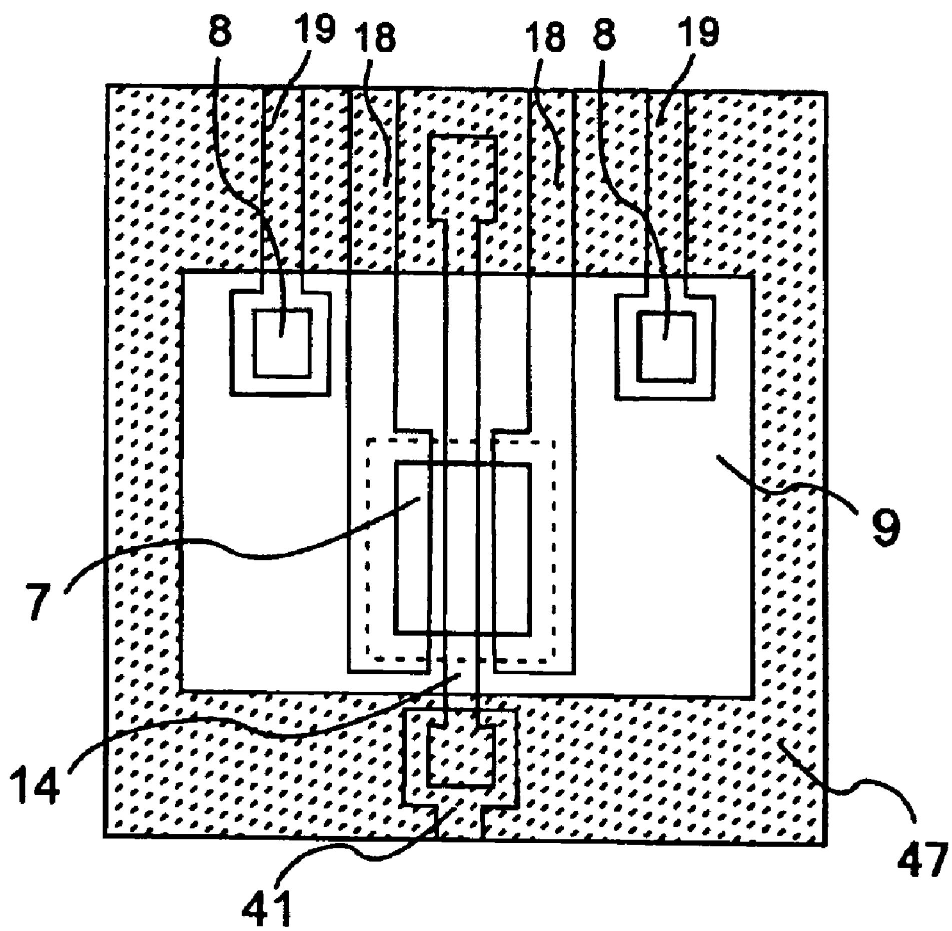
FIG. 33 is a plan view of a semiconductor device in accordance with the fifth embodiment.

As an alternative, each of the above-mentioned unit structures electrically separated from one another by an electrical insulator may be comprised of a single transistor and a plurality of body contacts, as illustrated in FIGS. 32 and 33.

Figure 34:
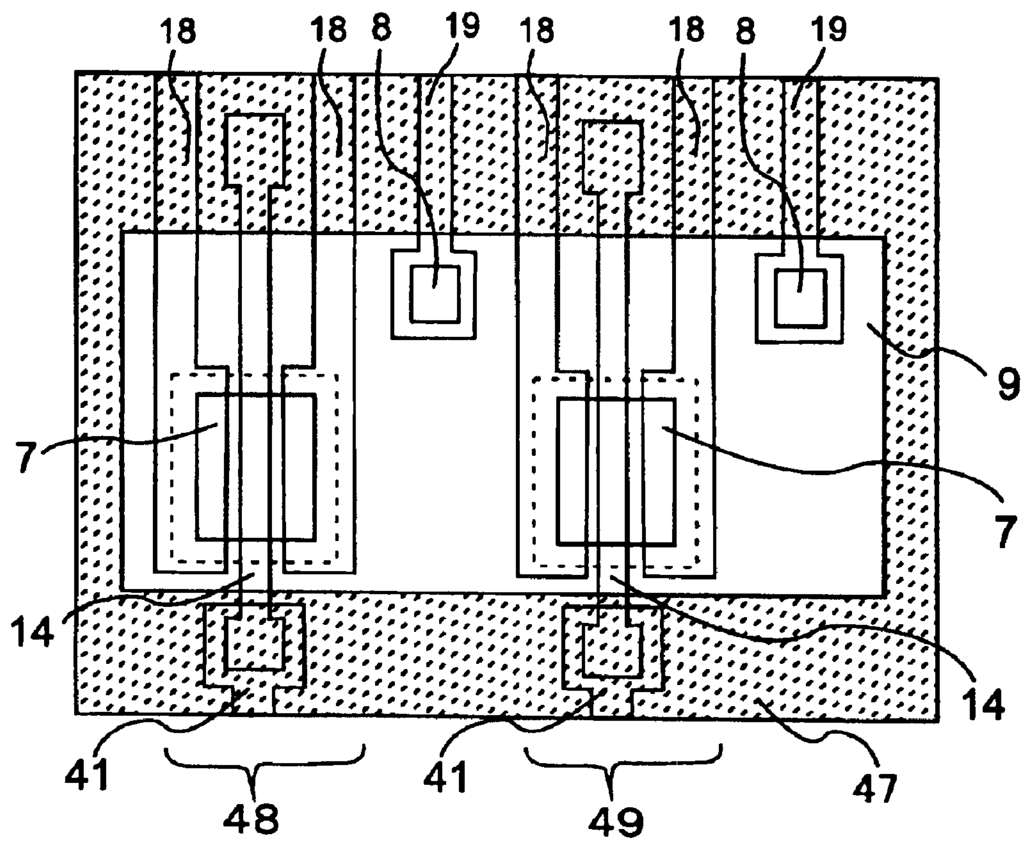
FIG. 34 is a plan view of a semiconductor device in accordance with the fifth embodiment.

As an alternative, each of the above-mentioned unit structures electrically separated from one another by an electrical insulator may be comprised of a plurality of transistors and a plurality of body contacts, as illustrated in FIG. 34.

In the fifth embodiment, a positional relation between the gate electrode and the body contact may be determined in any way. For instance, the body contact may be located on an extension of the gate electrode, or may be located out of an extension of the gate electrode.

[Sixth Embodiment]

In the above-mentioned first to third embodiments, the electrically insulating layer is composed of silicon dioxide in the steps have been explained with reference to FIGS. 6A, 18A and 27A. However, the electrically insulating layer may be composed of other electrical insulating materials. For instance, the electrically insulating layer may be composed of $Si_3N_4$ or porous silicon dioxide.

The electrically insulating layer may be formed therein with a cavity.

The electrically insulating layer may be designed to have a multi-layered structure including layers composed of a plurality of electrically insulating materials. For instance, the electrically insulating layer may have a two-layered structure including an upper layer composed of $Si_3N_4$, and a lower layer composed of silicon dioxide. As an alternative, the electrically insulating layer may have a three-layered structure including a top layer composed of silicon dioxide, an intermediate layer composed of $Si_3N_4$, and a bottom layer composed of silicon dioxide.

The electrically insulating layer is usually designed to have a thickness in the range of 80 nm to 1 μm. However, the electrically insulating layer may have a thickness out of the above-mentioned range.

The semiconductor device may be designed not to have a base substrate. A semiconductor layer may be formed on an electrical insulator. For instance, a silicon-on-sapphire (SOS) substrate may be used. As an alternative, a semiconductor layer may be formed on a glass substrate.

A layer composed of semiconductor other than silicon may be used as a semiconductor layer in place of a silicon layer. A layer composed of two or more semiconductors may be used as a semiconductor layer.

The silicon layer in a complete depletion type SOI-MOSFET has a thickness usually in the range of 10 nm to 50 nm. A transistor having a long gate length, for instance, equal to or greater than 0.35 μm, or a partial depletion type SOI-MOSFET may have a silicon layer thicker than a silicon layer included in a complete depletion type SOI-MOSFET. In contrast, a transistor having a short gate length may have a silicon layer thinner than a silicon layer included in a complete depletion type SOI-MOSFET in order to suppress short-channel effect.

In the step having been explained with reference to FIG. 6B, the pad polysilicon film 5 and the $Si_3N_4$ film 6 may be composed of a material other than polysilicon and $Si_3N_4$, respectively. Assuming that the pad polysilicon film 5 and the $Si_3N_4$ film 6 composed of another material are called a second pad film and a second mask film, respectively, materials of which the second pad film and the second mask film are composed are selected such that an etching rate of the second mask film to the second pad film is low, that is, the second pad film acts as an etching stopper. If the second mask film is composed of $Si_3N_4$, the second pad film may be composed of amorphous silicon, mixed crystal of silicon and germanium, TiN or TaN, for instance. The second pad film may be formed by a process other than chemical vapor deposition, such as sputtering. There is no limitation in a thickness of the second pad film and the second mask film. The second pad film and the second mask film usually have a thickness in the range of 5 nm to 400 nm. The second pad film is necessary to have such a thickness that the second pad film is eliminated while the second mask film is being etched.

In the steps having been explained with reference to FIGS. 6C and 6D, the sidewalls 10*a* and 10*b* may be composed of, in place of silicon dioxide, such a material that the $Si_3N_4$ film 6 (or the second mask film) and the pad oxide film 4 (or the second pad film) are not eliminated when the sidewalls 10*a* and 10*b* are etched back or etched for removal. For instance, the sidewalls 10*a* and 10*b* may be composed of amorphous carbon or amorphous fluorocarbon. As an alternative, the sidewalls 10*a* and 10*b* may be composed of an organic material such as benzo-cyclo butene (BCB).

When the sidewalls 10*a* and 10*b* are composed of a material other than silicon dioxide, such as amorphous carbon, amorphous fluorocarbon or BCB, the step having been explained with reference to FIG. 6E may be omitted.

When the step having been explained with reference to FIG. 6E is omitted, the carrier path 11 is formed so as to make electrical contact with the first region 7. When the carrier path 11 is formed so as to make electrical contact with the first region 7, it is preferable that the carrier path 11 contains impurity at a relatively low concentration, specifically, a concentration in the range of $5\times10^{17}$ $cm^{-3}$ to $3\times10^{18}$ $cm^{-3}$ in view of relaxation of an electric field generated between the carrier path 11 and the first region 7.

Both of the source and drain regions and the body contact region contain impurity at a surface of the silicon layer 3 at a concentration preferably in the range of $5\times10^{18}$ $cm^{-3}$ to $1\times10^{21}$ $cm^{-3}$, and more preferably, in the range of $3\times10^{19}$ $cm^{-3}$ to $1\times10^{20}$ $cm^{-3}$. Impurity is introduced into the source and drain regions and the body contact region by ion implantation or gas-phase diffusion at a dose preferably in the range of $1\times10^{14}$ $cm^{-2}$ to $3\times10^{15}$ $cm^{-2}$, and more preferably, in the range of $3\times10^{14}$ $cm^{-12}$ to $1\times10^{15}$ $cm^{-2}$.

In the step having been explained with reference to FIG. 18B, it is not always necessary to etch back the silicon dioxide film, deposited by chemical vapor deposition by the thickness of 150 nm, by reactive ion etching. As an alternative, the silicon dioxide film may not be completely etched back. That is, the silicon dioxide film may be etched such that the silicon dioxide film remains thinner than the deposition thickness on a planarized area, that is, on the $Si_3N_4$ film 22 or on the carrier path region 9. In either case, conditions for introducing impurity into the carrier path 11, such as energy for ion implantation, are varied only. This exerts no influence on the semiconductor device in accordance with the embodiments.

The gate insulating film formed by thermal oxidation of silicon may be replaced with a silicon dioxide film formed by other processes. For instance, a silicon dioxide film formed by radical oxidation may be used. As an alternative, a gate insulating film may be composed of electrically insulating material other than silicon dioxide. A gate insulating film may be designed to have a multi-layered structure including a silicon dioxide film and films composed of electrically insulating material other than silicon dioxide, or a multi-layered structure including films composed of electrically insulating material other than silicon dioxide.

As an alternative, a gate insulating film may be composed of a material having a high dielectric constant, such as $Ta_2O_5$. It is preferable that a gate insulating film has a dielectric constant higher than a dielectric constant of a field insulating film, because a parasitic capacitance between a gate and a semiconductor layer in the device isolating region is reduced relative to a gate capacitance.

When a gate insulating film has a multi-layered structure or has a vertically varying composition, it is preferable that a gate insulating film has a dielectric constant higher than a dielectric constant of a field insulating film, because a parasitic capacitance between a gate and a semiconductor layer in the device isolating region is reduced relative to a gate capacitance.

In the ion implantation for forming a p-type (including $p^+$-type and $p^-$-type) region, there are used $B^+$, $BF_2^+$ or $In^+$, for instance, as ion species. In the ion implantation for forming an n-type (including $n^+$-type and $n^-$-type) region, there are used $As^+$, $P^+$ or $Sb^+$, for instance, as ion species. As an alternative, ion species other than the above-mentioned ones may be used for forming p-type or n-type region. In addition, bivalent ion species may be used as well as univalent ion species such as $As^+$. Cluster composed of p- or n-type impurity may be used for carrying out ion implantation. As an alternative, ion implantation may be replaced with plasma doping, gas-phase diffusion, or solid-phase diffusion, for instance.

Energy for carrying out ion implantation is preferably in the range of 0.5 keV to 20 keV. If shallow impurity profile is desired, the energy is set lower, and if deep impurity profile is desired, the energy may be set higher. Impurity having been implanted into a semiconductor layer in the form of ions is heated to be activated, for instance, by annealing by means of an electric furnace or by lamp annealing.

In the above-mentioned first to third embodiments, the sidewalls 10*a*, 10*b* and 27 are composed of different materials from one another, and formed and removed in different ways from one another and in the presence or absence of a resist pattern. It should be noted that the sidewalls 10*a*, 10*b* and 27 may be composed, formed or removed in accordance with the other embodiments.

In the above-mentioned embodiments, impurity is introduced into a channel region by ion implantation, for instance, after the formation of a sacrifice oxide film. The thus implanted ion may be heated for activation immediately after ion implantation, or the implanted ion together with impurity having been introduced into source and drain regions may be heated together for activation.

When a thickness of SOI is equal to 50 nm, an impurity concentration is preferably in the range of 0 to $2\times10^{18}$ $cm^{-3}$. If a thickness of SOI is greater than 50 nm, an impurity concentration may be set lower than the above-mentioned range, and whereas if a thickness of SOI is smaller than 50 nm, an impurity concentration may be set higher than the above-mentioned range. For instance, if a thickness of SOI is smaller than 10 nm, an impurity concentration is preferably in the range of 0 to $5\times10^{18}$ $cm^{-3}$. An impurity concentration may be set in the other range in view of requirement of a threshold voltage.

When a gate electrode is composed of a material other than polysilicon, it would be possible to determine a threshold voltage regardless of introduction of impurity, and hence, it may be omitted to introduce impurity into a semiconductor layer.

When a gate electrode is composed of a semiconductor such as polysilicon or mixed crystal of polysilicon and germanium, impurity may be introduced into a gate concurrently into source and drain regions. As an alternative, impurity may be introduced into a gate concurrently with deposition of a material of which a gate electrode is composed. As an alternative, impurity may be introduced into a gate after deposition of a material of which a gate electrode is composed, but before patterning the material into a gate electrode.

When impurity is introduced into a material of which a gate electrode is composed, before patterning the material into a gate electrode, in the fabrication of CMOS, if gate electrodes of n- and p-type channel transistors have different electrical conductivities from each other, impurities necessary for realizing n- or p-type electrical conductivities may be introduced into regions where n- and p-type transistors are to be fabricated, through the use of a resist mask.

A material of which a gate electrode is composed and into which n-type impurity is introduced and a material of which a gate electrode is composed and into which p-type impurity is introduced may be different from each other with respect to optimal etching conditions in patterning a material into a gate electrode, in which case, a gate electrode in an n-type channel transistor and a gate electrode in a p-type channel transistor may be formed in separate steps through the use of an appropriate resist mask.

Impurity may be introduced into a gate electrode before etching a material of which a gate electrode is composed, into a gate electrode by reactive ion etching, or after etching the material into a gate electrode. A gate electrode may be composed of any material, if it has a required electrical conductivity and a work function necessary for determining a threshold voltage of a transistor.

The above-mentioned electrical conductor to be formed above a gate electrode may be composed of any material, if it has a required electrical conductivity.

Though the semiconductor layer in the above-mentioned embodiments is composed of silicon, the semiconductor layer may be composed of a semiconductor material other than silicon, or of a mixture of silicon and a semiconductor material other than silicon.

The above-mentioned embodiments may be applied to a three-dimensional LSI in which a multi-layered transistor is formed on a multi-layered SOI.

It is preferable that the semiconductor layer in the first region, the carrier path region and the body contact region has almost common thickness. It is preferable that a difference in a thicknesses in those three regions is caused only in the steps of oxidizing a gate, pre-oxidizing a gate, and etching silicon dioxide or $Si_3N_4$ formed on a semiconductor layer, which causes a reduction in a thickness of a silicon dioxide film. In order to minimize the difference in a thicknesses in those three regions, it is preferable not to carry out steps which are accompanied with reduction in a thickness of a semiconductor layer in any one of the first region, the carrier path region and the body contact region.

Since deterioration in characteristics, caused by the short-channel effect, can be suppressed more effectively in a thinner SOI layer, an SOI layer such as the SOI layer 3 illustrated in FIG. 6A has a thickness preferably equal to or smaller than 15 nm, and more preferably equal to or smaller than 10 nm.

If an SOI layer is too thin, sub-band is harmfully influenced by quantum-mechanical size effect, resulting in that a threshold voltage is varied, and/or a carrier concentration is varied. It is preferable that an SOI layer in each of the above-mentioned regions has a thickness equal to or greater than 5 nm in order to suppress fluctuation in a threshold voltage below tens of mV, and it is more preferable that an SO layer in each of the above-mentioned regions has a thickness equal to or greater than 7 nm in order to substantially eliminate fluctuation in a threshold voltage, caused by quantum-mechanical size effect.

It is preferable that an SO layer in both of the carrier path region and the body contact region is thinner than an SO layer in the first region by 10 nm or smaller, and it is more preferable that an SOI layer in both of the carrier path region and the body contact region is thinner than an SO layer in the first region by 3 nm or smaller. When an SOI layer in those regions is designed to have such a thickness as above-mentioned, it is preferable that a semiconductor layer in the first region, the carrier path region and the body contact region has a thickness in the range of 5 nm to 15 nm, and it is more preferable that a semiconductor layer in the first region, the carrier path region and the body contact region has a thickness in the range of 7 nm to 10 nm.

In view of ion implantation, it is preferable that implanted ions do not reach an entire thickness of an SOI layer in order to prevent the SOI layer from turning into an amorphous layer in its entirety. Hence, energy for carrying out ion implantation is determined so that implanted ions reach about 70 to 80% of a thickness of an SOI layer.

When an SOI layer in one of the first region, the carrier path region and the body contact region is thinner than an SOI layer in the other regions, in order to prevent implanted ions from reaching an entire thickness of an SOI layer in the one of the regions, it is preferable that an SOI layer in the one of the regions is thinner than the most thick SOI layer by 30% or smaller, and it is more preferable that an SOI layer in the one of the regions is thinner than the most thick SOI layer by 20% or smaller. In other words, it is preferable that a semiconductor layer in the first region, the carrier path region and the body contact region has a thickness equal to or greater than 70% of the greatest thickness among thicknesses of semiconductor layers in the first region, the carrier path region and the body contact region, and it is more preferable that a semiconductor layer in the first region, the carrier path region and the body contact region has a thickness equal to or greater than 80% of the greatest thickness among thicknesses of semiconductor layers in the first region. The above-mentioned thickness of a semiconductor layer is applied to a semiconductor device regardless of whether an SOI layer has a thickness equal to or smaller than 15 nm for suppressing short-channel effect or an SOI layer has a thickness equal to or greater than 15 nm because it is not always necessary to suppress short-channel effect.

In the above-mentioned second and third embodiments, it is preferable that a height of a gate electrode in the first region is almost equal to a height of a gate electrode on the carrier path. A difference between those heights is preferably equal to or smaller than 40 nm, and more preferably equal to or smaller than 20 nm, in order to stably carry out lithography and gate etching.

The advantages obtained by the aforementioned present invention will be described hereinbelow.

In accordance with the invention, a mask such as the mask 7 illustrated in FIG. 6C, FIG. 18A or FIG. 27, the mask 10 illustrated in FIG. 6A or FIG. 18A, or the sidewall 27 illustrated in FIG. 27C is formed for covering the first region therewith, and then, impurity is implanted into a semiconductor layer through the use of the mask to thereby form the carrier path 11. Since the first region in which a channel region and source/drain regions are formed is formed in a region covered with the mask, the first region and the carrier path can be formed in a self-aligning manner without interferencing with each other.

Accordingly, introduction of impurity into the carrier path and introduction of impurity into the channel region are carried out in separate steps, and hence, it would be possible to control each of the impurities independently of each other.

In addition, since the carrier path and the channel region do not interfere with each other, it would be possible to prevent impurity to be introduced into one of the regions from being introduced into the other. Hence, it would be possible to introduce impurity having a higher concentration than that in the channel region, into the carrier path in order to reduce a resistance in the carrier path, and it would be also possible to form the carrier path and the first region in a self-aligning manner without interference of the carrier path and the first region with each other.

Since the electrically insulating film 12, 29, 30 or 10 formed in the device isolating region projects beyond over the silicon layer, the silicon layer 3 has an almost common thickness in both of the first region and the device isolating region, and since the silicon layer in the device isolating region is not thinner than the silicon layer in the first region, the present invention can be applied to a thin SOI layer.

Thus, the present invention satisfies the above-mentioned first need.

Figure 1:
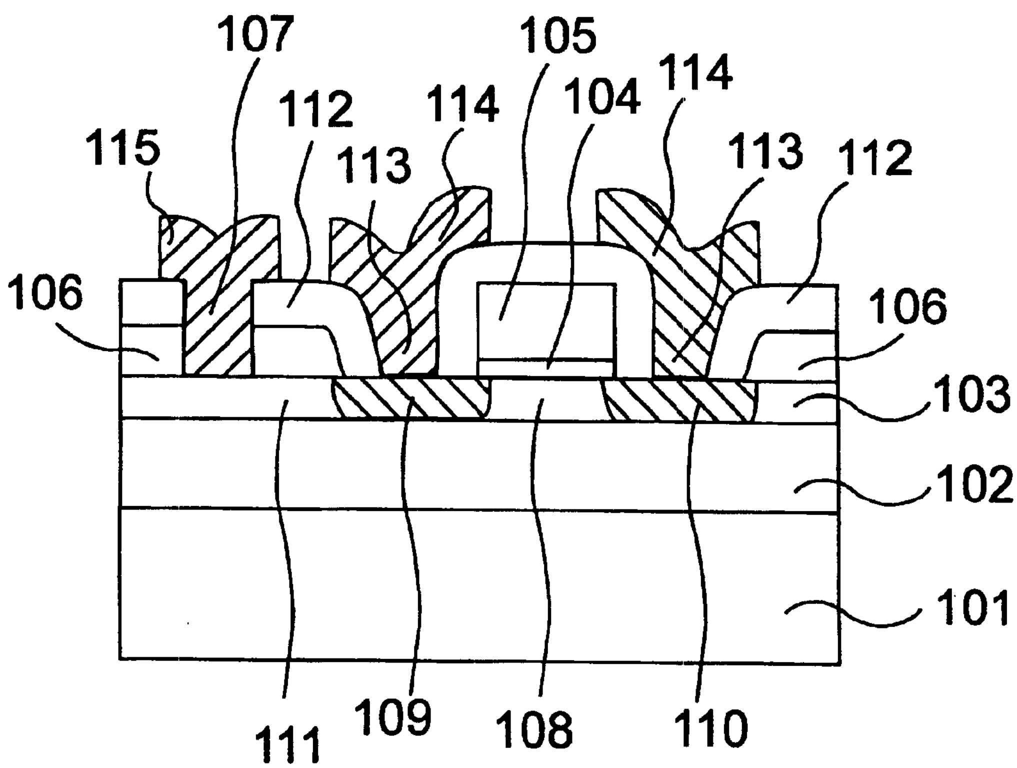
FIG. 1 is a cross-sectional view of a conventional semiconductor device.
Figure 2:
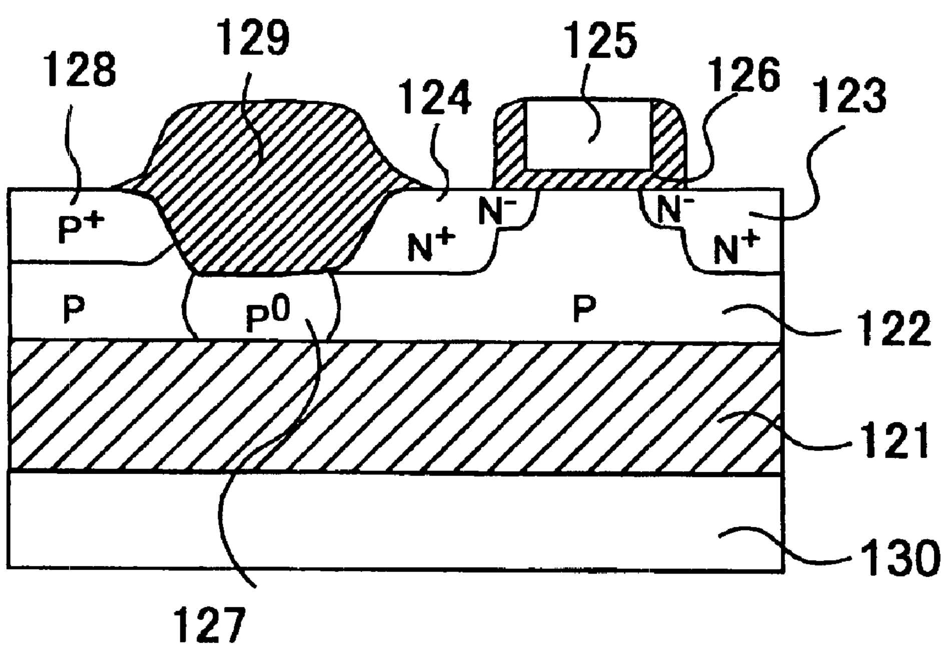
FIG. 2 is a cross-sectional view of another conventional semiconductor device.
Figure 3:
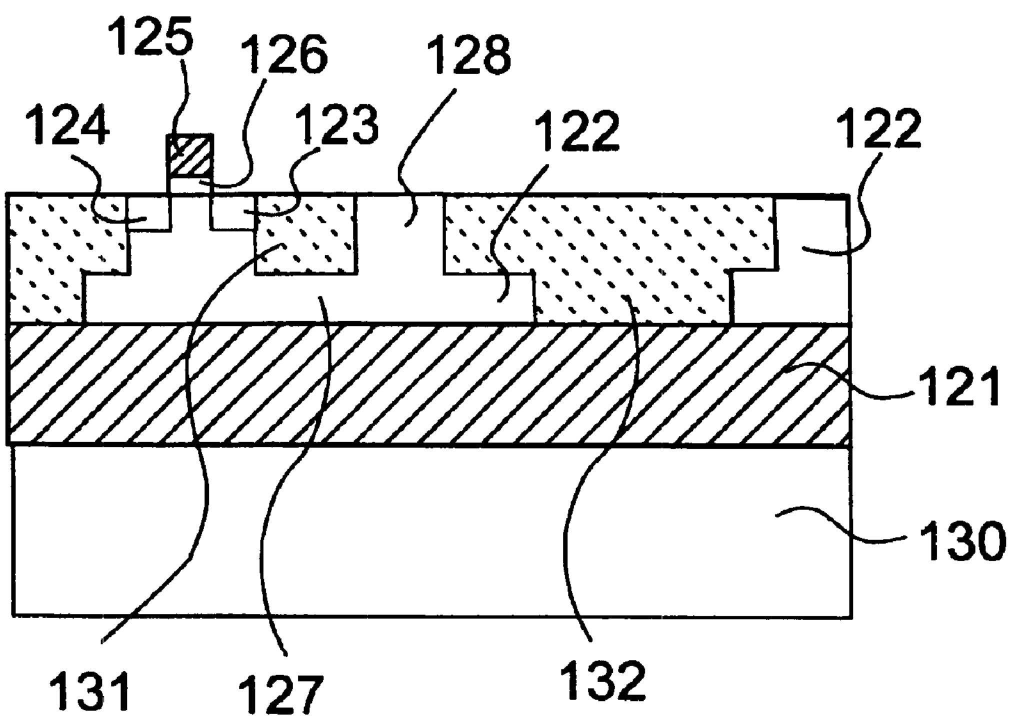
FIG. 3 is a cross-sectional view of still another conventional semiconductor device.
Figure 4A:
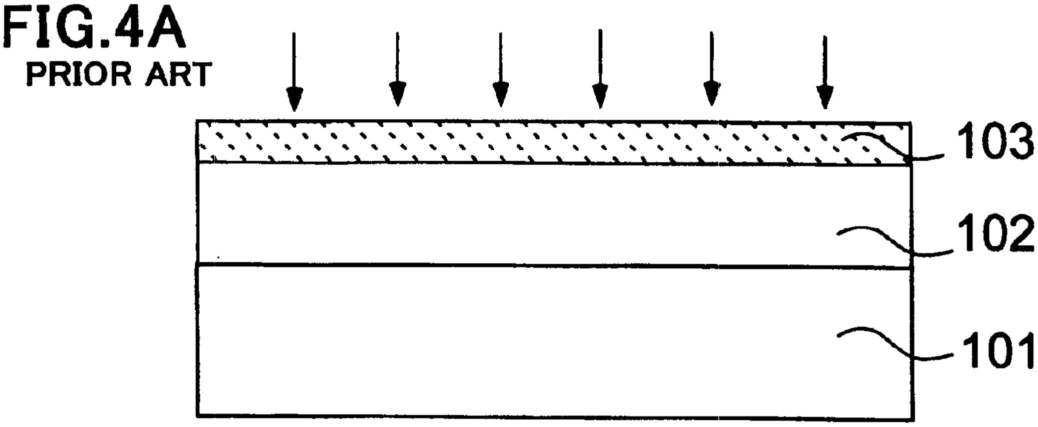
FIGS. 4A to 4C are cross-sectional views of a conventional semiconductor device, illustrating respective steps of a method of fabricating the same.
Figure 4B:
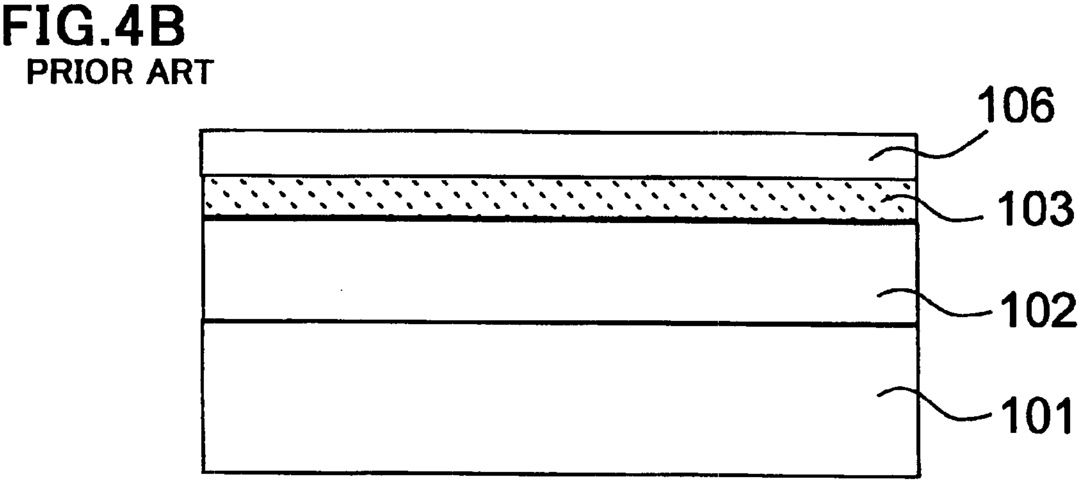
Figure 4C:
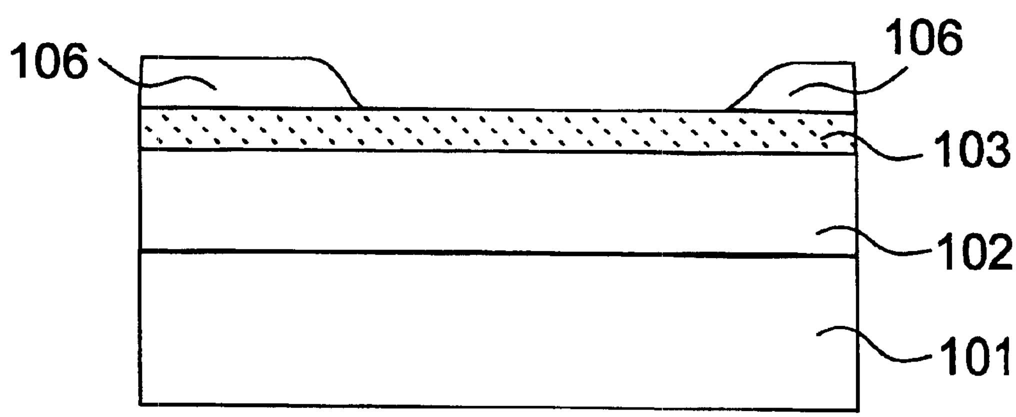
Figure 5A:
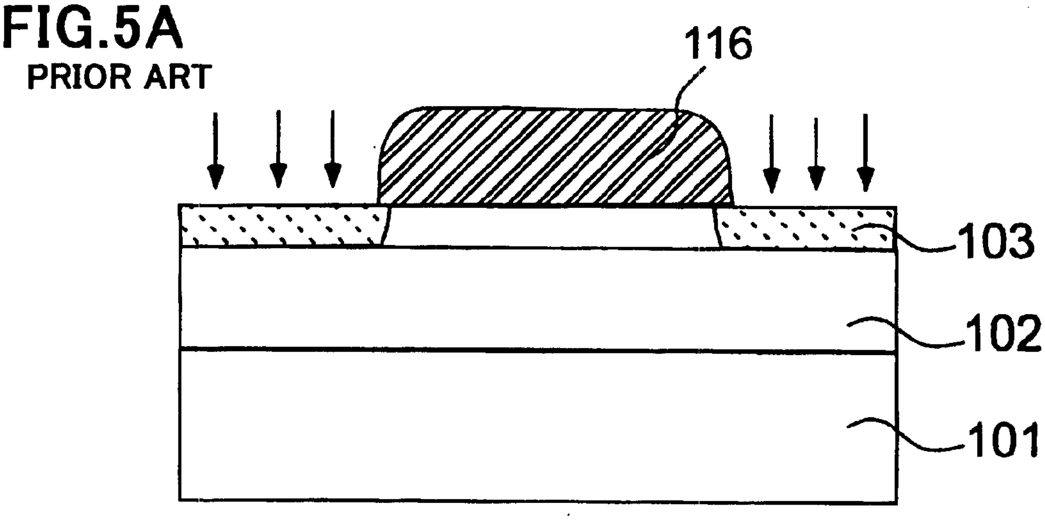
FIGS. 5A to 5C are cross-sectional views of a conventional semiconductor device, illustrating respective steps of a method of fabricating the same.
Figure 5B:
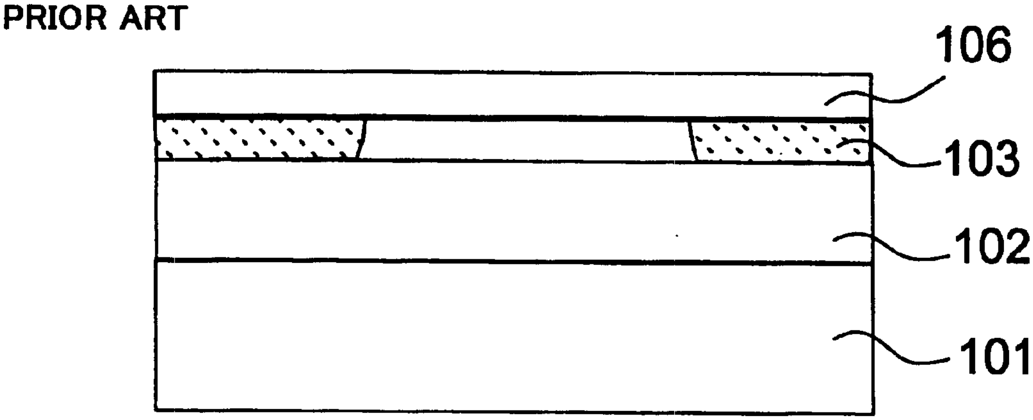
Figure 5C:
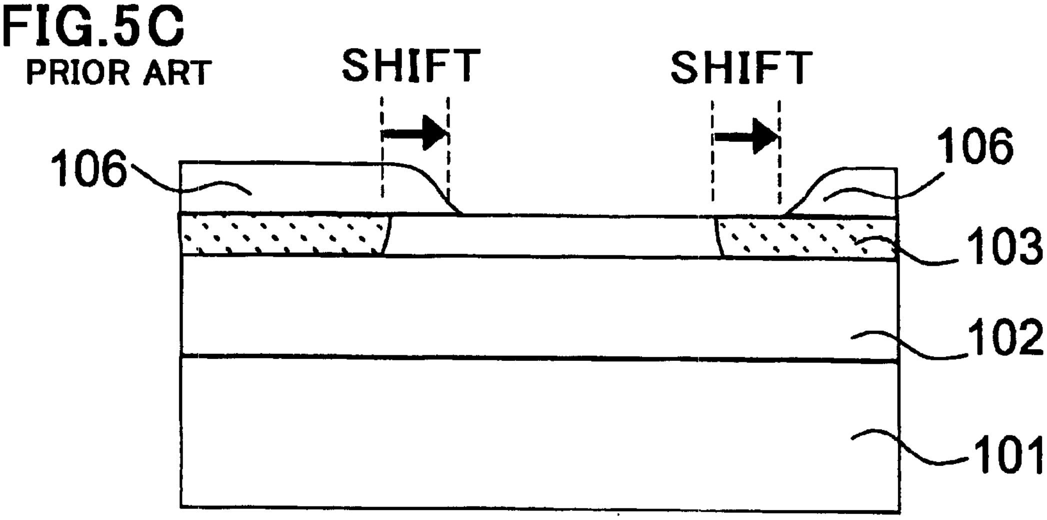

The electrically insulating film 12, 29, 30 or 10 formed in the device isolating region has functions of reducing a parasitic capacitance between a gate electrode and a silicon layer, and preventing impurity from entering the device isolating region when impurity is introduced into a silicon layer for forming the source and drain regions, impurity is introduced into a silicon layer for forming the channel region, and impurity is introduced into a silicon layer for forming the body contact region, similarly to the conventional electrically insulating films 106 (FIG. 1), 129 (FIG. 2) and 131, 132 (FIG. 3).

The electrically insulating film formed in the device isolating region has an end reflecting an end of a mask which has been shaped by reactive ion etching so as to have an almost vertical end, and hence, the end of the electrically insulating film is steep.

In the present invention, the electrically insulating film is formed and etched in the device isolating region with the first region being covered with a mask. Accordingly, the first region would be never damaged by etching when the electrically insulating film is formed in the device isolating region, unlike the conventional art.

In addition, the electrically insulating film in the device isolating region is formed in a self-aligning manner to the first region. Thus, the present invention satisfies the above-mentioned second need.

In the above-mentioned first to third embodiments, a material of which the gate electrode 14 or the dummy gate electrode 26 is composed is planarized subsequently to the deposition thereof, and then, the electrical conductor 23 is formed thereover. Hence, the gate electrode 14 has a planarized surface. In addition, since the electrically insulating film in the device isolating region does not have an oblique end, but has an almost vertical end, the gate electrode 14 has a horizontal lower surface. Hence, when the gate electrode 14 is formed by photolithography and reactive ion etching, the surfaces to be etched are all flat, ensuring no necessity of carrying out over-etching and readiness in patterning a material into the gate electrode.

Thus, the present invention satisfies the above-mentioned third need.

In the present invention, the carrier path region makes electrical contact with the body contact region. However, since the carrier path region is spaced away from the source and drain regions, even if the carrier path is designed to contain impurity at a high concentration for the purpose of reducing a resistance in the carrier path, it would be possible to suppress an electric field generated between the carrier path and the source/drain regions, ensuring small leakage current.

The step having been explained with reference to FIG. 6E, in which the sidewall 10*b* is etched for removal and the sidewall 10*a* remains unetched, ensures a certain space between the carrier path region and the source/drain regions, and makes it possible for the carrier path to make electrical contact with the body contact region.

In the second embodiment, the step having been explained with reference to FIG. 18B, in which the carrier path is formed through the use of the sidewall 10 as a mask, and the step having been explained with reference to FIG. 18I, in which the body contact region is enlarged, ensure a certain space between the carrier path region and the source/drain regions, and make it possible for the carrier path to make electrical contact with the body contact region.

In the third embodiment, the step having been explained with reference to FIG. 27C, in which impurity is introduced again into the semiconductor layer through the use of the sidewall as a mask for the purpose of forming the carrier path, ensures a certain space between the carrier path region and the source/drain regions, and makes it possible for the carrier path to make electrical contact with the body contact region.

Thus, the present invention satisfies the above-mentioned fourth need.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2001-170961 filed on Jun. 6, 2001 including specification, claims, drawings and summary is incorporated herein by reference in its entirety.

What is claimed is:

1. A semiconductor device, comprising:

(a) a semiconductor layer formed on an electrically insulating layer;

(b) a gate insulating film formed on said semiconductor layer;

(c) a gate electrode formed on said gate insulating film; and (d) a field insulating film formed on said semiconductor layer for defining a region in which a semiconductor device is to be fabricated, said semiconductor layer including:

(a1) source and drain regions formed in said semiconductor layer around said gate electrode, said source and drain regions containing first electrically conductive type impurity;

(a2) a body contact region formed in said semiconductor layer, said body contact region containing second electrically conductive type impurity; and (a3) a carrier path region formed in said semiconductor layer and horizontally separated from said source and drain regions by a buffer zone such that said carrier path region does not make contact with said source and drain regions, but makes contact with said body contact region, said carrier path region containing second electrically conductive type impurity, wherein said buffer zone is formed between said source and drain regions and said carrier path region, and wherein said carrier path region, said buffer zone, and said source and drain regions are arranged in the same height.

2. The semiconductor device as set forth in claim 1, further comprising an electrically insulating sidewall facing said field insulating film.

3. The semiconductor device as set forth in claim 2, wherein said semiconductor layer has a region below said sidewall which region is smaller in impurity concentration than the rest.

4. The semiconductor device as set forth in claim 1, further comprising a sidewall formed at a side of said field insulating film, said sidewall being composed of $Si_3N_4$.

5. The semiconductor device as set forth in claim 1, wherein said field insulating film has a lower portion and a side portion both of which are composed of $Si_3N_4$.

6. The semiconductor device as set forth in claim 1, wherein said gate insulating film is composed at least partially of a material having a higher dielectric constant than that of said field insulating film.

7. The semiconductor device as set forth in claim 1, wherein said gate insulating film has a dielectric constant higher than that of said field insulating film.

8. The semiconductor device as set forth in claim 1, wherein a single transistor and a single body contact region are formed in a region including semiconductor layers electrically insulated from one another by an electrical insulator, said transistor being comprised of said semiconductor layer, said gate insulating film, said gate electrode, and said field insulating film.

9. The semiconductor device as set forth in claim 1, wherein a plurality of transistors and a single body contact region are formed in a region including semiconductor layers electrically insulated from one another by an electrical insulator, each of said transistors being comprised of said semiconductor layer, said gate insulating film, said gate electrode, and said field insulating film.

10. The semiconductor device as set forth in claim 1, wherein a single transistor and a plurality of body contact regions are formed in a region including semiconductor layers electrically insulated from one another by an electrical insulator, said transistor being comprised of said semiconductor layer, said gate insulating film, said gate electrode, and said field insulating film.

11. A semiconductor device, comprising:

(a) a semiconductor layer formed on an electrically insulating layer;

(b) a gate insulating film formed on said semiconductor layer;

(c) a gate electrode formed on said gate insulating film; and (d) a field insulating film formed on said semiconductor layer for defining a region in which a semiconductor device is to be fabricated, said semiconductor layer including:

(a1) source and drain regions formed in said semiconductor layer around said gate electrode, said source and drain regions containing first electrically conductive type impurity;

(a2) a body contact region formed in said semiconductor layer, said body contact region containing second electrically conductive type impurity; and (a3) a carrier path region formed in said semiconductor layer such that said carrier path region does not make contact with said source and drain regions, but makes contact with said body contact region, said carrier path region containing second electrically conductive type impurity;

wherein said semiconductor layer has a first region in which said source and drain regions are formed, a second region in which said carrier path region is formed, and a third region in which said body contact region is formed, said semiconductor layer has a thickness in the range of 5 nm to 15 nm both inclusive in said first to third regions, and a difference between a maximum thickness among said first to third regions and a minimum thickness among said first to third regions is equal to or smaller than 10 nm.

12. The semiconductor device as set forth in claim 11, wherein said difference is equal to or smaller than 3 nm.

13. The semiconductor device as set forth in claim 11, further comprising an electrically insulating sidewall facing said field insulating film.

14. The semiconductor device as set forth in claim 13, wherein said semiconductor layer has a region below said sidewall which region is smaller in impurity concentration than the rest.

15. The semiconductor device as set forth in claim 11, further comprising a sidewall formed at a side of said field insulating film, said sidewall being composed of $Si_3N_4$.

16. The semiconductor device as set forth in claim 11, wherein said field insulating film has a lower portion and a side portion both of which are composed of $Si_3N_4$.

17. The semiconductor device as set forth in claim 11, wherein said gate insulating film is composed at least partially of a material having a higher dielectric constant than that of said field insulating film.

18. The semiconductor device as set forth in claim 11, wherein said gate insulating film has a dielectric constant higher than that of said field insulating film.

19. The semiconductor device as set forth in claim 11, wherein a single transistor and a single body contact region are formed in a region including semiconductor layers electrically insulated from one another by an electrical insulator, said transistor being comprised of said semiconductor layer, said gate insulating film, said gate electrode, and said field insulating film.

20. The semiconductor device as set forth in claim 11, wherein a plurality of transistors and a single body contact region are formed in a region including semiconductor layers electrically insulated from one another by an electrical insulator, each of said transistors being comprised of said semiconductor layer, said gate insulating film, said gate electrode, and said field insulating film.

21. The semiconductor device as set forth in claim 11, wherein a single transistor and a plurality of body contact regions are formed in a region including semiconductor layers electrically insulated from one another by an electrical insulator, said transistor being comprised of said semiconductor layer, said gate insulating film, said gate electrode, and said field insulating film.

22. A semiconductor device, comprising:

(a) a semiconductor layer formed on an electrically insulating layer;

(b) a gate insulating film formed on said semiconductor layer;

(c) a gate electrode formed on said gate insulating film; and (d) a field insulating film formed on said semiconductor layer for defining a region in which a semiconductor device is to be fabricated, said semiconductor layer including:

(a1) source and drain regions formed in said semiconductor layer around said gate electrode, said source and drain regions containing first electrically conductive type impurity;

(a2) a body contact region formed in said semiconductor layer, said body contact region containing second electrically conductive type impurity; and (a3) a carrier path region formed in said semiconductor layer such that said carrier path region does not make contact with said source and drain regions, but makes contact with said body contact region, said carrier path region containing second electrically conductive type impurity;

wherein said semiconductor layer has a first region in which said source and drain regions are formed, a second region in which said carrier path region is formed, and a third region in which said body contact region is formed, said semiconductor layer has a thickness equal to or greater than 70% of a maximum thickness of said semiconductor layer in said first to third regions, and a difference between a maximum thickness among said first to third regions and a minimum thickness among said first to third regions is equal to or smaller than 10 nm.

23. The semiconductor device as set forth in claim 22, further comprising an electrically insulating sidewall facing said field insulating film.

24. The semiconductor device as set forth in claim 23, wherein said semiconductor layer has a region below said sidewall which region is smaller in impurity concentration than the rest.

25. The semiconductor device as set forth in claim 22, further comprising a sidewall formed at a side of said field insulating film, said sidewall being composed of $Si_3N_4$.

26. The semiconductor device as set forth in claim 22, wherein said field insulating film has a lower portion and a side portion both of which are composed of $Si_3N_4$.

27. The semiconductor device as set forth in claim 22, wherein said gate insulating film is composed at least partially of a material having a higher dielectric constant than that of said field insulating film.

28. The semiconductor device as set forth in claim 22, wherein said gate insulating film has a dielectric constant higher than that of said field insulating film.

29. The semiconductor device as set forth in claim 22, wherein a single transistor and a single body contact region are formed in a region including semiconductor layers electrically insulated from one another by an electrical insulator, said transistor being comprised of said semiconductor layer, said gate insulating film, said gate electrode, and said field insulating film.

30. The semiconductor device as set forth in claim 22, wherein a plurality of transistors and a single body contact region are formed in a region including semiconductor layers electrically insulated from one another by an electrical insulator, each of said transistors being comprised of said semiconductor layer, said gate insulating film, said gate electrode, and said field insulating film.

31. The semiconductor device as set forth in claim 22, wherein a single transistor and a plurality of body contact regions are formed in a region including semiconductor layers electrically insulated from one another by an electrical insulator, said transistor being comprised of said semiconductor layer, said gate insulating film, said gate electrode, and said field insulating film.

32. A semiconductor device, comprising:

(a) a semiconductor layer formed on an electrically insulating layer;

(b) a gate insulating film formed on said semiconductor layer;

(c) a gate electrode formed on said gate insulating film; and (d) a field insulating film formed on said semiconductor layer for defining a region in which a semiconductor device is to be fabricated, said semiconductor layer including:

(a1) source and drain regions formed in said semiconductor layer around said gate electrode, said source and drain regions containing first electrically conductive type impurity;

(a2) a body contact region formed in said semiconductor layer, said body contact region containing second electrically conductive type impurity; and (a3) a carrier path region formed in said semiconductor layer such that said carrier path region does not make contact with said source and drain regions, but makes contact with said body contact region, said carrier path region containing second electrically conductive type impurity;

wherein said semiconductor layer has a first region in which said source and drain regions are formed, a second region in which said carrier path region is formed, and a third region in which said body contact region is formed, and a difference in height between a gate electrode to be formed in said first region and a gate electrode to be formed in said second region is equal to or smaller than 40 nm.

33. The semiconductor device as set forth in claim 32, wherein said difference is equal to or smaller than 10 nm.

* * * * *